(12) United States Patent
Maekawa et al.

(10) Patent No.: US 12,495,592 B2
(45) Date of Patent: *Dec. 9, 2025

(54) SEMICONDUCTOR SUBSTRATE, SEMICONDUCTOR DEVICE, AND MANUFACTURING METHODS OF THE SAME

(71) Applicant: ROHM CO., LTD., Kyoto (JP)

(72) Inventors: Takuji Maekawa, Kyoto (JP); Mitsuru Morimoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/734,613

(22) Filed: Jun. 5, 2024

(65) Prior Publication Data
US 2024/0321970 A1     Sep. 26, 2024

Related U.S. Application Data

(63) Continuation of application No. 17/588,558, filed on Jan. 31, 2022, now Pat. No. 12,074,201, which is a
(Continued)

(30) Foreign Application Priority Data

Aug. 1, 2019    (JP) ................................ 2019-142403
Aug. 1, 2019    (JP) ................................ 2019-142405
(Continued)

(51) Int. Cl.
*H10D 62/832*     (2025.01)
*H01L 21/02*     (2006.01)
(Continued)

(52) U.S. Cl.
CPC ... *H10D 62/8325* (2025.01); *H01L 21/02378* (2013.01); *H01L 21/02433* (2013.01);
(Continued)

(58) Field of Classification Search
CPC ............ H10D 62/8325; H10D 62/405; H10D 62/107; H10D 62/393; H10D 62/40;
(Continued)

(56) References Cited

U.S. PATENT DOCUMENTS 8,916,451 B2    12/2014    Bayram et al.
9,666,674 B2    5/2017    Dimitrakopoulos et al.
(Continued)

FOREIGN PATENT DOCUMENTS

CN      108028183      5/2018
CN      108140552      6/2018
(Continued)

OTHER PUBLICATIONS

International Search Report and Written Opinion of PCT/JP2020/029516, Oct. 13, 2020, 9 pages including English translation of the International Search Report.
(Continued)

*Primary Examiner* — Dao H Nguyen
(74) *Attorney, Agent, or Firm* — HSML P.C.

(57) ABSTRACT

A semiconductor substrate includes a drift layer of a first layer formed of a single crystal SiC semiconductor and a buffer layer and a substrate layer of a second layer that is formed of a SiC semiconductor which includes a polycrystalline structure and is formed on the surface of the first layer, in which the second layer (12) is formed on the surface of the drift layer of the first layer by means of CVD growth, the drift layer of the first layer is formed by means of epitaxial growth, and accordingly, defects occurring at a junction interface of the semiconductor substrate including the single crystal SiC layer and the polycrystal SiC layer are suppressed, and manufacturing costs are also reduced.

26 Claims, 38 Drawing Sheets

Related U.S. Application Data continuation of application No. PCT/JP2020/029516, filed on Jul. 31, 2020.

(30) Foreign Application Priority Data

| Aug. 1, 2019 | (JP) | 2019-142409 |
|---|---|---|
| Aug. 1, 2019 | (JP) | 2019-142410 |

(51) Int. Cl.
*H10D 8/60* (2025.01)
*H10D 12/00* (2025.01)
*H10D 30/66* (2025.01)
*H10D 62/40* (2025.01)

(52) U.S. Cl.
CPC .. H01L 21/02516 (2013.01); H01L 21/02529 (2013.01); H01L 21/02595 (2013.01); H10D 62/405 (2025.01); H10D 8/60 (2025.01); H10D 12/441 (2025.01); H10D 30/66 (2025.01); H10D 30/668 (2025.01)

(58) Field of Classification Search
CPC .. H10D 12/441; H10D 12/481; H10D 12/038; H10D 8/60; H10D 30/66; H10D 30/668; H10D 30/0291; H10D 30/0297; H10D 30/60; H10D 64/62; H01L 21/02378; H01L 21/02433; H01L 21/02516; H01L 21/02529; H01L 21/02595; H01L 21/02447; H01L 21/02505; C04B 35/565; C30B 29/36; C30B 30/00
See application file for complete search history.

(56) References Cited

U.S. PATENT DOCUMENTS

| 10,934,634 B2 * | 3/2021 | Yagi | C04B 35/573 |
|---|---|---|---|
| 12,074,201 B2 * | 8/2024 | Maekawa | H01L 29/7802 |
| 2012/0056202 A1 * | 3/2012 | Wada | H01L 29/1608 257/77 |
| 2012/0056203 A1 * | 3/2012 | Fujikawa | H10D 30/83 257/77 |
| 2012/0126251 A1 * | 5/2012 | Sasaki | H01L 21/3247 257/E21.054 |
| 2014/0220764 A1 | 8/2014 | Bayram et al. | |
| 2015/0228728 A1 | 8/2015 | Dimitrakopoulos et al. | |
| 2018/0197736 A1 | 7/2018 | Kim | |
| 2018/0251910 A1 | 9/2018 | Akiyama et al. | |
| 2018/0251911 A1 * | 9/2018 | Kubota | C23C 16/325 |

FOREIGN PATENT DOCUMENTS

| JP | 2005-8472 | 1/2005 |
|---|---|---|
| JP | 2005-507360 | 3/2005 |
| JP | 2006-232614 | 9/2006 |
| JP | 2007273524 | 10/2007 |
| JP | 2012146695 | 8/2012 |
| JP | 2017-57102 | 3/2017 |
| JP | 2017-59574 | 3/2017 |
| JP | 2017-065959 | 4/2017 |
| JP | 6206786 B2 | 10/2017 |
| JP | 2018-535536 | 11/2018 |

OTHER PUBLICATIONS

Y. Yonezawa (AIST) et al., "Low Vf and Highly Reliable 16 kV Ultrahigh Voltage SiC Flip-Type n-channel Implantation and Epitaxial IGBT," IEEE IEDM, 2013, pp. 164-167.

Office Action issued in CN Application No. 202080055823.8, dated Nov. 1, 2024, 39 pages, English machine translation.

Office Action issued in JP Application No. 2021-535467, dated Dec. 3, 2024, 6 pages, English machine translation.

Japanese Office Action issued in Japanese Patent Application No. 2021-535467, dated Jul. 9, 2024, 6 pages, English machine translation provided.

Chinese Office Action issued in CN Application No. 202080055823.8, dated Jun. 29, 2025, 34 pages, English machine translation provided.

* cited by examiner

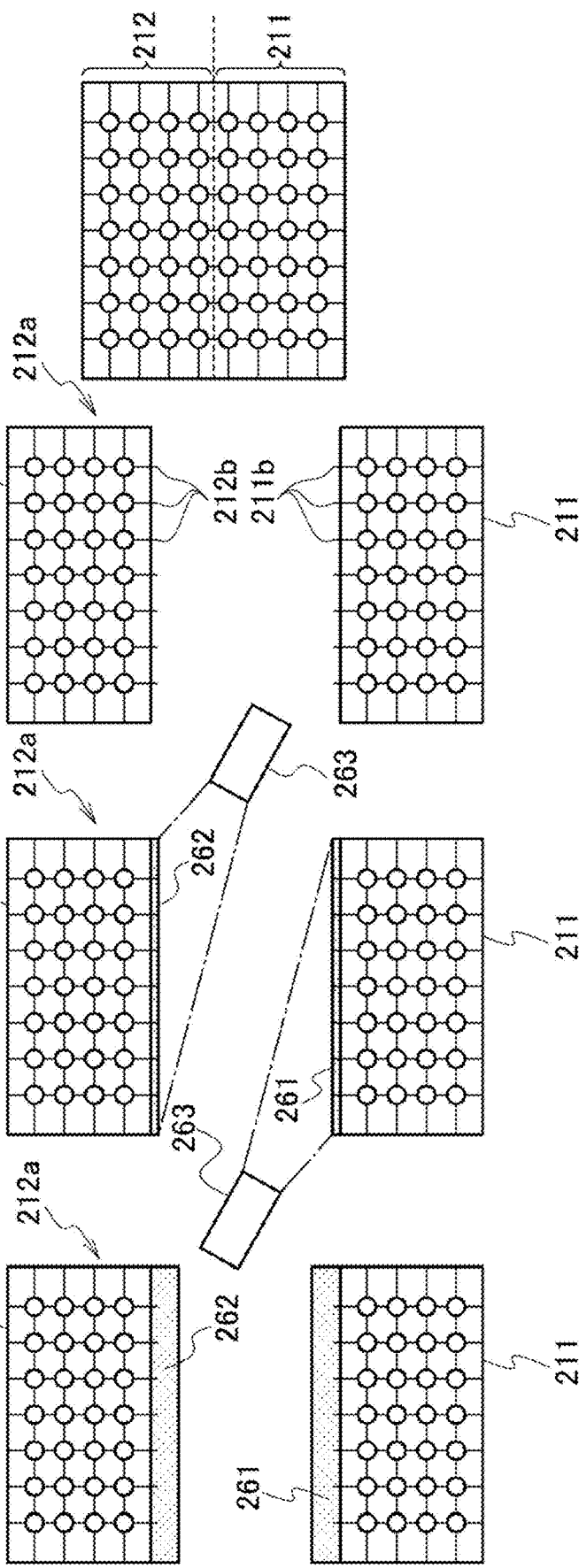

FIG. 20A
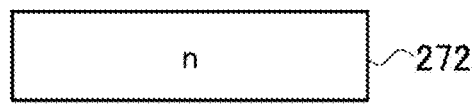
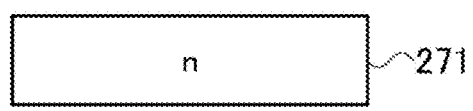
FIG. 20B
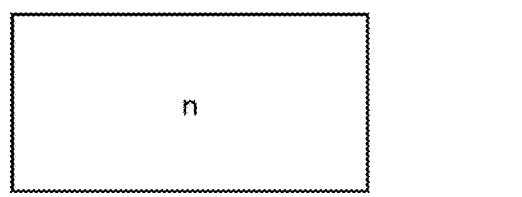
FIG. 21A
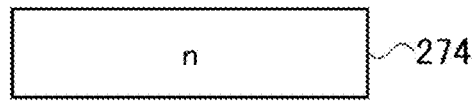
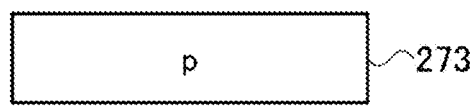
FIG. 21B
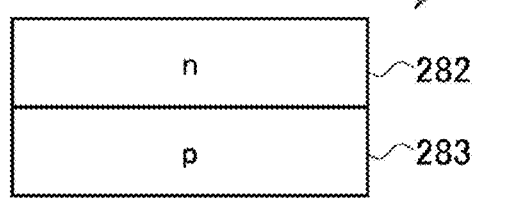

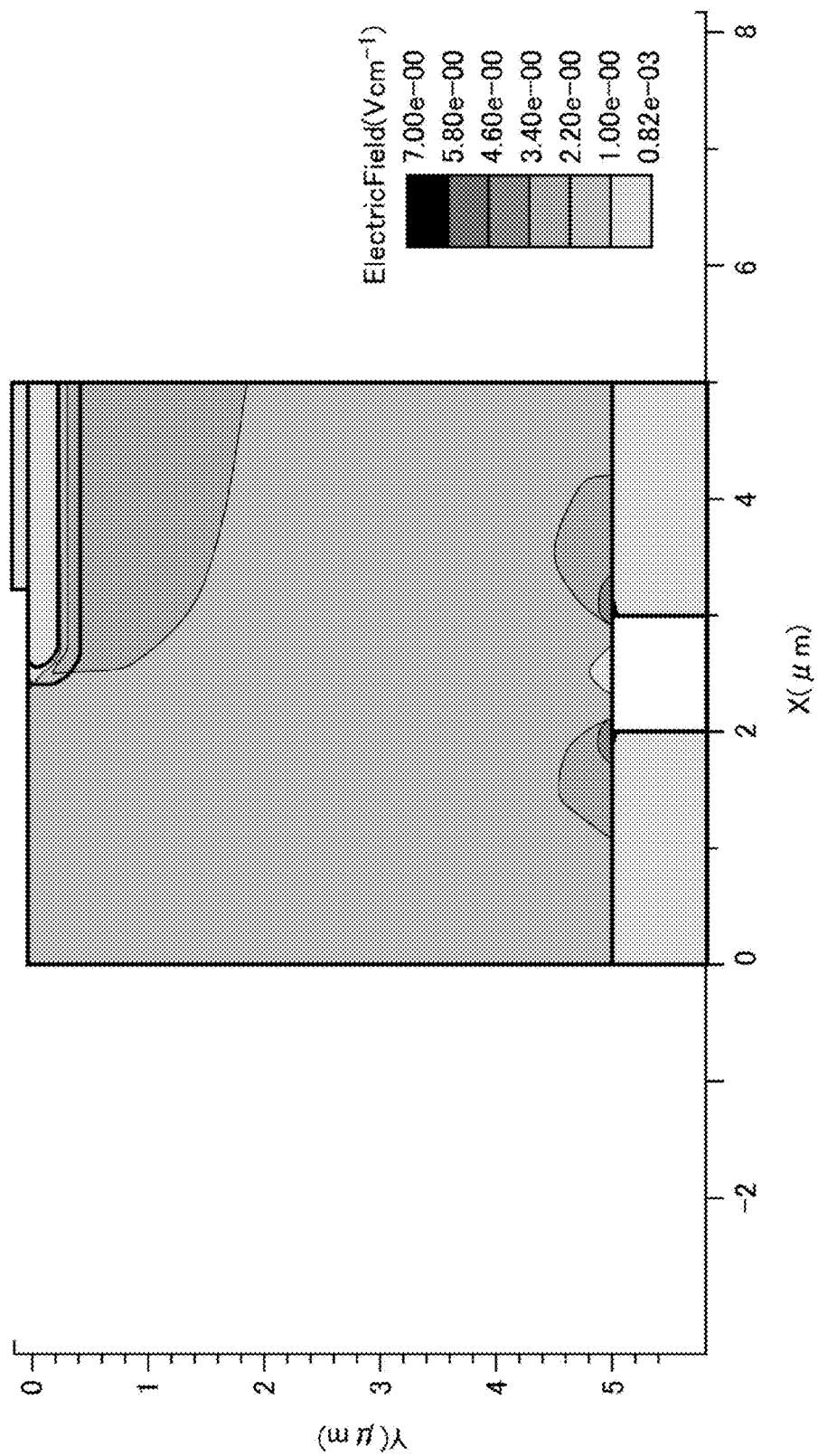

SEMICONDUCTOR SUBSTRATE, SEMICONDUCTOR DEVICE, AND MANUFACTURING METHODS OF THE SAME

CROSS-REFERENCE TO RELATED APPLICATION

This disclosure is a continuation application of U.S. patent application Ser. No. 17/588,558, filed on Jan. 31, 2022, and International Application No. PCT/JP2020/029516, filed on Jul. 31, 2020, which claims the priority of Japanese Patent Application Nos. 2019-142403, 2019-142405, 2019-142409 and 2019-142410, filed on Aug. 1, 2019, the entire contents of which are incorporated by reference herein.

TECHNICAL FIELD

The present disclosure relates to a semiconductor substrate and a semiconductor device using SiC, and manufacturing methods of the same. The present disclosure also relates to a polycrystal silicon carbide substrate, a polycrystal silicon carbide ingot, a manufacturing method of a polycrystal silicon carbide substrate, a semiconductor substrate structure, and a power semiconductor device.

BACKGROUND ART

For power control applications, devices made of SiC have been provided in the past. Examples of such devices include a Schottky barrier diode (SBD), a MOSFET, and an IGBT (insulated gate bipolar transistor). A SiC semiconductor substrate which forms these kinds of devices made of SiC is sometimes fabricated by bonding a single crystal SiC semiconductor substrate to a polycrystal SiC semiconductor substrate in order to reduce manufacturing costs and to provide desired physical properties.

Patent Literature 1 discloses a technique of bonding a single crystal SiC semiconductor substrate fabricated by means of a sublimation method to a polycrystal SiC semiconductor substrate fabricated by means of chemical vapor deposition (CVD). In the technique, an epitaxial layer is grown on the single crystal SiC semiconductor substrate by means of CVD.

Patent Literatures 2 and 3 disclose a technique called remote epitaxy in which a graphene film is formed on a seed single crystal SiC semiconductor substrate, and a SiC epitaxial layer is grown on the seed single crystal SiC semiconductor substrate with the graphene film therebetween. In the technique, thereafter only the SiC epitaxial layer is peeled off and transferred and joined with a SiC semiconductor substrate at a transfer destination. Graphene and SiC are Van der Waals bonded. Therefore, the SiC epitaxial layer can be easily peeled off from the seed single crystal SiC semiconductor substrate.

For power control applications, an n-channel IGBT (insulated gate bipolar transistor) made of SiC is provided. In the n-channel IGBT, a single crystal n-type drift layer is formed on a single crystal p-type substrate layer. The p-type substrate layer is required to have high crystal quality because the n-type drift layer is epitaxially grown on the surface of the p-type substrate layer. As a manufacturing method of a p-type SiC single crystal, a sublimation method and a solution method are known (see Patent Literatures 4 and 5). FIGS. 1A to 1D are flow diagrams showing how a p-type substrate layer is fabricated by means of another manufacturing method (Non-Patent Literature 1). An n-type substrate layer 101 is prepared as shown in FIG. 1A. Then, an n-type drift layer 102 and a p-type layer 103 are formed in this order on the n-type substrate layer 101 by means of chemical vapor deposition (CVD) as shown in FIG. 1B and FIG. 1C. As shown in FIG. 1D, the laminated n-type substrate layer 101, n-type drift layer 102, and p-type layer 103 are reversed vertically. Then, from the upper side, the n-type substrate layer 101 and a portion of the n-type drift layer 102 from the surface of the drift layer to a predetermined depth are removed. This enables the acquisition of a structure for an n-channel IGBT in which the n-type drift layer 102 is laminated on the p-type layer 103 corresponding to a p-type substrate.

Patent Literature 6 discloses a technique for providing a silicon carbide substrate which is a sintered compact having a high relative density.

Suppose that a polycrystal silicon carbide substrate such as a sintered compact is used for manufacturing various silicon carbide semiconductor elements. The above case has more advantages such as reduction in cost than the use of a single crystal silicon carbide substrate. However, if a silicon carbide substrate is used for manufacturing various SiC semiconductor elements, it is necessary to reduce the resistivity of the silicon carbide substrate.

To reduce the resistivity of a polycrystal silicon carbide substrate, a method of doping a silicon carbide substrate with a high-concentration dopant is feasible.

Patent Literature 7 discloses a technique of using a single crystal substrate made of a single crystal as a substrate for a semiconductor device such as a next-generation LED device, a power device, or a high-frequency device.

CITATION LIST

Patent Literature

Patent Literature 1 JP 6206786 B2
Patent Literature 2: U.S. Pat. No. 8,916,451 B2
Patent Literature 3: U.S. Pat. No. 9,666,674 B2
Patent Literature 4: JP 2017-065959 A
Patent Literature 5: JP 2005-507360 A
Patent Literature 6: JP 2006-232614 A
Patent Literature 7: JP 2005-8472 A

Non-Patent Literature

Non-Patent Literature 1: Y. Yonezawa (AIST) et al., IEEE IEDM, p. 164, 2013

SUMMARY

Problem to be Solved

In the technique disclosed in Patent Literature 1, an epitaxial layer is grown on a single crystal SiC semiconductor substrate which has been bonded to a polycrystal SiC semiconductor substrate. Therefore, it has been necessary to bond a high-quality single crystal SiC semiconductor substrate to a polycrystal SiC semiconductor substrate without defects. However, a certain surface roughness is necessary for bonding a single crystal SiC semiconductor substrate to a polycrystal SiC semiconductor substrate by means of a room-temperature junction or diffused junction. The polishing processing for ensuring the surface roughness becomes high in cost, and the yield may decrease due to defects which occur at a junction interface.

In a SiC single crystal manufactured by means of a sublimation method or a solution method, the doping amount of impurities necessary for reducing the resistance of a p-type substrate layer is increased. This decreases the mobility and also the crystallinity. Further, it has been difficult to grow an epitaxial layer having high crystallinity for an n-type drift layer on a p-type substrate layer. In another manufacturing method shown in the flow diagram of FIGS. 1A to 1D, the n-type substrate layer 101, the n-type drift layer 102, and the p-type layer 103 are laminated in this order, they are reversed vertically, and a portion thereof is removed from the upper side. This other method has been complicated in terms of the fabricating procedure, low in throughput, and high in cost.

Suppose that only N (nitrogen) is added as a dopant, for example. In the above case, a C (carbon) site in a single crystal grain is replaced by N in the process of recrystallization of the silicon carbide during sintering. Therefore, there is a risk that a mismatch of the lattice constant may be caused and hole defects may easily occur in crystal grains. Further, if a C site in a single crystal grain is replaced by N, there is a risk of unnecessary microcrystallization and amorphization. Especially, if the concentration of a dopant is increased, these phenomena appear to a remarkable degree and there is a risk that the density of the entire sintered compact may decrease.

Suppose that an epitaxial growth layer is grown on a single crystal substrate. In the above case, the material of the single crystal substrate is limited to a material having a lattice constant close to that of the epitaxial growth layer and a thermal expansion coefficient close to that of the epitaxial growth layer. Therefore it has been difficult to select a combination of a single crystal substrate and an epitaxial growth layer which have desired characteristics.

Further, suppose that a single crystal substrate is used as a substrate for a semiconductor device. In the above case, there has been a problem that a single crystal substrate having good crystal quality becomes costly due to an increase in the complexity and so forth of the manufacturing method. In addition, suppose that a polycrystal substrate is used for cost reduction. In the above case, there is a risk that a concave portion may exist on the surface after polishing and the withstanding voltage of devices formed at positions around the concave portion may decrease.

The present disclosure has been devised in view of the above described problems, and an object of the present invention is to provide a semiconductor substrate, a semiconductor device fabricated by using such a semiconductor substrate, and manufacturing methods of the same. The semiconductor substrate includes a single crystal SiC semiconductor layer and a polycrystal SiC semiconductor layer, suppresses defects occurring at a junction interface, and reduces the manufacturing cost.

Further, an object of the present invention is to provide a semiconductor substrate applicable to an IGBT, a semiconductor device using such a semiconductor substrate, and manufacturing methods of the same. The semiconductor substrate includes an n-type SiC semiconductor layer having high crystallinity which is laminated on a p-type SiC semiconductor layer, and has ensured throughput, and reduced cost.

Still further, an object of the present invention is to provide a polycrystal silicon carbide substrate having low resistivity, reduced lattice defects, and enhanced mechanical strength, a polycrystal silicon carbide ingot, a manufacturing method of a polycrystal silicon carbide substrate, and a power semiconductor device.

It is also an object of the present invention to provide a semiconductor substrate structure by which cost can be reduced and the reliability of a device can be enhanced while obtaining desired physical properties and a power semiconductor device having the semiconductor substrate structure.

Means for Solving the Problem

In order to solve the above described problems, a semiconductor substrate includes a first layer that is formed of a single crystal SiC semiconductor and a second layer that is formed on a surface of the first layer and is formed of a SiC semiconductor which includes a polycrystalline structure, in which the second layer is a formed on the surface of the first layer by means of CVD growth.

The first layer may be formed by means of epitaxial growth. The surface of the first layer may be a [000-1]-oriented C plane or a [0001]-oriented Si plane of 4H—SiC.

The second layer may be formed of a polycrystal SiC semiconductor. The second layer may also include a single crystal SiC semiconductor, a portion of the second layer which is formed from the first layer to a predetermined height may be formed of a single crystal SiC semiconductor, and the remainder of the second layer which is a portion formed beyond the predetermined height from the first layer may be formed of a polycrystal SiC semiconductor.

The first layer may have a thickness of 1 μm or more, the portion of the second layer which is formed from the first layer to the predetermined height may have a thickness of 0.1 μm or more, and the remainder of the second layer which is the portion formed beyond the predetermined height from the first layer may have a thickness of 10 μm or more.

The first layer and the second layer may be connected to each other without having an interface on a junction surface. A diameter may be 100 mm or more.

A semiconductor device includes a semiconductor substrate, the semiconductor substrate including a first layer that is formed of a single crystal SiC semiconductor and a second layer that is formed on the first layer and is formed of a SiC semiconductor which includes a polycrystalline structure, the second layer being formed on a surface of the first layer by means of CVD growth. The first layer is formed as a drift layer, a portion of the second layer which is formed from the first layer to a predetermined height is formed as a buffer layer, and the remainder of the second layer which is a portion formed beyond the predetermined height from the first layer is formed as a substrate layer.

The first layer of the semiconductor substrate may be formed by means of epitaxial growth. The drift layer may have a thickness of 1 μm or more, the buffer layer may have a thickness of 0.1 μm or more, and the substrate layer may have a thickness of 10 μm or more.

The second layer of the semiconductor substrate may be formed of a polycrystal SiC semiconductor. The second layer of the semiconductor substrate may also include a single crystal SiC semiconductor, the buffer layer of the second layer may be a single crystal layer, and the substrate layer of the second layer may be a polycrystal layer.

The semiconductor device may include at least one of a Schottky barrier diode, a MOSFET, an IGBT, and an LED. The first layer and the second layer may be connected to each other without having an interface on a junction surface.

A manufacturing method of a semiconductor substrate includes the steps of epitaxially growing a first layer formed of a single crystal SiC semiconductor on a surface of a base single crystal substrate, growing a second layer formed of a SiC semiconductor which includes a polycrystalline structure on the first layer by means of CVD, and peeling off the first layer together with the second layer from above the base single crystal substrate.

The step of epitaxially growing the first layer may include growing the first layer on the base single crystal substrate by means of remote epitaxy. The surface of the first layer may be a [000−1]-oriented C plane or a [1000]-oriented Si plane of 4H—SiC.

The step of growing the second layer by means of CVD may include forming a second layer that is formed of a polycrystal SiC semiconductor. The step of growing the second layer by means of CVD may include forming the second layer of a polycrystal SiC semiconductor by means of high-speed CVD.

The step of growing the second layer by means of CVD may include forming a portion of the second layer which is formed from the first layer to a predetermined height, with a single crystal SiC semiconductor and forming the remainder of the second layer which is a portion formed beyond the predetermined height from the first layer, with a polycrystal SiC semiconductor.

The step of growing the second layer by means of CVD may include forming the remainder of the second layer which is the portion formed beyond the predetermined height from the first layer, with a polycrystal SiC semiconductor by means of high-speed CVD.

The step of epitaxially growing the first layer may include growing the first layer to have a thickness of 1 µm or more, and the step of growing the second layer by means of CVD may include growing the portion of the second layer which is formed from the first layer to the predetermined height, to have a thickness of 0.1 µm or more and growing the remainder of the second layer which is the portion formed beyond the predetermined height from the first layer, to have a thickness of 10 µm or more. The first layer and the second layer may be connected to each other without including an interface on a junction surface.

A manufacturing method of a semiconductor device includes the steps of providing a semiconductor substrate, the semiconductor substrate including a first layer that is formed of a single crystal SiC semiconductor and a second layer that is formed on the first layer and is formed of a SiC semiconductor which includes a polycrystalline structure, the second layer being formed on a surface of the first layer by means of CVD growth, and forming a semiconductor device by forming the first layer as a drift layer, forming a portion of the second layer which is formed from the first layer to a predetermined height, as a buffer layer, and forming the remainder of the second layer which is a portion formed beyond the predetermined height from the first layer, as a substrate layer.

The first layer of the semiconductor substrate may be formed by means of epitaxial growth. The drift layer may have a thickness of 1 µm or more, the buffer layer may have a thickness of 0.1 µm or more, and the substrate layer may have a thickness of 10 µm or more.

The second layer of the semiconductor substrate may be formed of a polycrystal SiC semiconductor. The second layer of the semiconductor substrate may also include a single crystal SiC semiconductor, the buffer layer of the second layer may be a single crystal layer, and the substrate layer of the second layer may be a polycrystal layer. The semiconductor device may include least one of a Schottky barrier diode, a MOSFET, an IGBT, and an LED.

A semiconductor substrate includes a first substrate that is formed of a p-type SiC semiconductor and includes one surface as a junction surface, and a second substrate that is formed of an n-type SiC semiconductor and includes one surface as a junction surface, the junction surface being covered with a thin film of a p-type SiC semiconductor. The junction surface of the first substrate and the junction surface of the second substrate are joined to each other with the thin film covering the junction surface of the second substrate therebetween.

The thin film may have a thickness of 1 nm or more. The first substrate may be a single crystal substrate or a polycrystal substrate. The second substrate may be a single crystal substrate.

A semiconductor device may use the semiconductor substrate. The semiconductor device may include an n-channel IGBT that includes the first substrate as a p-type substrate layer and the second substrate as an n-type drift layer.

The semiconductor device may further include a buffer layer that is a portion from the junction surface of the second substrate to a predetermined depth and includes an n-type impurity concentration of an n-type SiC semiconductor which is higher than an n-type impurity concentration of an n-type SiC semiconductor of other portions of the second substrate. The n-channel IGBT may include a trench type gate.

A manufacturing method of a semiconductor substrate may include the steps of providing a first substrate that is formed of a p-type SiC semiconductor and includes one surface as a junction surface, providing a second substrate that is formed of an n-type SiC semiconductor and includes one surface as a junction surface, the junction surface being covered with a thin film of a p-type SiC semiconductor, and joining the junction surface of the first substrate and the junction surface of the second substrate to each other with the thin film covering the junction surface of the second substrate therebetween.

The thin film may have a thickness of 1 nm or more. The first substrate may be a single crystal substrate. The step of providing the first substrate may further include a step of fabricating a single crystal p-type SiC semiconductor substrate by means of an epitaxy method. The epitaxy method may be a remote epitaxy method. The step of providing the first substrate may further include a step of cutting a single crystal ingot to fabricate a single crystal p-type SiC semiconductor substrate.

The first substrate may be a polycrystal substrate. The step of providing the first substrate may further include a step of fabricating a polycrystal p-type SiC semiconductor substrate by means of CVD growth. The step of providing the first substrate may further include a step of sintering a powder material to fabricate a polycrystal p-type SiC semiconductor substrate.

The second substrate may be a single crystal substrate. The step of providing the second substrate may further include a step of fabricating a single crystal n-type SiC semiconductor substrate by means of an epitaxy method. The step of fabricating the single crystal n-type SiC semiconductor substrate may further include a step of forming a buffer layer that is a portion from the junction surface of the second substrate to a predetermined depth and includes an n-type impurity concentration which is higher than an n-type impurity concentration of other portions of a main part of the second substrate. The epitaxy method may be a remote epitaxy method. The step of providing the second substrate may further include a step of cutting a single crystal ingot to fabricate a single crystal n-type SiC semiconductor substrate.

The step of providing the second substrate may further include a step of forming a thin film of a single crystal n-type SiC semiconductor by means of an epitaxy method so as to cover the junction surface of the second substrate.

The step of joining between the junction surface of the first substrate and the junction surface of the second substrate may be joining between the first substrate and the second substrate by means of a room-temperature junction. The step of joining between the junction surface of the first substrate and the junction surface of the second substrate may be joining between the first substrate and the second substrate by means of a diffused junction.

A manufacturing method of a semiconductor device may include the steps of providing a semiconductor substrate by using the manufacturing method of the semiconductor substrate, and fabricating an n-channel IGBT that includes the first substrate of the semiconductor substrate as a p-type substrate layer and the main part of the second substrate as an n-type drift layer.

A polycrystal silicon carbide substrate may include at least one of germanium and tin, and may further include a dopant of at least one selected from nitrogen, phosphorus, and boron. The size of a crystallite contained in a polycrystal silicon carbide crystal particle may be 100 nm or less. The relative density may be 99% or more.

A power semiconductor device having the polycrystal silicon carbide substrate may be provided. The power semiconductor device may include at least one or more kinds selected from the group consisting of a SiC Schottky barrier diode, a SiC-MOSFET, a SiC bipolar transistor, a SiC diode, a SiC thyristor, or a SiC insulated gate bipolar transistor.

A polycrystal silicon carbide ingot may include at least one of germanium and tin, and may further include a dopant of at least one selected from nitrogen, phosphorus, and boron. The size of a crystallite contained in a polycrystal silicon carbide crystal particle may be 100 nm or less. The relative density may be 99% or more.

A manufacturing method of a polycrystal silicon carbide substrate may include the steps of blending at least two kinds of either one or both of a compound of group IV-V elements and a compound of group III-IV elements into a powder of silicon carbide that is a main material and preparing a mixed powder including an average particle diameter of 100 nm or less, obtaining a polycrystal silicon carbide ingot by spark plasma sintering the mixed powder, and creating a polycrystal silicon carbide substrate by cutting the polycrystal silicon carbide ingot. The compound of the group IV-V elements may be a material of at least one or more kinds selected from the group consisting of $Si_3N_4$, $Ge_3N_4$, and $Sn_3N_4$. The compound of the group III-IV elements may be a material of at least one or more kinds selected from the group consisting of $B_4C$ and $SiB_4$.

A semiconductor substrate structure includes a polycrystal substrate, a first epitaxial growth layer that is integrated with the polycrystal substrate, and a second epitaxial growth layer that is interposed between the polycrystal substrate and the first epitaxial growth layer and is joined with both of the polycrystal substrate and the first epitaxial growth layer. The first epitaxial growth layer includes a first dopant and the second epitaxial growth layer includes a second dopant of the same conductivity type as the first dopant, and the concentration of the second dopant may be higher than the concentration of the first dopant.

The second epitaxial growth layer and the polycrystal substrate may be joined to each other by means of a room-temperature junction. The second epitaxial growth layer and the first epitaxial growth layer may be joined to each other by means of a room-temperature junction.

The concentration of the first dopant in the first epitaxial growth layer may be $5\times10^{14}/cm^3$ or more and less than $2\times10^{17}/cm^3$, and the concentration of the second dopant in the second epitaxial growth layer may be $2\times10^{17}/cm^3$ or more and $5\times10^{18}/cm^3$ or less. The thickness of the second epitaxial growth layer may be 0.1 µm or more and 10 µm or less.

Each of the first epitaxial growth layer and the second epitaxial growth layer may include at least one or more kinds selected from the group consisting of a group IV element semiconductor, a group III-V compound semiconductor, and a group II-VI compound semiconductor. Each of the first epitaxial growth layer and the second epitaxial growth layer may include at least one or more kinds selected from the group consisting of silicon carbide, gallium nitride, silicon, aluminum nitride, and gallium oxide.

The polycrystal substrate may include at least one or more kinds selected from the group consisting of a sintered compact, BN, AlN, $Al_2O_3$, $Ga_2O_3$, diamond, carbon, and graphite. The sintered compact may include a sintered compact of at least one or more kinds selected from the group consisting of a group IV element semiconductor, a group III-V compound semiconductor, and a group II-VI compound semiconductor. The sintered compact may include a sintered compact of at least one or more kinds selected from the group consisting of silicon carbide, gallium nitride, silicon, aluminum nitride, and gallium oxide.

The polycrystal substrate may include a dopant at a concentration of $5\times10^{18}/cm^3$ or more and $2\times10^{22}/cm^3$ or less. The polycrystal substrate may have a thickness of 100 µm or more and 1000 µm or less. The polycrystal substrate and the second epitaxial growth layer may form an ohmic junction.

Each of the first epitaxial growth layer and the second epitaxial growth layer may include an epitaxial growth layer made of 4H—SiC and the epitaxial growth layer made of 4H—SiC may include a surface of a (000–1) plane or a (0001) plane. The polycrystal substrate may include a diameter of 100 mm or more.

A power semiconductor device which includes the semiconductor substrate structure may be provided. The power semiconductor device may include at least one or more kinds selected from the group consisting of a SiC Schottky barrier diode, a SiC-MOSFET, a SiC bipolar transistor, a SiC diode, a SiC thyristor, a SiC insulated gate bipolar transistor, and an LED device.

The power semiconductor device may further include a first metal electrode that is disposed on a surface of the polycrystal substrate which faces a junction surface between the polycrystal substrate and the second epitaxial growth layer. The power semiconductor device may further include a second metal electrode that is disposed on a surface of the first epitaxial growth layer which faces a junction surface between the second epitaxial growth layer and the first epitaxial growth layer. The power semiconductor device may include a second metal electrode that is disposed on a surface of the first epitaxial growth layer which faces a junction surface between the second epitaxial growth layer and the first epitaxial growth layer.

Effect

According to the present disclosure, a room-temperature junction and a diffused junction are not required, and therefore polishing to ensure the surface roughness is not required, and the manufacturing cost is reduced. In addition, since there is no junction interface, defects originating from a junction interface are suppressed.

Further, a semiconductor substrate which includes an n-type SiC semiconductor layer laminated on a p-type SiC semiconductor layer and is applicable to an IGBT may include an n-type SiC semiconductor layer having high crystallinity. Further, this kind of semiconductor substrate may have ensured throughput and reduced cost.

Further, a polycrystal silicon carbide substrate having low resistivity, reduced lattice defects, and enhanced strength may be provided. Still further, a polycrystal silicon carbide ingot, a manufacturing method of the polycrystal silicon carbide substrate, and a power semiconductor device using the polycrystal silicon carbide substrate may be provided.

A semiconductor substrate structure by which cost can be reduced and reliability of a device is enhanced while obtaining desired physical properties may be provided. Further, a power semiconductor device having this kind of semiconductor substrate structure may be provided.

BRIEF DESCRIPTION OF THE DRAWINGS

FIGS. 11A to 11D are diagrams for explaining the joining of substrates by means of a room-temperature junction.

FIGS. 20A and 20B are flow diagrams showing a comparative example of a manufacturing method of a semiconductor substrate of Comparative Example 1.

FIGS. 21A and 21B are flow diagrams showing a comparative example of a manufacturing method of a semiconductor substrate of Comparative Example 2.

FIG. 23A is a process drawing showing that a polycrystal silicon carbide ingot is prepared, cut, and polished to form a plurality of polycrystal silicon carbide bare wafers. FIG. 23B is a process drawing showing that a polycrystal silicon carbide substrate is formed by removing a cut surface of a polycrystal silicon carbide bare wafer after machining.

FIG. 32C is a simulation result of an electric field distribution in a state where a breakdown voltage is applied to each simulation model used in FIG. 31 and is a simulation result of a model of a Schottky barrier diode which has a defect at an interface between a substrate and a first epitaxial growth layer and does not include a buffer layer.

EMBODIMENTS

First Embodiment

Figure 1A:
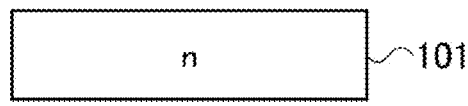
FIGS. 1A to 1E are flow diagrams showing another fabrication method for fabricating a p-type substrate layer.
Figure 1B:
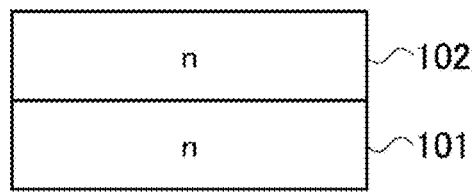
Figure 1C:
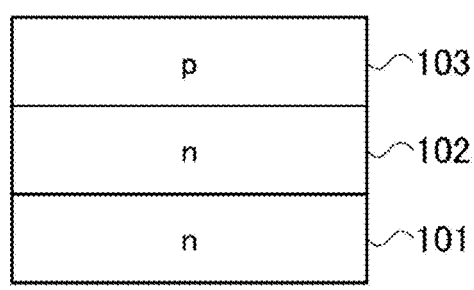
Figure 1D:
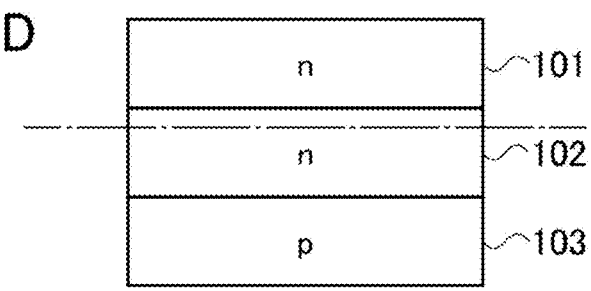
Figure 1E:
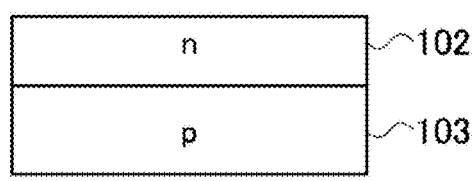
Figure 2:
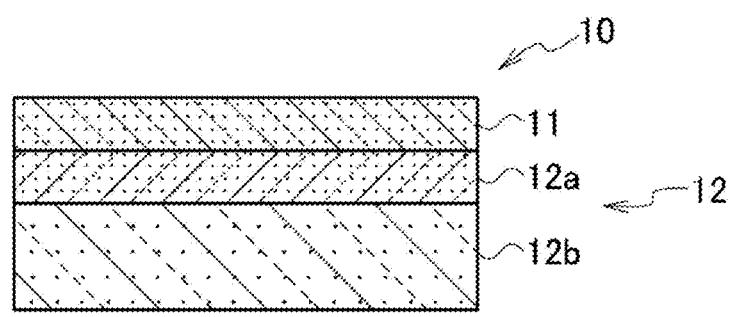
FIG. 2 is a cross sectional view showing a schematic configuration of a semiconductor substrate according to a first embodiment.

A semiconductor substrate, a semiconductor device, and manufacturing methods of the same of a first embodiment will be described in detail with reference to the drawings. FIG. 2 is a cross sectional view showing a schematic configuration of a semiconductor substrate of the first embodiment.

A semiconductor substrate 10 of the first embodiment includes a drift layer 11 of a first layer which is a single crystal SiC semiconductor layer. The semiconductor substrate 10 also includes a buffer layer 12a and a substrate layer 12b of a second layer 12 which is a single crystal or polycrystal SiC semiconductor layer. The buffer layer 12a of the second layer 12 is formed from the surface of the drift layer 11 to a predetermined height in the direction of the second layer 12. The remainder of the second layer 12 on buffer layer 12a which is a layer portion formed beyond the predetermined height from the surface of the drift layer 11 forms the substrate layer 12b of the second layer 12. In the semiconductor substrate 10 of the first embodiment, the drift layer 11 of the first layer and the buffer layer 12a of the second layer 12 are connected to each other without having an interface on the junction surface therebetween.

In the semiconductor substrate 10, the drift layer 11 of the first layer may have a thickness of 1 μm or more. The buffer layer 12a of the second layer 12 may have a thickness of 0.1 μm or more. The substrate layer 12b may have a thickness of 10 μm or more. The semiconductor substrate 10 may have a diameter of 100 mm or more.

In the semiconductor substrate 10, the drift layer 11 of the first layer, which is a single crystal SiC semiconductor, is formed by means of epitaxial growth using chemical vapor deposition (CVD). The buffer layer 12a of the second layer 12 is a single crystal or polycrystal SiC semiconductor, and the substrate layer 12b is a polycrystal SiC semiconductor. The buffer layer 12a and the substrate layer 12b of the second layer 12 are formed on the surface of the drift layer 11 of the first layer by means of CVD. The polycrystal buffer layer 12a and substrate layer 12b may be formed by means of high-speed CVD.

The semiconductor substrate 10 of the first embodiment is configured by forming the buffer layer 12a and the substrate layer 12b of the second layer 12 in this order on an epitaxial layer of the drift layer 11 of the first layer by means of CVD. This connects the drift layer 11 of the first layer and the buffer layer 12a of the second layer 12 to each other without having an interface on the junction surface therebetween. Therefore, the junction surface between the first layer and the second layer 12 can have a high quality and a high interface strength. In addition, it is not necessary to consider defects which occur at a junction interface, and the manufacturing yield can be ensured. Further, the semiconductor substrate 10 is formed by forming the buffer layer 12a and the substrate layer 12b of the second layer 12 in this order on the drift layer 11 of the first layer by means of CVD. Therefore, the polishing processing required for a room-temperature junction and diffused junction is not necessary, and man-hours can be reduced to reduce costs.

Figure 3A:
FIGS. 3A to 3E are flow diagrams showing a manufacturing method of a semiconductor substrate according to a first embodiment.

FIGS. 3A to 3E are flow diagrams showing a manufacturing method of the semiconductor substrate 10 of the first embodiment. As shown in FIG. 3A, a single crystal seed SiC semiconductor substrate 21 is prepared as a base for epitaxial growth. In the manufacturing method of the first embodiment, the seed SiC semiconductor substrate 21 is 4H—SiC. The surface of the seed SiC semiconductor substrate 21 used for epitaxial growth may be either a [0001]-oriented Si plane or a [000-1]-oriented C plane. In the first embodiment, remote epitaxy is used for epitaxial growth.

Figure 4A:
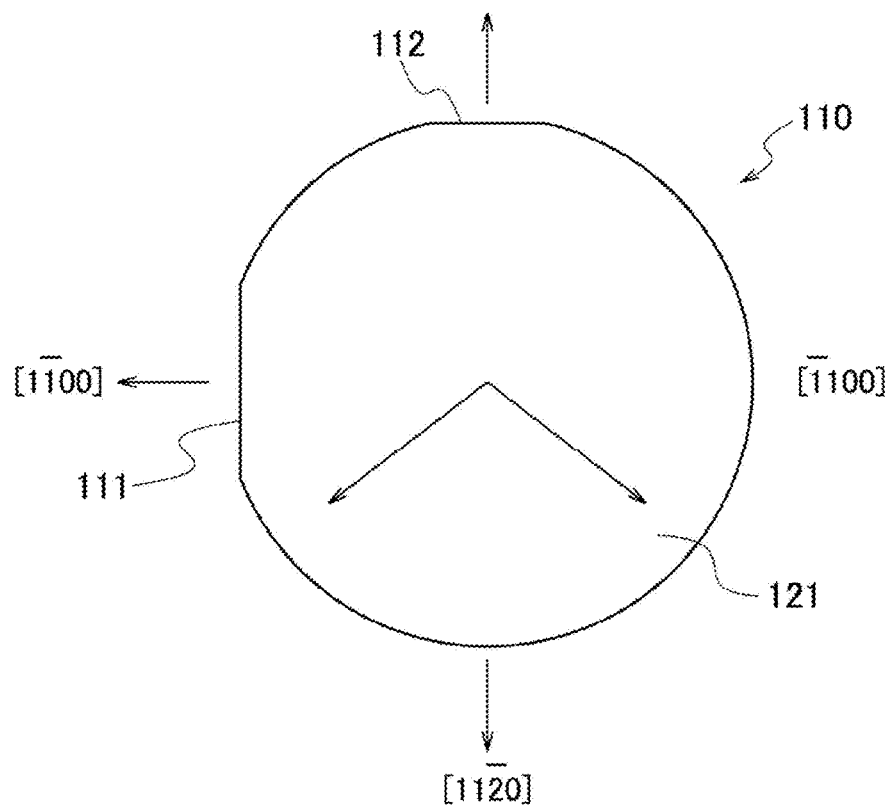
FIGS. 4A and 4B are diagrams for explaining a crystal plane of SiC.
Figure 4B:
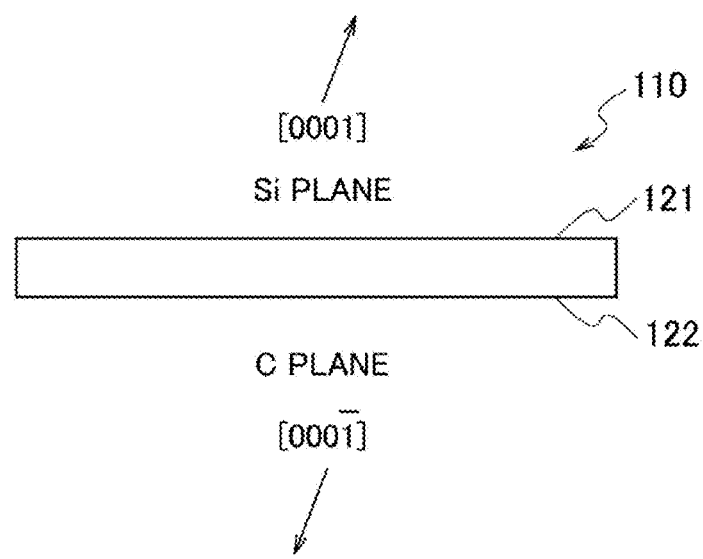

FIGS. 4A to 4E are diagrams for explaining a crystal plane of SiC. The plan view of FIG. 4A shows a Si plane 121 of a SiC wafer 200 on which a primary orientation flat 111 and a secondary orientation flat 112 are formed. In the side view of FIG. 4B which is obtained by viewing the SiC wafer 200 of FIG. 4A from the orientation of [−1100], the Si plane 121 having an orientation of is formed on the upper surface. The C plane 1222 having an orientation of [000−1] is formed on the lower surface.

Figure 3B:
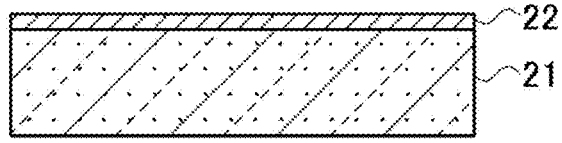

In FIG. 3B, the seed SiC semiconductor substrate 21 of 4H—SiC with the surface being a Si plane or a C plane prepared in FIG. 3A is used. In FIG. 3B, a graphene film 22 is formed to cover the surface of the seed SiC semiconductor substrate 21 to apply remote epitaxy. The graphene film 22 can be formed by means of CVD, for example.

Figure 3C:
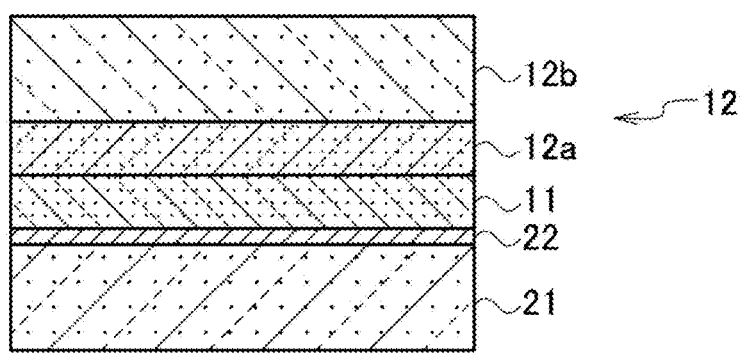

In FIG. 3C, the drift layer 11 of the first layer is formed on the surface of the seed SiC semiconductor substrate 21 on which the graphene film 22 is formed in FIG. 3B, with the graphene film 22 between the drift layer 11 and the seed SiC semiconductor substrate 21. The drift layer 11 is formed by epitaxially growing a single crystal on the surface of a Si plane or a C plane of the seed SiC semiconductor substrate 21 by means of CVD.

Following the formation of the drift layer 11, the second layer 12 is formed on the drift layer 11 of the first layer by means of CVD. The single crystal or polycrystal buffer layer 12a of the second layer 12 is formed to a predetermined height from the surface of the drift layer 11. The remainder of the second layer 12 on the buffer layer 12a which is a layer portion formed beyond the predetermined height from the surface of the drift layer 11 forms the polycrystal substrate layer 12b of the second layer 12. The polycrystal buffer layer 12a and substrate layer 12b may be formed by means of high-speed CVD.

Table 1 shows the growth rate of a SiC layer based on each method. According to Table 1, the epitaxial CVD used to form the drift layer 11 of the first layer has a low growth rate of 50 μm/h. Meanwhile, the ultrafast CVD which can be used to form the polycrystal buffer layer 12a and substrate layer 12b of the second layer 12 has a high growth rate of 450 to 1700 μm/h. In both CVD methods, the gas species are $SiCl_4$ and $CH_4$. Although Table 1 also shows sublimation growth for comparison, the growth rate is low as in epitaxial CVD.

TABLE 1

| Method | Target | Growth rate (μm/h) | Remarks |
| --- | --- | --- | --- |
| SiC epitaxial CVD | Single crystal | 50 | Literature value |
| Ultrafast SiC-CVD | Polycrystal | 450-1700 | Literature value |
| Sublimation growth | Single crystal | 60 | 2 mm/2 weeks |

The use of high-speed CVD can form the polycrystal buffer layer 12a and substrate layer 12b at a high growth rate. The polycrystal buffer layer 12a grown by means of high-speed CVD becomes a cubic polycrystal highly oriented above a Si plane or a C plane of the seed SiC semiconductor substrate 21. If the layer is grown at an even higher speed, the layer becomes a cubic structure or a polycrystal with random orientation.

In the formation of the drift layer 11 of the first layer and the buffer layer 12a and the substrate layer 12b of the second layer 12 by means of CVD in FIG. 3C, the epitaxial growth of the drift layer 11 of the first layer by means of CVD and the formation of the buffer layer 12a of the second layer 12 by means of CVD can be continuously performed. The drift layer 11 of the first layer and the buffer layer 12a of the second layer 12 are connected to each other without having an interface formed on the junction surface therebetween.

The formation of the buffer layer 12a and the substrate layer 12b of the second layer 12 from the formation of the drift layer 11 of the first layer can be performed as a series of CVD steps while changing conditions such as the deposition rate and the concentration of additives. For example, the drift layer 11 may be formed to have a thickness of 7 μm or more by adding a dopant at a carrier concentration Nd of $10^{16}/cm^3$. The buffer layer 12a may be formed to have a thickness of 1 μm by adding a dopant at a carrier concentration Nd of $10^{18}/cm^3$. The substrate layer 12b may be formed to have a thickness of 350 μm by adding a dopant at a carrier concentration Nd of $10^{19}/cm^3$. The dopant may be an n-type impurity such as nitrogen or phosphorus, or a p-type impurity such as boron or aluminum.

Figure 3D:
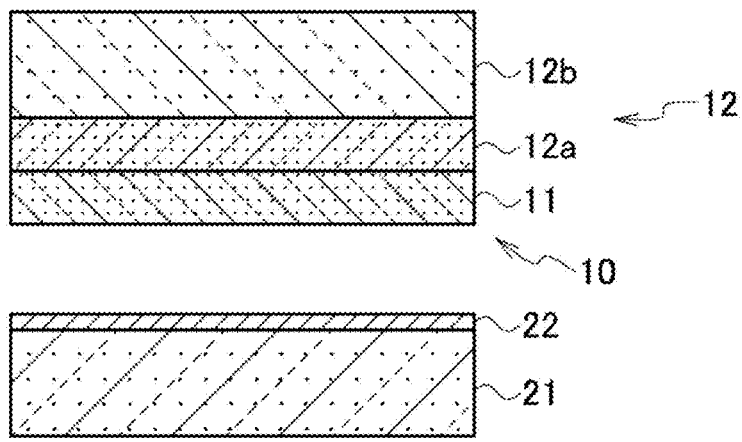

In FIG. 3D, the drift layer 11 of the first layer and the buffer layer 12a and the substrate layer 12b of the second layer 12 formed on the surface of the seed SiC semiconductor substrate 21 in FIG. 3C are peeled off from the surface of the seed SiC semiconductor substrate 21. The graphene film 22 is formed on the surface of the seed SiC semiconductor substrate 21. The drift layer 11 of the first layer and the buffer layer 12a and substrate layer 12b of the second layer 12 are laminated on the graphene film 22. The graphene and SiC are Van der Waals bonded. Therefore, the drift layer 11 of the first layer, and the buffer layer 12a and the substrate layer 12b of the second layer 12, which are laminated on the seed SiC semiconductor substrate 21 with the graphene film 22 therebetween can be easily peeled off from the seed SiC semiconductor substrate 21.

Figure 3E:
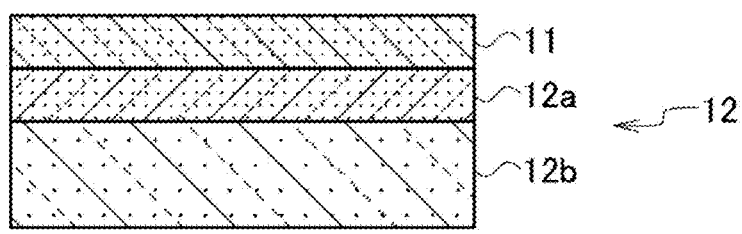

In FIG. 3E, the drift layer 11 of the first layer and the buffer layer 12a and the substrate layer 12b of the second layer 12 which are peeled off from the seed SiC semiconductor substrate 21 in FIG. 3D are arranged in a vertically reversed order. Due to the vertical reversion, the lowest layer becomes the substrate layer 12b, and the buffer layer 12a and the drift layer 11 are laminated in this order on the substrate layer 12b. This enables the acquisition of the semiconductor substrate 10 of the first embodiment having the configuration shown in FIG. 2.

According to a manufacturing method of a semiconductor substrate of the first embodiment, the drift layer 11 of the first layer and the buffer layer 12a and the substrate layer 12b of the second layer 12 are formed by means of CVD. This connects the drift layer 11 and the buffer layer 12a to each other without having an interface on the junction surface therebetween. Therefore, the junction surface between the first layer and the second layer 12 can have a high quality and a high interface strength. In addition, it is not necessary to consider defects which occur at the junction interface, and the manufacturing yield can be ensured. Further, since the drift layer 11 of the first layer and the buffer layer 12a and the substrate layer 12b of the second layer 12 are formed by means of CVD, a step of polishing processing required for a room-temperature junction and diffused junction is not necessary, and man-hours can be reduced to reduce costs.

In the manufacturing method of the semiconductor substrate of the first embodiment, the drift layer 11 of the first layer and the buffer layer 12a and the substrate layer 12b of the second layer 12 are formed on the seed SiC semiconductor substrate 21 with the graphene film 22 therebetween in accordance with remote epitaxy. The drift layer 11 of the first layer and the buffer layer 12a and the substrate layer 12b of the second layer 12, which are formed through the graphene film 22, can be easily peeled off from the seed SiC semiconductor substrate 21. Therefore, at the time of peeling, it is possible to reliably peel off the drift layer 11 of the first layer and the buffer layer 12a and the substrate layer 12b of the second layer 12, which are laminated on the substrate, without breaking or degrading them.

In the manufacturing method of the semiconductor substrate of the first embodiment, the buffer layer 12a and the substrate layer 12b of the second layer 12 can be formed in a short time by means of high-speed CVD. Therefore, the throughput for manufacturing the semiconductor substrate 10 can be enhanced.

In the manufacturing method the semiconductor of the first embodiment, the graphene film 22 is formed on the surface of the seed SiC semiconductor substrate 21 in FIG. 3B by using remote epitaxy. The drift layer 11 of the first substrate and the buffer layer 12a and the substrate layer 12b of the second layer 12, which are laminated on the surface of the seed SiC semiconductor substrate 21, are peeled off at the junction surface between the drift layer 11 and the graphene film 22 that is interposed between the seed SiC semiconductor substrate 21 and the drift layer 11, but they may be peeled off based on other methods than remote epitaxy. Alternatively, the drift layer of the first substrate and the buffer layer 12a and the substrate layer 12b of the second layer 12 can be laminated on the surface of the seed SiC semiconductor substrate 21 without forming the graphene film 22, for example. The drift layer, the buffer layer 12a, and the substrate layer 12b may be peeled off by polishing or cutting the seed SiC semiconductor substrate 21.

Figure 5A:
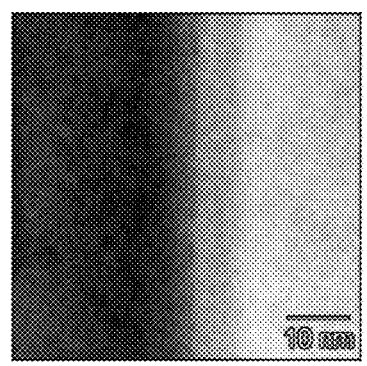
FIGS. 5A to 5D show TEM-EDX images of a junction surface of a semiconductor substrate of a first embodiment.
Figure 5B:
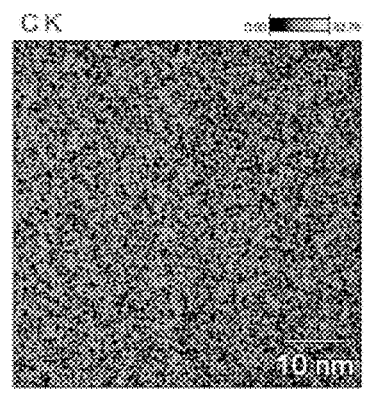
Figure 5C:
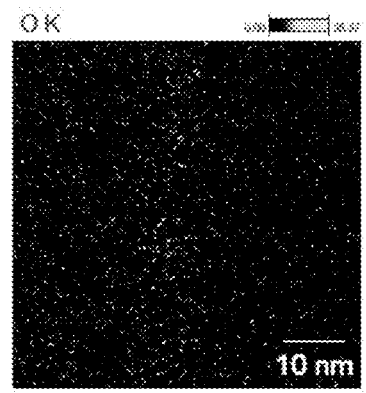
Figure 5D:
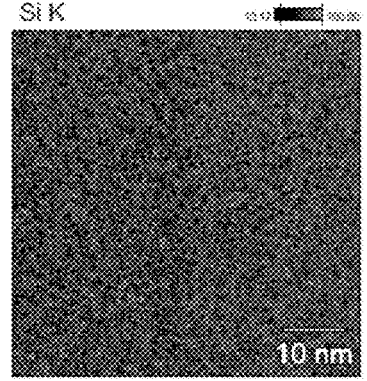

FIGS. 5A to 5D show images obtained by observing a cross section of the junction surface between the drift layer 11 of the first layer and the buffer layer 12a of the second layer 12 by using a transmission electron microscope (TEM) and by means of energy dispersive X-ray spectrometry (EDX). FIG. 5A is a transmission electron microscope image, FIG. 5B is a K line image of C, FIG. 5C is a K line image of O, and FIG. 5D is a K line image of Si. The left side of each image in the drawing is the drift layer 11 of the first layer, and the right side of each image in the drawing is the buffer layer 12a of the second layer 12. It can be seen that an interface of an amorphous structure does not exist on the junction surface between the drift layer 11 of the first layer and the buffer layer 12a of the second layer 12.

Figure 6:
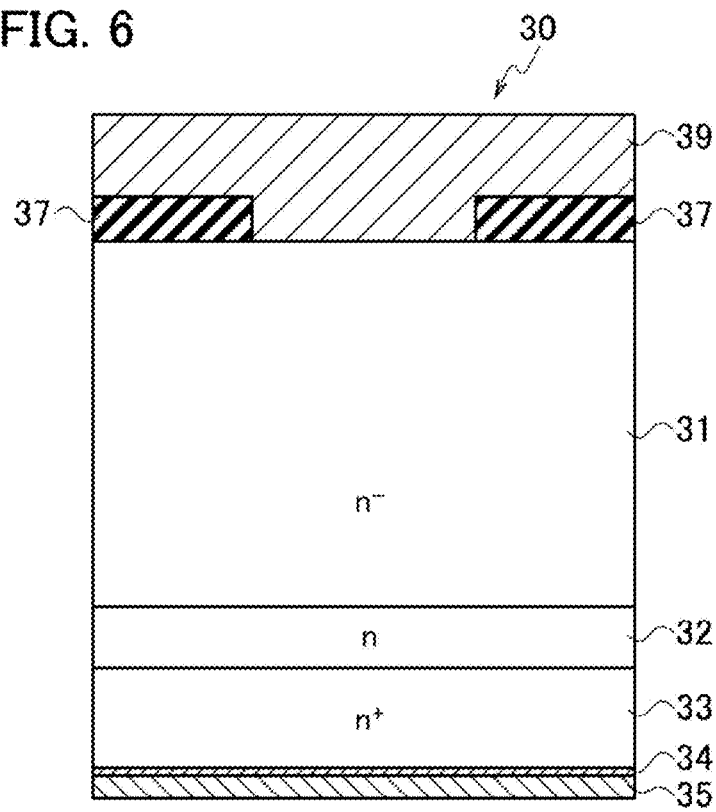
FIG. 6 is a cross sectional view showing a configuration of a Schottky barrier diode.

FIG. 6 is a cross sectional view showing a Schottky barrier diode 30 to which the semiconductor substrate 10 of the first embodiment is applied. The semiconductor substrate 10 is formed as an n-type SiC semiconductor in which an n-type impurity such as nitrogen or phosphorus is doped in SiC. The carrier concentration Nd of the n-type impurity is set such that the substrate layer 12b has a higher concentration and the drift layer 11 has a lower concentration than the buffer layer 12a.

In the Schottky barrier diode 30, the drift layer 11 of the first layer of the semiconductor substrate 10 corresponds to an (n−)-type drift layer 31, the buffer layer 12a of the second layer 12 corresponds to an n-type buffer layer 32, and the substrate layer 12b of the second layer 12 corresponds to an (n+)-type substrate layer 33. The "(n−)-type" and "(n+)-type" of the (n−)-type drift layer 31 and the (n+)-type substrate layer 33 indicate that the (n−)-type drift layer 31 and the (n+)-type substrate layer 33 have lower and higher carrier concentrations Nd of the n-type impurity respectively than that of the n-type buffer layer 32.

In the Schottky barrier diode 30, a cathode electrode 35, a metal silicide 34, an (n+)-type substrate layer 33, an n-type buffer layer 32, and an (n−)-type drift layer 31 are laminated in this order. On the surface of the (n−)-type drift layer 31, a metal film 39 is formed through an insulating film 37 in which an opening is formed. The metal film 39 contacts the (n−)-type drift layer 31 through the opening in the insulating film 37 to form a Schottky barrier.

The Schottky barrier diode 30 of the first embodiment uses the semiconductor substrate 10 of the first embodiment shown in FIGS. 3A to 3E, the semiconductor substrate 10 being obtained by laminating the drift layer 11 of the first layer and the buffer layer 12a and the substrate layer 12b of the second layer 12 by means of CVD. Therefore, the (n+)-type substrate layer 33 corresponding to the substrate layer 12b, the n-type buffer layer 32 corresponding to the buffer layer 12a, and the (n−)-type drift layer 31 corresponding to the drift layer 11 of the first layer each can be set to have characteristics such as desired crystallinity and resistance.

In the Schottky barrier diode 30 shown in FIG. 6, an n-type semiconductor contacts with metal, but the present invention is not limited to this. A p-type semiconductor may be used instead of an n-type semiconductor. In this case, in the manufacturing method of a semiconductor substrate shown in FIG. 3, a p-type impurity such as boron or aluminum may be doped.

Figure 7:
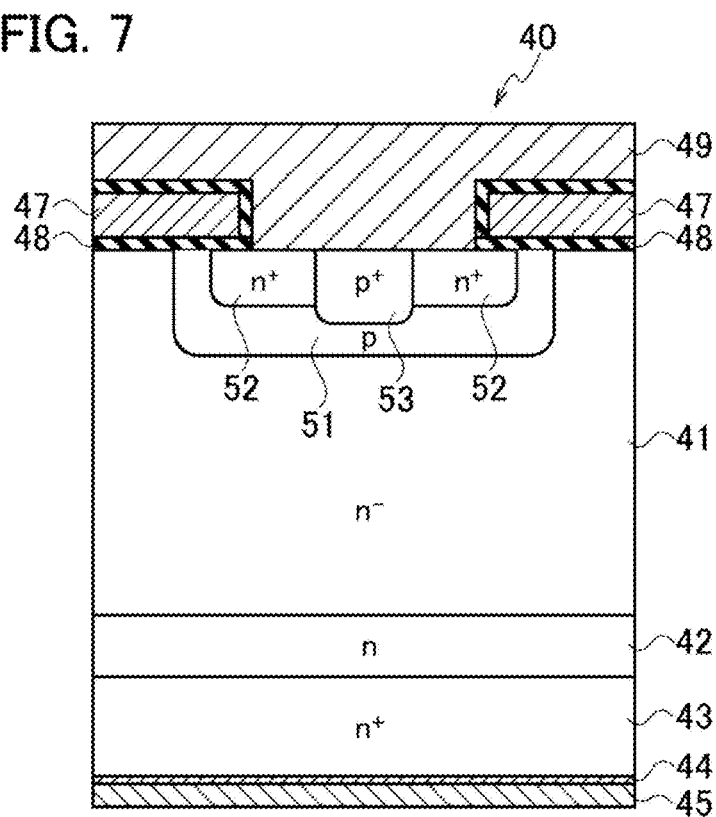
FIG. 7 is a cross sectional view showing a configuration of a MOSFET.

FIG. 7 is a cross sectional view showing a MOSFET 40 to which the semiconductor substrate 10 of the first embodiment is applied. In the MOSFET 40, the drift layer 11 of the first layer of the semiconductor substrate 10 corresponds to an (n−)-type drift layer 41, the buffer layer 12a of the second layer 12 corresponds to an n-type buffer layer 42, and the substrate layer 12b of the second layer 12 corresponds to an (n+)-type substrate layer 43. The "(n−)-type" and "(n+)-type" of the (n−)-type drift layer 41 and the (n+)-type substrate layer 43 indicate that the (n−)-type drift layer 41 and the (n+)-type substrate layer 43 have lower and higher carrier concentrations Nd of the n-type impurity respectively than that of the n-type buffer layer 42.

In the MOSFET 40, a drain electrode 45, a metal silicide 44, an (n+)-type substrate layer 43, an n-type buffer layer 42, and an (n−)-type drift layer 41 are laminated in this order. A well p-type channel region 51, (n+)-type source regions 52, and a (p+)-type channel connection region 53 are formed on the surface of the (n−)-type drift layer 41. Gate electrodes 47 covered with gate insulating films 48 are arranged so as to straddle the (n+)-type source regions 52 at a portion where the (n−)-type drift layer 41 reaches the surface. An interlayer insulating film 49 is laminated so as to cover the (n+)-type source regions 52 and the (p+)-type channel connection region 53 on the surface of the (n−)-type drift layer 41 and the gate electrodes 47.

In the MOSFET 40 of the first embodiment, the drift layer 11 of the first layer and the buffer layer 12a and the substrate layer 12b of the second layer 12 are formed by means of CVD as shown in FIGS. 3A to 3E. Therefore, as similar to the Schottky barrier diode 30 shown in FIG. 6, the (n+)-type substrate layer 43 corresponding to the substrate layer 12b, the n-type buffer layer 42 corresponding to the buffer layer 12a, and the (n−)-type drift layer 41 corresponding to the drift layer 11 of the first layer each can be set to have characteristics such as desired crystallinity and resistance.

The MOSFET 40 of the first embodiment has the n-type buffer layer 42 between the (n+)-type substrate layer 43 and the (n−)-type drift layer 41. Similarly, the Schottky barrier diode 30 of the first embodiment also has the n-type buffer layer 32 between the (n+)-type substrate layer 33 and the (n−)-type drift layer 31. A semiconductor device including the MOSFET 40 and the Schottky barrier diode 30 is set to have an ohmic junction in which the impurity concentration is adjusted by means of CVD and a buffer layer with a high doping concentration. This adjusts the expansion of a depletion layer to suppress a basal plane dislocation (BPD) growing from a line defect to a stacking fault which is a surface defect. Also, the increase in the resistance due to the growth of the stacking fault and the increase in a forward voltage Vf of a body diode can be suppressed.

The MOSFET 40 shown in FIG. 7 is an n-channel MOSFET, but the type of MOSFET is not limited to this. In the manufacturing method of the semiconductor substrate shown in FIG. 3, a p-channel MOSFET may be fabricated by using a p-type SiC semiconductor substrate which is formed by doping a p-type impurity such as boron or aluminum.

In the first embodiment, the Schottky barrier diode of FIG. 6 and the MOSFET of FIG. 7 are exemplified, but the first embodiment is not limited to this. The semiconductor substrate 10 of the first embodiment can also be applied to other types of devices such as LEDs (light emitting diodes), for example.

Figure 8A:
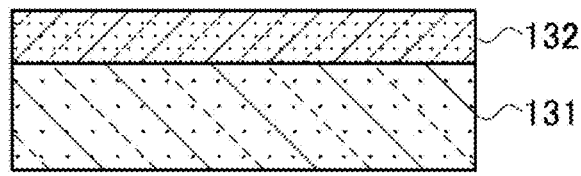
FIGS. 8A to 8C are diagrams for explaining a manufacturing method of a semiconductor substrate of a comparative example.
Figure 8B:
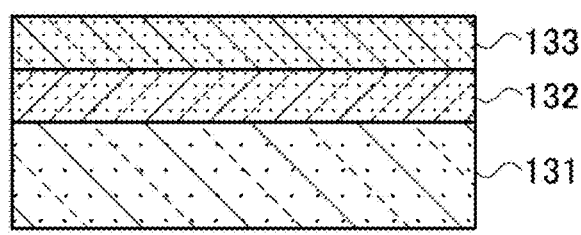
Figure 8C:
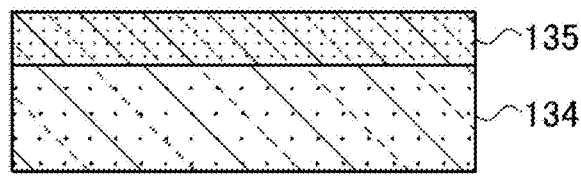

FIGS. 8A to 8C is a diagram for explaining a manufacturing method of a semiconductor substrate of a comparative example. In a first comparative example, as shown in FIG. 8A, a single crystal SiC semiconductor substrate 132 formed based on a sublimation method is bonded on the surface of a polycrystal SiC semiconductor substrate 131 formed by means of CVD by using a room-temperature junction or a diffused junction. As shown in FIG. 8B, a single crystal epitaxial layer 133 is epitaxially grown on the surface of the single crystal SiC semiconductor substrate 132 by means of CVD.

In the first comparative example, the single crystal epitaxial layer 133 is epitaxially grown on the single crystal SiC semiconductor substrate 132 bonded on the surface of the polycrystal SiC semiconductor substrate 131. To achieve the above, it has been necessary to bond the high quality single crystal SiC semiconductor substrate 132 on the polycrystal SiC semiconductor substrate 131 without defects. In addition, a certain cost is required for polishing processing to ensure the surface roughness necessary for the room-temperature junction and diffused junction. Further, the yield may decrease due to defects which occur at the junction interface between the polycrystal SiC semiconductor substrate 131 and the single crystal SiC semiconductor substrate 132.

Figure 9A:
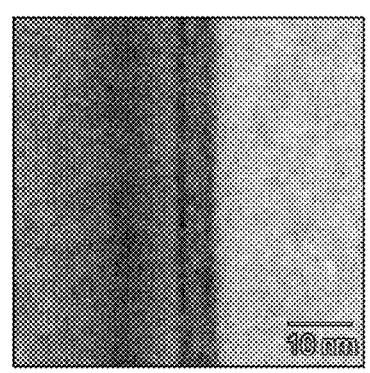
FIGS. 9A to 9D are TEM-EDX images of a junction surface of a semiconductor substrate of a comparative example.
Figure 9B:
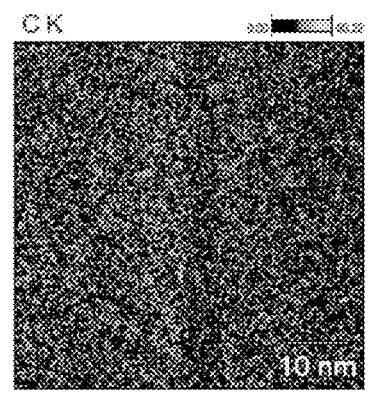
Figure 9C:
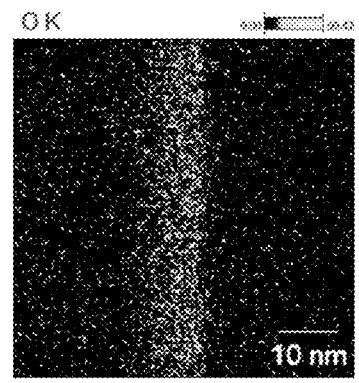
Figure 9D:
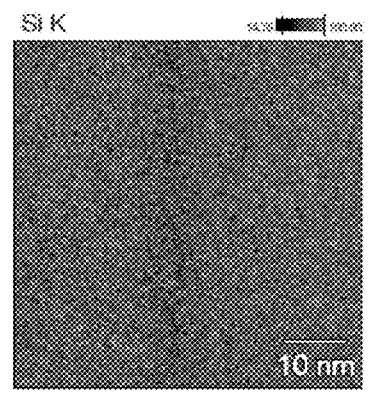

FIGS. 9A to 9D show TEM-EDX images obtained by observing the junction interface of Comparative Example 1 by using a transmission electron microscope and by means of energy dispersive X-ray spectroscopy (TEM-EDX). FIG. 9A shows a transmission electron microscope image, FIG. 9B is a K line image of C, FIG. 9C is a K line image of O, and FIG. 9D is a K line image of Si. The left side of each image in the drawing shows the polycrystal SiC semiconductor substrate 131 formed by means of CVD, and the right side of each image in the drawing shows the single crystal SiC semiconductor substrate 132 formed based on a sublimation method. It is found that an interface of an amorphous structure exists on the junction surface between the polycrystal SiC semiconductor substrate 131 and the single crystal SiC semiconductor substrate 132.

Referring back to FIGS. 8A to 8D, in a second comparative example, as shown in FIG. 8C, an epitaxially grown single crystal SiC semiconductor substrate 135 is bonded on the surface of a polycrystal SiC semiconductor substrate 134 by means of a room-temperature junction or diffused junction, the polycrystal SiC semiconductor substrate 134 being fabricated by means of sintering such as spark plasma sintering (SPS). In the second comparative example also, an interface with an amorphous structure exists on the junction surface between the polycrystal SiC semiconductor substrate 134 and the single crystal SiC semiconductor substrate 135.

In the second comparative example, the high-quality single crystal SiC semiconductor substrate 135 is directly joined to the low-quality polycrystal SiC semiconductor substrate 134. This eliminates material restrictions, and enables a cost reduction and the acquisition of desired physical properties. Meanwhile, a certain cost is required for polishing processing to ensure the surface roughness necessary for a room-temperature junction and diffused junction. Further, the yield may decrease due to defects which occur at the junction interface between the polycrystal SiC semiconductor substrate 134 and the single crystal SiC semiconductor substrate 135.

Second Embodiment

Figure 10A:
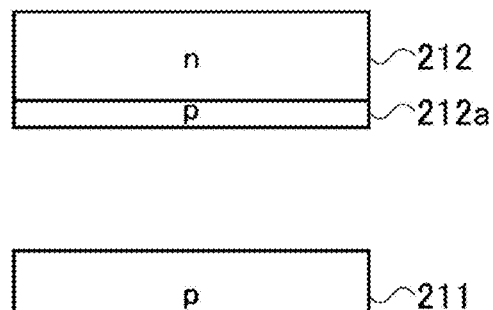
FIGS. 10A to 10C are flow diagrams for explaining a manufacturing method of a semiconductor substrate of a second embodiment.
Figure 10B:
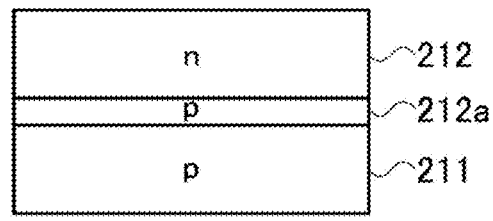
Figure 10C:
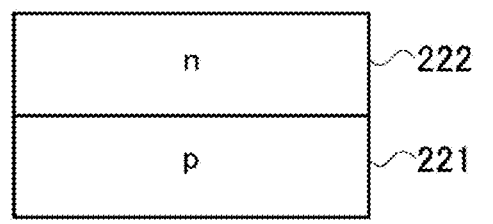

A semiconductor substrate, a semiconductor device, and manufacturing methods of the same according to a second embodiment will be described. FIGS. 10A to 10C is a flow diagram showing a manufacturing method of a semiconductor substrate of the second embodiment. As shown in FIG. 10A, a p-type SiC semiconductor substrate 211 is provided, and an n-type SiC semiconductor substrate 212 is provided.

The p-type SiC semiconductor substrate 211 which is a first substrate has a predetermined thickness and one surface as a junction surface. The p-type SiC semiconductor substrate 211 is a p-type SiC semiconductor in which a p-type impurity such as boron or aluminum is doped in SiC, and may be a single crystal or a polycrystal semiconductor substrate. The single crystal p-type SiC semiconductor substrate 211 may be formed based on an epitaxy method in which a single crystal epitaxial layer is grown on a base crystal. Further, a remote epitaxy method may be used in which graphene is formed on a base substrate and a single crystal epitaxial layer is grown with the graphene therebetween. In the remote epitaxy method, SiC and graphene are Van der Waals bonded. Therefore, the epitaxial layer can be easily removed from the base crystal. Further, the single crystal p-type SiC semiconductor substrate 211 may be formed by cutting an ingot of a single crystal p-type SiC semiconductor with a wire saw or the like to have a predetermined thickness. The polycrystal p-type SiC semiconductor substrate 211 may be formed by means of CVD or may be formed of a powder material by means of sintering such as a SPS (spark plasma sintering) method.

The n-type SiC semiconductor substrate 212 which is a second substrate has a predetermined thickness and one surface as a junction surface. The n-type SiC semiconductor substrate 212 is formed of a single crystal of an n-type SiC semiconductor in which an n-type impurity such as nitrogen or phosphorus is doped in SiC. The single crystal n-type SiC semiconductor substrate 212 may be formed based on an epitaxy method. Further, a remote epitaxy method may be used in which graphene is formed on a base substrate and a single crystal epitaxial layer is grown with the graphene therebetween. The single crystal n-type SiC semiconductor substrate 212 may be formed by cutting an ingot of a single crystal n-type SiC semiconductor with a wire saw or the like to have a predetermined thickness.

A p-type SiC semiconductor thin film 212a is formed on the n-type SiC semiconductor substrate 212, the p-type SiC semiconductor thin film 212a having a predetermined thickness and covering the junction surface of the n-type SiC semiconductor substrate 212. The p-type SiC semiconductor thin film 212a may have a thickness of 10 nm or more, for example. Like the p-type SiC semiconductor substrate 211, the p-type SiC semiconductor thin film 212a may be a single crystal thin film or a polycrystal thin film.

As shown in FIG. 10B, the n-type SiC semiconductor substrate 212 is stacked on the p-type SiC semiconductor substrate 211 such that the junction surface of the p-type SiC semiconductor substrate 211 faces and contacts with the junction surface of the n-type SiC semiconductor substrate 212. Then, the junction surface of the p-type SiC semiconductor substrate 211 and the junction surface of the n-type SiC semiconductor substrate 212 are joined with the p-type SiC semiconductor thin film 212a therebetween, the p-type SiC semiconductor thin film 212a covering the junction surface of the n-type SiC semiconductor substrate 212. The joining between the p-type SiC semiconductor substrate 211 and the n-type SiC semiconductor substrate 212 can be performed by means of several methods such as a room-temperature junction or diffused junction.

FIGS. 11A to 11D is a diagram for explaining the joining of a substrate by means of a room-temperature junction. As shown in FIG. 11A, a contaminant layer 261 is deposited on the junction surface of the p-type SiC semiconductor substrate 211. Also, a contaminant layer 262 is deposited on the junction surface of the n-type SiC semiconductor substrate 212. As shown in FIG. 11B, both of the junction surface of the p-type SiC semiconductor substrate 211 on which the contaminant layer 261 is deposited and the junction surface of the n-type SiC semiconductor substrate 212 on which the contaminant layer 262 is deposited are irradiated with ion beams emitted from ion beam generators 263 to perform etching. As shown in FIG. 11C, both of the contaminant layer 261 deposited on the junction surface of the p-type SiC semiconductor substrate 211 and the contaminant layer 262 deposited on the junction surface of the n-type SiC semiconductor substrate 212 are removed by means of etching, and the junction surface of the p-type SiC semiconductor substrate 211 and the junction surface of the n-type SiC semiconductor substrate 212 are cleaned and smoothed at an atomic level. Both of the junction surface of the p-type SiC semiconductor substrate 211 and the junction surface of the n-type SiC semiconductor substrate 212 are activated. Atoms having bonds 211b of p-type SiC are exposed from the junction surface of the p-type SiC semiconductor substrate 211. Atoms having bonds 212b of p-type SiC of the p-type SiC semiconductor thin film 212a, which covers the junction surface of the n-type SiC semiconductor substrate 212, are exposed from the junction surface of the n-type SiC semiconductor substrate 212. As shown in FIG. 11D, suppose that the junction surface of the p-type SiC semiconductor substrate 211 and the junction surface of the n-type SiC semiconductor substrate 212, which have been activated as shown in FIG. 11C, are brought into contact at room temperature. In the above case, the p-type SiC semiconductor substrate 211 and the n-type SiC semiconductor substrate 212 are joined and integrated.

In a room-temperature junction as shown in FIGS. 11A to 11D, the p-type SiC semiconductor substrate 211 and the n-type SiC semiconductor substrate 212 can be joined without increasing the temperature. Therefore, the p-type SiC semiconductor substrate 211 and the n-type SiC semiconductor substrate 212 are not degraded by heat, and a semiconductor substrate having high crystallinity and low resistance can be formed.

Figure 12:
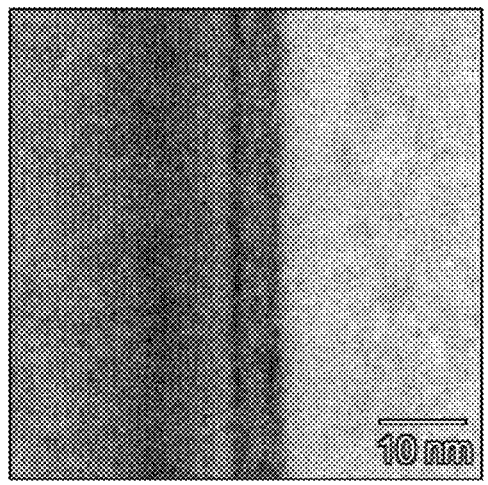
FIG. 12 is a photomicrograph of a cross section of a junction of a semiconductor substrate.

FIG. 12 is a photomicrograph showing a junction of a substrate. In the drawing, it can be seen that the p-type SiC semiconductor substrate 211 on the left side and the n-type SiC semiconductor substrate 212 on the right side are joined to each other with the p-type SiC semiconductor thin film 212a in the center therebetween. Such a structure of a junction can be similarly obtained by means of joining based on the following other methods.

Figure 13:
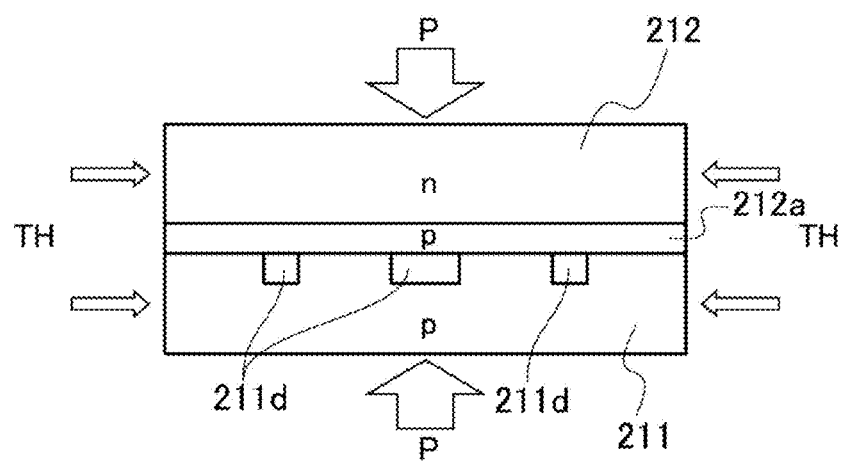
FIG. 13 is a diagram for explaining the joining of semiconductor substrates by means of a diffused junction.

FIG. 13 is a diagram for explaining a diffused junction. The n-type SiC semiconductor substrate 212 is stacked on the p-type SiC semiconductor substrate 211 such that the junction surface of the n-type SiC semiconductor substrate 212 is brought into contact with the junction surface of the p-type SiC semiconductor substrate 211. The junction surface of the p-type SiC semiconductor substrate 211 is in contact with the junction surface of the n-type SiC semiconductor substrate 212 with the p-type SiC semiconductor thin film 212a therebetween, the p-type SiC semiconductor thin film 212a covering the junction surface of the n-type SiC semiconductor substrate 212. The junction surface of the p-type SiC semiconductor substrate 211 has voids 211d. The p-type SiC semiconductor substrate 211 and the n-type SiC semiconductor substrate 212, which have been stacked in this manner, are heated and pressurized to be diffusion-joined. In the drawing, the direction of heating is indicated by arrows TH, and the direction of pressurization is indicated by arrows P.

Figure 14A:
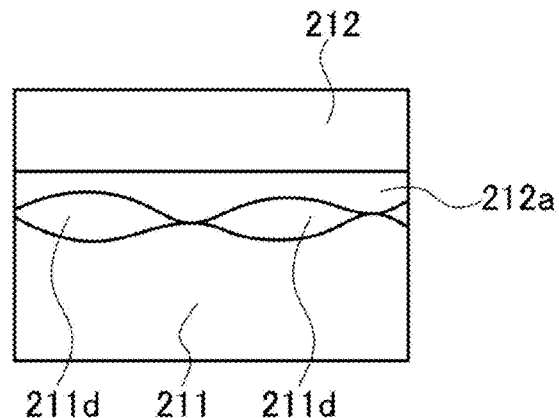
FIGS. 14A to 14C are diagrams for further explaining the joining of semiconductor substrates by means of a diffused junction.
Figure 14B:
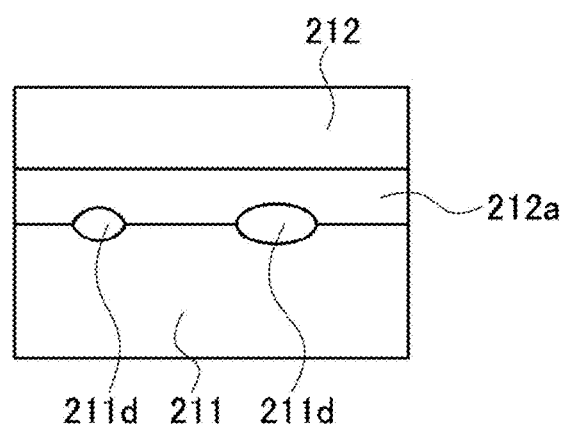
Figure 14C:
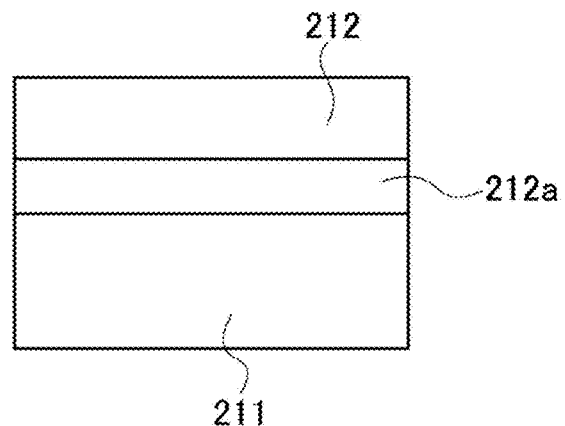

FIGS. 14A to 14C are diagram for further explaining the diffused junction. FIGS. 14A to 14C shows a change in the vicinity of an interface where the junction surface of the p-type SiC semiconductor substrate 211 and the junction surface of the n-type SiC semiconductor substrate 212 contact each other in the diffused junction shown in FIG. 13. As shown in FIG. 14A, the junction surface of the p-type SiC semiconductor substrate 211 is in contact with the junction surface of the n-type SiC semiconductor substrate 212 with the p-type SiC semiconductor thin film 212a therebetween, the p-type SiC semiconductor thin film 212a covering the junction surface of the n-type SiC semiconductor substrate 212. The voids 211d are formed between the junction surface of the p-type SiC semiconductor substrate 211 and the p-type SiC semiconductor thin film 212a, which covers the junction surface of the n-type SiC semiconductor substrate 212. As shown in FIG. 14B, the voids 211d are gradually reduced in size by means of heating and pressurization. As shown in FIG. 14C, atomic diffusion occurs at the interface between the junction surface of the p-type SiC semiconductor substrate 211 and the p-type SiC semiconductor thin film 212a, which covers the junction surface of the n-type SiC semiconductor substrate 212. Due to the atomic diffusion, the p-type SiC semiconductor substrate 211 and the n-type SiC semiconductor substrate 212 are joined and integrated with each other, and the voids 211d also disappear.

In the diffused junction as shown in FIGS. 14A to 14C, the p-type SiC semiconductor substrate 211 and the n-type SiC semiconductor substrate 212 are joined by pressurizing and heating them to diffuse atoms in the junction surface. In the diffused junction, the voids 211d of the junction surface disappear as the joining progresses. The junction surfaces of the p-type SiC semiconductor substrate 211 and the n-type SiC semiconductor substrate 212 are reliably joined with each other by the diffusion of atoms.

Figure 15A:
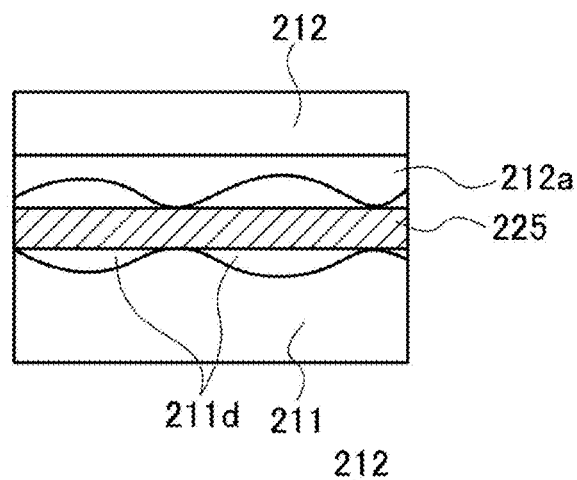
FIGS. 15A to 15C are diagrams for explaining the joining of semiconductor substrates by means of a diffused junction by using insert metal.
Figure 15B:
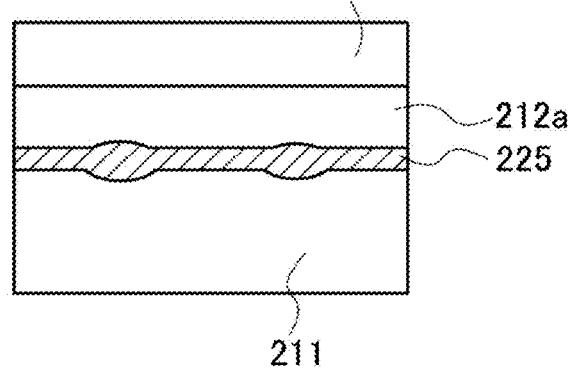
Figure 15C:
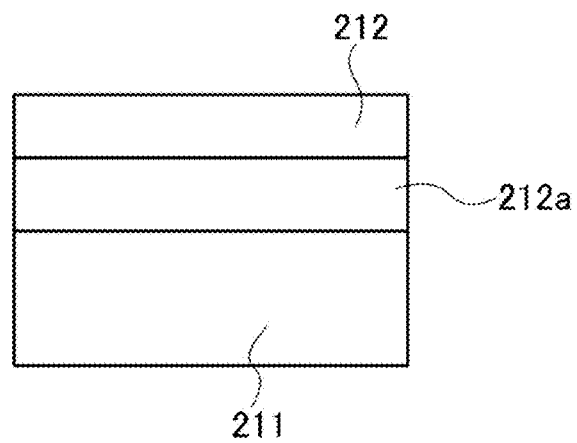

FIGS. 15A to 15C is a diagram for explaining a diffused junction using an insert metal. If an insert metal is used, a metal such as Ni or Al is formed on the junction surface of the p-type SiC semiconductor substrate 211 or the junction surface of the n-type SiC semiconductor substrate 212 covered with the p-type SiC semiconductor thin film 212a. This kind of p-type SiC semiconductor substrate 211 and n-type SiC semiconductor substrate 212 are heated and pressurized as shown in FIG. 13. As shown in FIG. 15A, the junction surface of the p-type SiC semiconductor substrate 211 and the junction surface of the n-type SiC semiconductor substrate 212 covered with the p-type SiC semiconductor thin film 212a are in contact with each other with a layer of an insert metal 225 therebetween. As shown in FIG. 15B, the insert metal 225 fills the voids 111d reduced in size by heating and pressurization. As shown in FIG. 15C, the insert metal 225 is at an atomic level diffused and absorbed in the junction surface of the p-type SiC semiconductor substrate 211 and the p-type SiC semiconductor thin film 212a, which covers the junction surface of the n-type SiC semiconductor substrate 212. Accordingly, the p-type SiC semiconductor substrate 211 and the n-type SiC semiconductor substrate 212 are joined and integrated. In a diffused junction using this kind of insert metal, in a state where the substrate is heated and pressurized as shown in FIG. 15B, a diffused junction in which the insert metal 225 is in a solid phase is called a solid phase diffused junction, and a diffused junction in which the insert metal 225 is in a liquid phase is called a liquid phase diffused junction.

In a diffused junction using the insert metal as shown in FIGS. 15A to 15C, the p-type SiC semiconductor substrate 211 and the n-type SiC semiconductor substrate 212 of which junction surfaces are arranged with the insert metal being interposed therebetween are pressurized and heated. Then, the voids 211d of the junction surface are filled with a solid phase or liquid phase insert metal, and thereafter atoms of the junction surface are diffused to join the p-type SiC semiconductor substrate 211 with the n-type SiC semiconductor substrate 212. A diffused junction using the insert metal may enable the joining between the p-type SiC semiconductor substrate 211 and the n-type SiC semiconductor substrate 212, even if the joining is difficult by means of a usual diffused junction.

Referring again to FIGS. 10A to 10C, in FIG. 10C, the p-type SiC semiconductor substrate 211 and the n-type SiC semiconductor substrate 212 are joined and integrated to form a single semiconductor substrate 210. In the semiconductor substrate 210, a portion corresponding to the p-type SiC semiconductor substrate 211 constitutes a lower p-type SiC semiconductor layer 221. A portion corresponding to the n-type SiC semiconductor substrate 212 constitutes an upper n-type SiC semiconductor layer 222. The p-type SiC semiconductor thin film 212a, which covered the junction surface of the n-type SiC semiconductor substrate 212, is absorbed in the lower p-type SiC semiconductor layer 221, which is the portion corresponding to the p-type SiC semiconductor substrate 211.

In the second embodiment, the p-type SiC semiconductor substrate 211 and the n-type SiC semiconductor substrate 212 are separately prepared and joined to form a single semiconductor substrate 220. In the semiconductor substrate 220, a portion corresponding to the p-type SiC semiconductor substrate 211 constitutes the lower p-type SiC semiconductor layer 221. A portion corresponding to the n-type SiC semiconductor substrate 212 constitutes the upper n-type SiC semiconductor layer 222. Therefore, the semiconductor substrate 220 can be applied to an n-channel IGBT in which the p-type SiC semiconductor layer 221 is a p-type substrate layer and the n-type SiC semiconductor layer 222 is an n-type drift layer.

In the semiconductor substrate 220 of the second embodiment, the p-type SiC semiconductor substrate 211 and the n-type SiC semiconductor substrate 212 are separately prepared and joined. Therefore, both of the p-type SiC semiconductor substrate 211 and the n-type SiC semiconductor substrate 212 can be set to have characteristics such as desired crystallinity and resistance. The n-type SiC semiconductor substrate 212 can be set to have high crystallinity, for example. Further, the p-type SiC semiconductor substrate 211 does not need to serve as a base for growing the n-type SiC semiconductor substrate 212 by means of an epitaxy method. Therefore, the p-type SiC semiconductor substrate 211 may have reduced crystallinity, and the doping amount may be increased to ensure the mobility.

In the second embodiment, it is enough if the p-type SiC semiconductor substrate 211 and the n-type SiC semiconductor substrate 212 are separately prepared and joined. Therefore, the manufacturing man-hours are low, the manufacturing throughput is large, and the cost is low, and the semiconductor substrate is suitable for mass production.

Figure 16A:
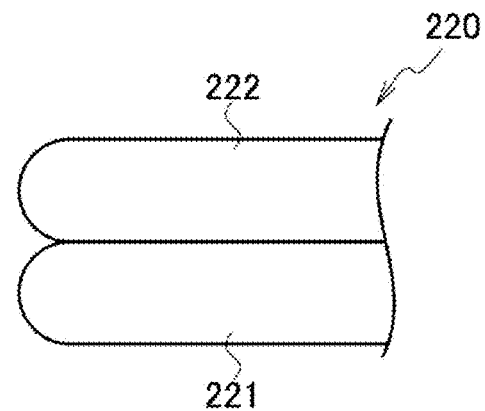
FIGS. 16A to 16D are cross sectional views for explaining terrace processing of a semiconductor substrate.

FIGS. 16A to 16D are diagrams for explaining terrace processing of the semiconductor substrate 220. FIG. 16A shows the end face of the semiconductor substrate 220 manufactured by means of the series of steps shown in FIG. 10. In the semiconductor substrate 220, the lower p-type SiC semiconductor layer 221, which is a portion corresponding to the p-type SiC semiconductor substrate 211, and the upper n-type SiC semiconductor layer 222, which is a portion corresponding to the n-type SiC semiconductor substrate 212, form radially protruding edges at peripheries thereof.

Figure 16B:
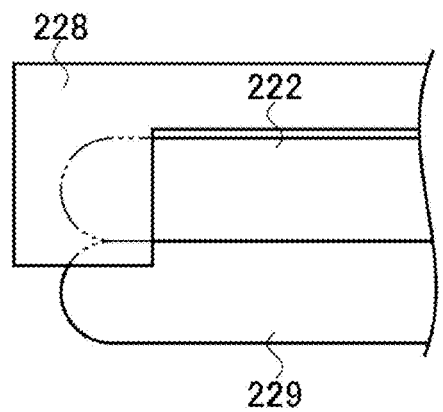
Figure 16C:
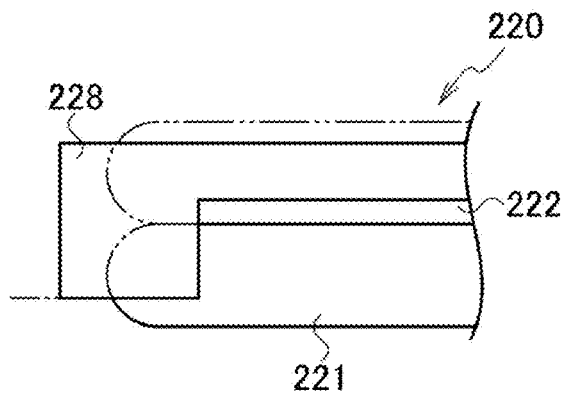
Figure 16D:
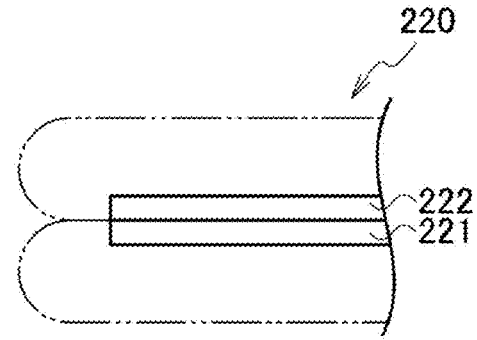

In terrace processing, as shown in FIG. 16B, portions up to a predetermined distance from the peripheries of the n-type SiC semiconductor layer 222 and the p-type SiC semiconductor layer 221 are polished with a grinding wheel 228 to a depth from the upper surface of the n-type SiC semiconductor layer 222 to a position lower than the lower surface of the n-type SiC semiconductor layer 222. Accordingly, the semiconductor substrate is chamfered in the peripheral direction to be processed into a terrace shape. The grinding wheel 228 has a shape capable of chamfering the upper surface simultaneously with chamfering the periphery of the semiconductor substrate 220. Subsequently, as shown in FIG. 16C, the peripheral portion is further polished downward by the grinding wheel to advance the chamfering of the semiconductor substrate in the peripheral direction. At the same time, the n-type SiC semiconductor layer 222 is polished downward from the upper surface of the n-type SiC semiconductor layer 222 until the n-type SiC semiconductor layer 222 has a predetermined thickness by using another portion of the grinding wheel to chamfer the upper surface. Finally, as shown in FIG. 16D, the p-type SiC semiconductor layer 221 is polished upward from the lower surface of the p-type SiC semiconductor layer 221 until the p-type SiC semiconductor layer 221 has a predetermined thickness by using another type of grinding wheel to chamfer the lower surface.

In the terrace processing shown in FIGS. 16A to 16D, the periphery of the semiconductor substrate 220 is chamfered simultaneously with the chamfering of the upper surface of the semiconductor substrate 220. Therefore, it is not necessary to provide another process for chamfering the periphery, and the periphery of the semiconductor substrate 220 can be reliably chamfered. By chamfering the periphery of the semiconductor substrate 220, the edge of the periphery is prevented from being cracked and generating dust.

Figure 17:
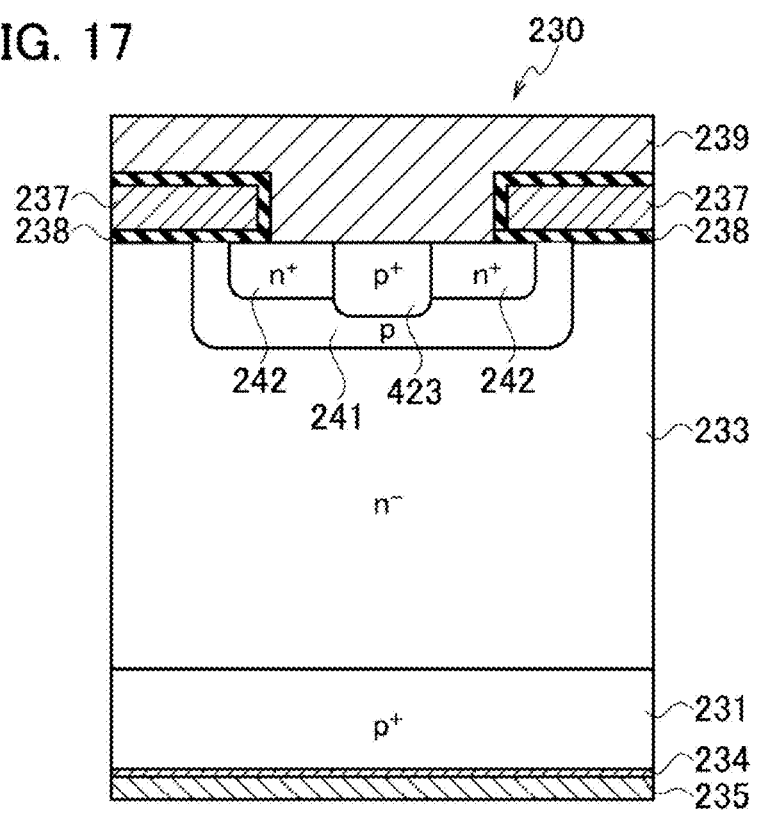
FIG. 17 is a cross sectional view showing an n-channel IGBT to which a semiconductor substrate of a second embodiment is applied.

FIG. 17 is a cross sectional view showing an n-channel IGBT 230 to which the semiconductor substrate 220 of the second embodiment is applied. In the IGBT 230, the p-type SiC semiconductor layer 221 of the semiconductor substrate 220 constitutes a (p+)-type substrate layer 231. The n-type SiC semiconductor layer 222 of the semiconductor substrate 220 constitutes an (n−)-type drift layer 233. The "(p+)-type" indicates that a p-type impurity is doped at a higher concentration than other p-type regions. The "(n−)-type" indicates that an n-type impurity is doped at a lower concentration than other n-type regions. The same will apply hereinafter.

In the IGBT 230, a drain electrode 235, a metal silicide 234, a (p+)-type substrate layer 231, and an (n−)-type drift layer 233 are laminated in this order. A well p-type channel region 241, (n+)-type emitter regions 242, and a (p+)-type channel connection region 243 are formed on the surface of the (n−)-type drift layer 233. Gate electrodes 237 covered with gate insulating films 238 are arranged so as to straddle the (n+)-type emitter regions 242 at a portion where the (n−)-type drift layer 233 reaches the surface. An interlayer insulating film 239 is laminated so as to cover the (n+)-type emitter regions 242 and the (p+)-type channel connection region 243 on the surface of the (n−)-type drift layer and the gate electrodes 237.

The IGBT 230 of the second embodiment is formed on the semiconductor substrate 220, which is formed by separately preparing and joining the p-type SiC semiconductor substrate 211 and the n-type SiC semiconductor substrate 212 as shown in FIGS. 10A to 10C. Therefore, both of the (p+)-type substrate layer 231 corresponding to the p-type SiC semiconductor substrate 211 and the (n−)-type drift layer corresponding to the n-type SiC semiconductor substrate 212 can be set to have characteristics such as desired crystallinity and resistance.

The semiconductor substrate 220 on which the IGBT 230 of the second embodiment is formed can be manufactured at a high throughput and low-cost. Therefore, the IGBT 230 formed on this kind of semiconductor substrate 220 can also be manufactured at a low-cost.

Figure 18:
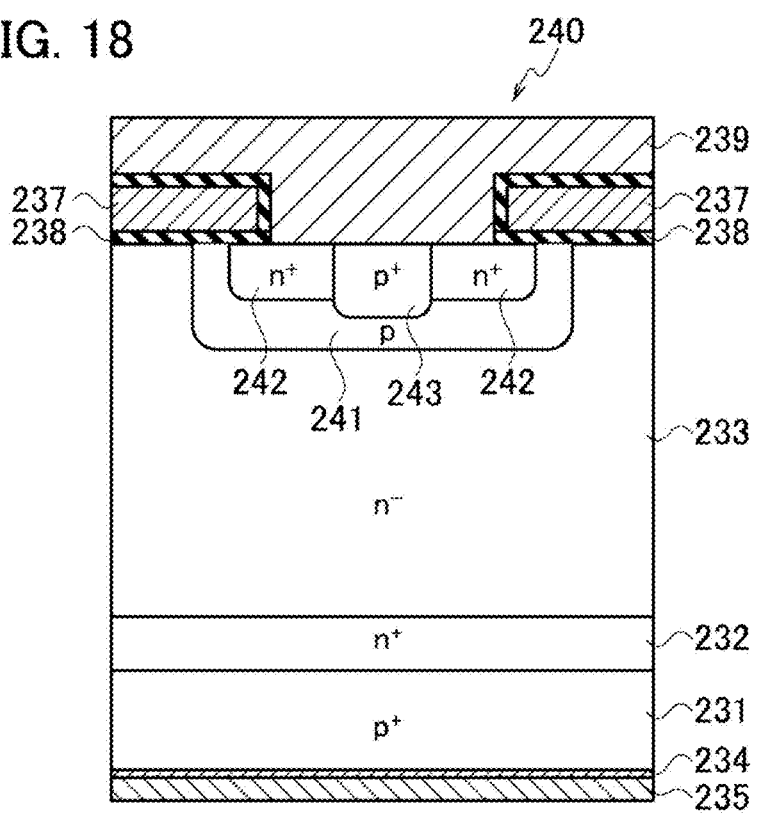
FIG. 18 is a cross sectional view showing an n-channel IGBT of Modified Example 1.

FIG. 18 is a cross sectional view showing an n-channel IGBT 240 of Modified Example 1. The IGBT 240 of Modified Example 1 differs from the IGBT 230 shown in FIG. 17 in that an (n+)-type buffer layer 232 is added between the (p+)-type substrate layer 231 and the (n−)-type drift layer 233. That is, in the IGBT 240 of Modified Example 1, the drain electrode 235, the metal silicide 234, the (p+)-type substrate layer 231, the (n+)-type buffer layer, and the (n−)-type drift layer 233 are laminated in this order. Other configurations are the same as those of the IGBT shown in FIG. 17. Therefore, the common components are denoted by the same reference numerals and the description thereof will be omitted.

The (n+)-type buffer layer 232 added in the IGBT 240 of Modified Example 1 can be fabricated by depositing an epitaxial layer such that an (n−)-type layer corresponding to the (n−)-type drift layer 233 is formed on an (n+)-type layer corresponding to the (n+)-type buffer layer 232 when the n-type SiC semiconductor substrate 212 is formed by means of an epitaxy method, for example. The n-type SiC semiconductor substrate 212 on which the (n+)-type layer and the (n−)-type layer are laminated constitutes the upper n-type SiC semiconductor layer 222 of the semiconductor substrate 220 by being joined to the p-type SiC semiconductor substrate 211 as shown in FIG. 10C. The n-type SiC semiconductor layer 222 of the semiconductor substrate 220 corresponds to the (n+)-type buffer layer 232 and the (n−)-type drift layer 233.

In the IGBT 240 of Modified Example 1, the recombination of holes and electrons is promoted by the (n+)-type buffer layer 232 provided under the (n−)-type drift layer 233. The number of holes reaching the interface between the (n+)-type buffer layer 232 and the (p+)-type substrate layer 231 is reduced. This suppresses a basal plane dislocation (BPD) due to the energy of the recombination of holes and electrons at the interface from growing from a line defect to a stacking fault which is a surface defect. Therefore, the increase in the resistance due to the growth of the stacking fault and the increase in a forward voltage Vf of the body diode are also suppressed.

Figure 19:
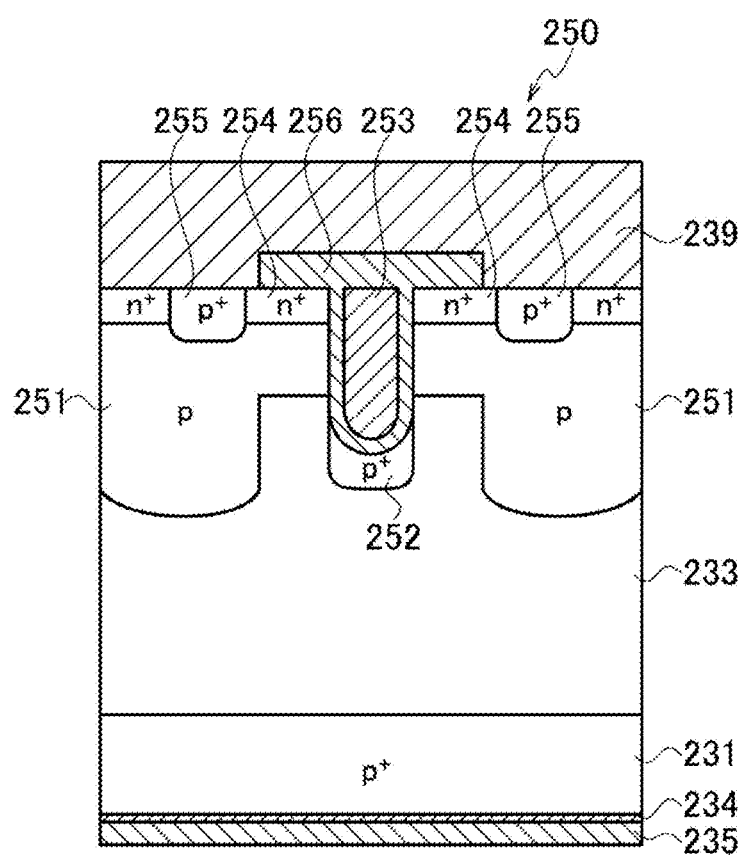
FIG. 19 is a cross sectional view showing an n-channel IGBT of Modified Example 2.

FIG. 19 is a cross sectional view showing an n-channel IGBT 250 of Modified Example 2. The IGBT 250 of Modified Example 2 differs from the IGBT shown in FIG. 17 in that a gate electrode 253 has a trench type structure. Components common to those of the IGBT 230 shown in FIG. 17 are denoted by the same reference numerals, and the description thereof will be omitted.

In the IGBT 250, a drain electrode 235, a metal silicide 234, a (p+)-type substrate layer 231, and an (n−)-type drift layer 233 are laminated in this order. In an upper portion of the (n−)-type drift layer 233, p bases 251 are formed to a predetermined depth from the surface. On the surfaces of the p bases 251, (n+)-type emitter regions 254 and (p+)-type channel connection regions 255 are formed. A trench type gate electrode 253 covered with a gate insulating film 256 is formed so as to pass through the (n+)-type emitter regions 254 and the p bases 251 from the surface at a shallow portion of the p bases 251. A (p+)-type shielding region 252 is formed immediately below the gate electrode 253. An interlayer insulating film 239 is laminated so as to cover the (n+)-type emitter regions 254, the (p+)-type channel connection regions 255, and the gate insulating film 256.

The IGBT 250 of Modified Example 2 has a gate electrode with a trench type structure. Therefore, the channel density can be enhanced, and since there is no resistance due to a planar JFET, the on-voltage is also reduced.

FIGS. 20A and 20B are flow diagrams showing a manufacturing method of a semiconductor substrate of Comparative Example 1. The manufacturing method of Comparative Example 1 is different from the manufacturing method of the semiconductor substrate of the second embodiment. The difference resides in that while a p-type SiC semiconductor substrate and an n-type SiC semiconductor substrate are joined in the manufacturing method of the second embodiment, an n-type SiC semiconductor substrate and an n-type SiC semiconductor substrate are joined in the manufacturing method of Comparative Example 1. In FIG. 20A, a first n-type SiC semiconductor substrate 271 having one surface as a junction surface and a second n-type SiC semiconductor substrate 272 having one surface as a junction surface are provided. The first n-type SiC semiconductor substrate 271 and the second n-type SiC semiconductor substrate 272 may be single crystal or polycrystal semiconductor substrates. The single crystal may be an epitaxial crystal or one obtained by cutting an ingot of a single crystal. The polycrystal may be formed by means of CVD or may be a sintered compact.

In FIG. 20B, the first n-type SiC semiconductor substrate 271 and the second n-type SiC semiconductor substrate 272 are stacked such that their junction surfaces face each other and contact each other. The junction surface of the first n-type SiC semiconductor substrate 271 and the junction surface of the second n-type SiC semiconductor substrate 272 are joined and integrated to form a substrate. The joining between the first n-type SiC semiconductor substrate 271 and the second n-type SiC semiconductor substrate 272 may be performed by means of a room-temperature junction or diffused junction. The diffused junction may be a solid phase diffused junction or a liquid phase diffused junction with an insert metal being disposed between substrates. The first n-type SiC semiconductor substrate 271 and the second n-type SiC semiconductor substrate 272 are joined and integrated to form a single n-type SiC semiconductor substrate 270.

FIGS. 21A and 21B are flow diagrams showing a manufacturing method of a semiconductor substrate of Comparative Example 2. The manufacturing method of Comparative Example 2 is different from the manufacturing method of the semiconductor substrate of the second embodiment. The difference resides in that while a p-type SiC semiconductor thin film is not formed so as to cover a junction surface of an n-type SiC semiconductor substrate in the manufacturing method of Comparative Example 2, the p-type SiC semiconductor thin film 212a is formed so as to cover the junction surface of the n-type SiC semiconductor substrate 212 in the manufacturing method of the second embodiment. In FIG. 21A, a p-type SiC semiconductor substrate 273 having one surface as a junction surface and an n-type SiC semiconductor substrate 274 having one surface as a junction surface are provided. The p-type SiC semiconductor substrate 273 may be a single crystal or a polycrystal semiconductor substrate. The n-type SiC semiconductor substrate 274 is a single crystal semiconductor substrate. The single crystal may be an epitaxial crystal or one obtained by cutting an ingot of a single crystal. The polycrystal may be formed by means of CVD or may be a sintered compact.

In FIG. 21B, the n-type SiC semiconductor substrate 274 is stacked on the p-type SiC semiconductor substrate 273 such that their junction surfaces face each other and contact each other. The junction surface of the p-type SiC semiconductor substrate 273 and the junction surface of the n-type SiC semiconductor substrate 274 are joined and integrated to form a substrate. The joining between the p-type SiC semiconductor substrate 273 and the n-type SiC semiconductor substrate 274 may be performed by means of a room-temperature junction or diffused junction. The diffused junction may be a solid phase diffused junction or a liquid phase diffused junction with an insert metal being interposed between the substrates. The p-type SiC semiconductor substrate 273 and the n-type SiC semiconductor substrate 274 are joined and integrated to form a single semiconductor substrate 280. In the semiconductor substrate 280, a portion corresponding to the p-type SiC semiconductor substrate 273 constitutes a lower p-type SiC semiconductor layer 283. A portion corresponding to the n-type SiC semiconductor substrate 274 constitutes an upper n-type SiC semiconductor layer 282.

In the semiconductor substrate 280 of Comparative Example 2, a defect level may occur at a junction interface between the p-type SiC semiconductor layer 283 and the n-type SiC semiconductor layer 282. Therefore, in the semiconductor substrate 280 of Comparative Example 2, a leak current derived from a defect level may occur, and the electrical characteristics may deteriorate.

Third Embodiment

Next, a third embodiment will be described. In the drawings described below, the same or similar portions are denoted by the same or similar reference numerals. It should be noted, however, that the drawings are schematic and that the relationships between the thickness of each component and the plane dimensions are different from those in reality. Therefore, the specific thickness and dimensions should be determined in consideration of the following description. In addition, it is needless to say that the drawings include parts having different dimensional relationships and ratios.

Further, the third embodiment shown below exemplifies a device or method for embodying a technical concept, and does not specify the material, shape, structure, arrangement, and the like of each component. Various changes may be made to the third embodiment in the scope of claims.

Polycrystal Silicon Carbide Substrate

A polycrystal silicon carbide substrate 310 according to a third embodiment contains at least one of germanium (Ge) and tin (Sn), and further contains a dopant of at least one selected from nitrogen (N), phosphorus (P), and boron (B).

The relative density of the polycrystal silicon carbide substrate 310 may be 99% or more.

"S. A. Reshanov et al., Diamond and Related Materials 10 (2001), 1278-1282" discloses that, if only a dopant is doped in a polycrystal silicon carbide substrate, in the process of recrystallization of the silicon carbide during sintering, a C site in a single crystal grain is replaced by N as a dopant or a Si site is replaced by P and B as dopants. In the above case, the nearest neighbor bond length of a dopant is shortened and lattice distortion occurs.

Suppose that these dopants are doped at a high-concentration in order to reduce the resistivity of the polycrystal silicon carbide substrate. In the above case, there is a risk that a mismatch of the lattice constant may be caused and hole defects may easily occur in crystal grains. Further, there is a risk of unnecessary microcrystallization and amorphization. Especially, when the concentration of a dopant is set to be high, these phenomena appear to a remarkable degree and there is a risk that the density of the entire sintered compact may decrease.

Meanwhile, the polycrystal silicon carbide substrate 310 according to the third embodiment contains a dopant selected from N, P, and B added thereto to reduce resistivity, and further contains at least one of Ge and Sn.

Accordingly, a Si site in a single crystal grain formed during sintering is replaced by Ge or Sn, the nearest neighbor bond length of Ge or Sn increases, and lattice mismatch in a SiC crystal caused by addition of a dopant can be reduced. As a result, the density of the entire sintered compact is increased, and the mechanical strength of the polycrystal silicon carbide substrate can be enhanced.

Manufacturing Process

The polycrystal silicon carbide substrate 310 according to the third embodiment may be manufactured by means of a pressure sintering method or a chemical vapor deposition (CVD) method. Examples of the pressure sintering method include a hot press sintering method, a hot isostatic pressure sintering method, and a spark plasma sintering method. However, the spark plasma sintering method is preferable because of the stability of the process and because a sintering additive is not necessary.

Figure 22:
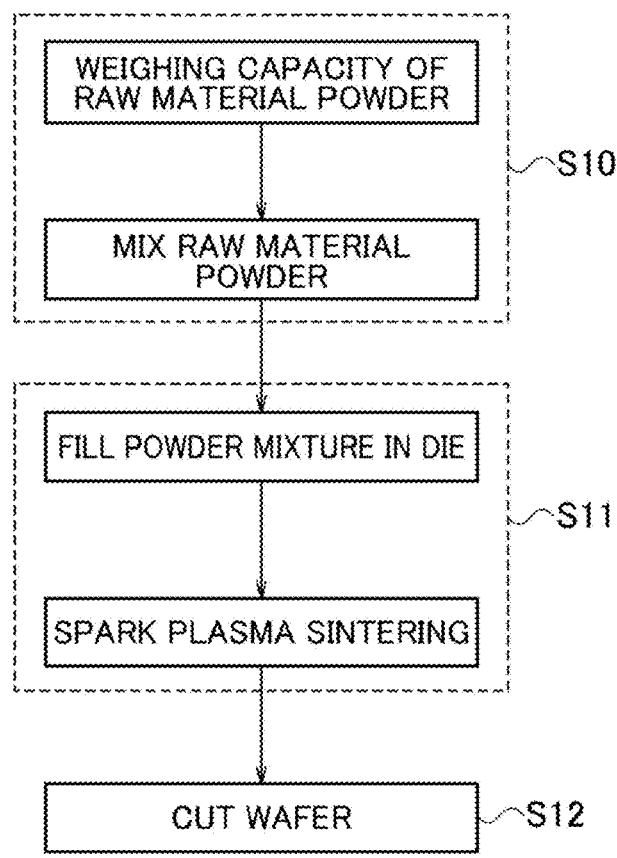
FIG. 22 is a flow diagram showing a manufacturing method when a polycrystal silicon carbide substrate according to a third embodiment is manufactured by means of a spark plasma sintering method.
Figure 23A:
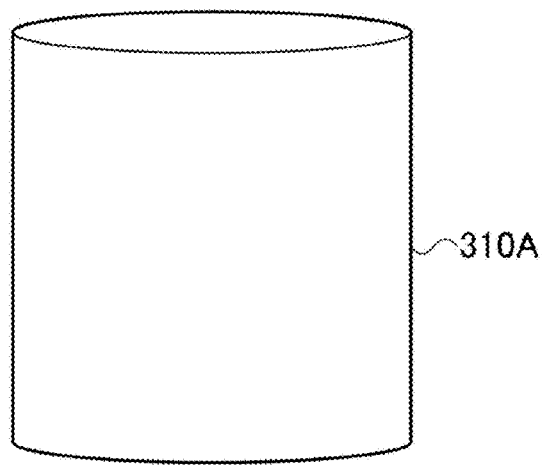
FIGS. 23A and 23B are schematic bird's-eye views showing a process for manufacturing a polycrystal silicon carbide substrate according to a third embodiment.
Figure 23B:
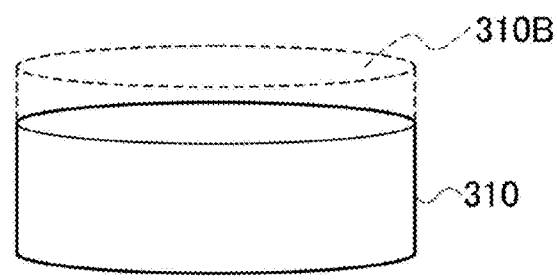

Polycrystal Silicon Carbide Substrate 310 by Means of Spark Plasma Sintering Method FIG. 22 is a flow diagram showing a manufacturing method of the polycrystal silicon carbide substrate 310 according to the third embodiment by means of a spark plasma sintering method. FIGS. 23A and 23B are schematic bird's-eye views showing a manufacturing process of the polycrystal silicon carbide substrate 310 according to the third embodiment. FIG. 23A is a process drawing showing that a polycrystal silicon carbide ingot 310A is prepared, cut, and polished to form a plurality of polycrystal silicon carbide bare wafers. FIG. 23B is a process drawing showing that the polycrystal silicon carbide substrate 310 is formed by removing a cut surface of the polycrystal silicon carbide bare wafer after machining.

In a manufacturing method of a polycrystal silicon carbide substrate by means of a spark plasma sintering method, at least two kinds of either one or both of a compound of group IV-V elements and a compound of group III-IV elements are blended into a powder of silicon carbide (SiC) which is the main material. The silicon carbide powder in which the compound of group IV-V elements and the compound of group III-IV elements are blended is mixed to prepare a mixed powder having an average particle diameter of 100 nm or less (step S10).

Next, a desired amount of the mixed powder is filled into a desired sintering die (die). The polycrystal silicon carbide ingot 310A is obtained by spark plasma sintering the mixed powder filled in the sintering die (step S11).

Next, the polycrystal silicon carbide ingot 310A is cut to form the polycrystal silicon carbide substrate 310 (step S12).

The compound of the group IV-V elements blended in the silicon carbide powder may be at least one or more kinds of materials selected from the group consisting of $Si_3N_4$, $Ge_3N_4$, and $Sn_3N_4$.

The compound of the group III-IV elements blended in the silicon carbide powder may be at least one or more kinds of materials selected from the group consisting of $B_4C$ and $SiB_4$.

In the above described manufacturing method, the polycrystal silicon carbide substrate 310 is cut after creating the polycrystal silicon carbide ingot 310A. However, the method of creating a wafer is not limited to this. For example, a sintered compact can be manufactured to have a desired wafer shape by appropriately selecting the shape of a sintering die and the amount of mixed powder to be filled during manufacturing.

The polycrystal silicon carbide ingot 310A before cutting the polycrystal silicon carbide substrate 310 contains at least one of germanium and tin, and further contains a dopant of at least one selected from nitrogen, phosphorus, and boron.

In the polycrystal silicon carbide ingot 310A, the size of a crystallite contained in a crystal particle of the polycrystal silicon carbide may be 100 nm or less. Further, the relative density may be 99% or more. The average size of the crystallite in the sintered compact is obtained by observing and measuring the microstructure by using SEM, EBSD, and TEM.

Suppose that the polycrystal silicon carbide ingot 310A is cut to form the polycrystal silicon carbide substrate 310. In the above case, first, as shown in FIG. 23A, a plurality of silicon carbide bare wafers are cut from the polycrystal silicon carbide ingot 310A. Next, a cut surface 310B of the silicon carbide bare wafer is polished by means of machining such as lapping.

Next, as shown in FIG. 23B, about 500 nm or more of the cut surface 310B is removed from the silicon carbide bare wafer, for example. The cut surface can be removed by means of a chemical mechanical polishing (CMP) technique, a plasma etching technique, or the like, for example. Preferably, the cut surface is removed by means of plasma etching. Since SiC is a very hard material, it takes a relatively long time if 500 nm or more of the cut surface is removed by means of low-damage CMP. However, if plasma etching is adopted, the cut surface can be removed in a short time of about 20 minutes. Further, due to improvements in polishing techniques, even if CMP is adopted, a damaged layer can be removed in about 20 minutes per layer, and therefore CMP can be appropriately selected. Meanwhile, since the silicon carbide is very hard, if plasma etching is adopted for removing the cut surface 310B of the silicon carbide bare wafer, damage is minor. Due to the above described removing step, the damaged layer of the cut surface 310B of the silicon carbide bare wafer caused by the machining after cutting is sufficiently removed. Accordingly, the polycrystal silicon carbide substrate 310 with a thickness of, for example, about 200 μm to about 500 μm can be obtained.

The average size of a crystallite contained in a crystal particle of the manufactured polycrystal silicon carbide substrate 310 may be 100 nm or less. If the average size of a crystallite contained in a crystal particle of the polycrystal silicon carbide substrate 310 is 100 nm or less, it is possible to effectively suppress the reduction of the relative density of a sintered compact due to a coarse crystal structure which occurs in the process of creating a sintered compact by means of a spark plasma sintering method.

The concentration of Ge contained in the manufactured polycrystal silicon carbide substrate 310 may be more than 0 ppm and 1000 ppm or less. In the polycrystal silicon carbide substrate 310 manufactured by means of SPS, the composition of the mixed powder can be easily controlled. Therefore, a dopant can be easily doped at a high-concentration.

Figure 24:
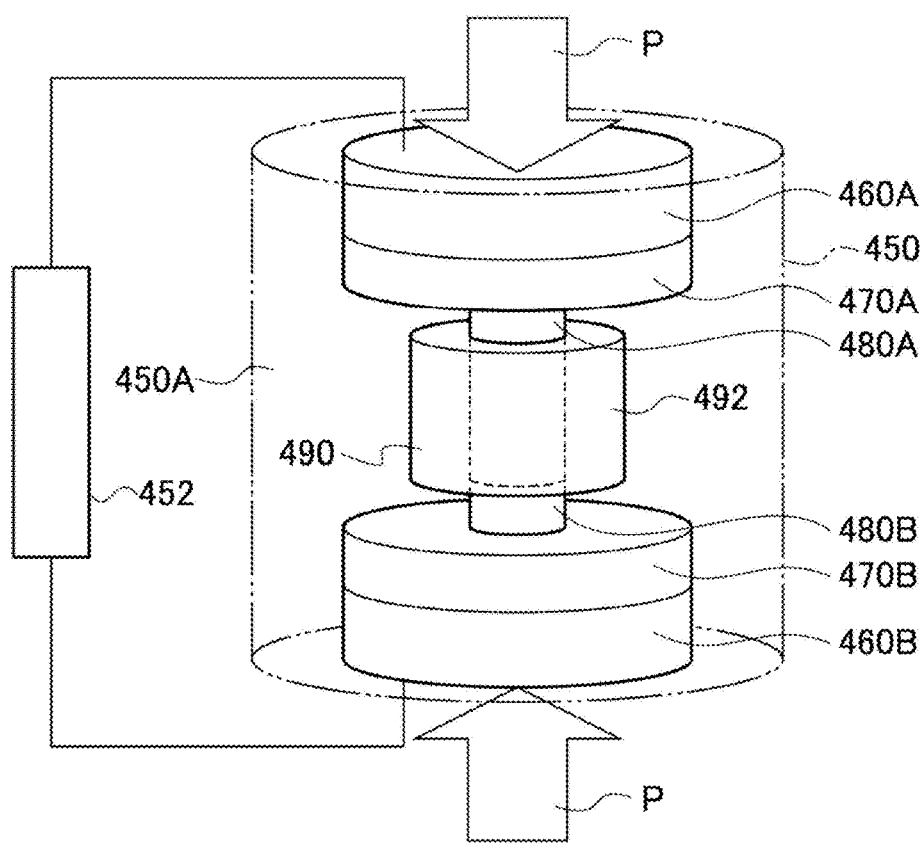
FIG. 24 is a schematic view showing a manufacturing device for manufacturing a polycrystal body (SiC sintered compact) which forms a polycrystal silicon carbide substrate according to a third embodiment.

Device for Manufacturing Silicon Carbide Sintered Compact by Means of Spark Plasma Sintering FIG. 24 is a schematic view of a manufacturing device 450 for manufacturing a polycrystal body (silicon carbide sintered compact) forming the polycrystal silicon carbide substrate 310 according to the third embodiment.

The above described polycrystal silicon carbide ingot 310A or the polycrystal silicon carbide wafer is manufactured by the silicon carbide sintered compact manufacturing device 450 shown in FIG. 24. The inside 450A of the silicon carbide sintered compact manufacturing device 450 is a vacuum atmosphere of approximately several Pa or is replaced by $Ar/N_2$ gas.

The polycrystal body (SiC sintered compact) manufacturing device 450 adopts a solid compression sintering method by means of spark plasma sintering (SPS). A powdery or solid SiC polycrystalline material 494 is filled in a graphite sintering die (graphite die) 490. The graphite die is energized by a DC pulse power source 452 while being pressurized and further heated. A thermocouple or radiation thermometer 492 is housed in the graphite die 490.

The graphite die 490 is connected to pressure shafts 460A and 460B via graphite bunches 480A and 480B and graphite spacers 470A and 470B. Further, the DC pulse power source 452 is connected to the pressure shafts 460A and 460B. The SiC polycrystalline material 494 is energized, pressurized, and heated by pressurizing a space between the pressure shafts 460A and 460B while applying a voltage to the space. The heating temperature is, for example, about 1800° C. to 2000° C., the pressure P is, for example, about 100 MPa at maximum, and the pulse voltage of the DC pulse is, for example, about 5 to 10 V.

Suppose that a polycrystal body (silicon carbide sintered compact) forming the polycrystal silicon carbide substrate 310 according to the third embodiment is manufactured by means of SPS. In the above case, the polycrystalline sintered compact can be formed at a relatively low temperature in a short time.

In addition, the polycrystal silicon carbide substrate 310 according to the third embodiment contains at least one of germanium and tin. Therefore, the occurrence of microcrystallization, amorphization, crystal defects which affect strength, and the like is suppressed. Suppose that a temperature of about 2000° C. is maintained for a certain period of time in order to form a SiC polycrystal body. Even in the above case, the density of the entire sintered compact can be increased. Also, it is possible to effectively prevent the sintered compact from having a fine structure. The fine structure is liable to cause grain boundary sliding due to excessive grain growth, or the like and to cause a decrease in strength.

Suppose that a polycrystal body (silicon carbide sintered compact) forming the polycrystal silicon carbide substrate 310 according to the third embodiment is manufactured by means of SPS. In the above case, the occurrence of defects in crystal grains can be reduced while adding a dopant at a high-concentration. Accordingly, the occurrence of intra-granular holes is suppressed, an amorphous layer and holes in the grain boundary are reduced, changes in the crystal state due to the high temperature treatment is reduced, and the internal stress generated at that time of the treatment can also be reduced. As a result, heat resistance is improved. In addition, the amount of impurities to be introduced is optimized together with a sintering condition. Therefore, changes in the physical properties in the high temperature region caused by the solid solution of the excess impurity elements can be minimized as much as possible.

Suppose that a polycrystal body (silicon carbide sintered compact) forming the polycrystal silicon carbide substrate 310 according to the third embodiment is manufactured by means of SPS. In the above case, high-concentration doping of a dopant, or the like can be easily performed without deteriorating other performance. Accordingly, a low resistance close to the theoretical value can be obtained.

Suppose that a polycrystal body (silicon carbide sintered compact) forming the polycrystal silicon carbide substrate 310 according to the third embodiment is manufactured by means of SPS. In the above case, the throughput is remarkably larger than that of silicon carbide crystal bulk growth by means of a sublimation method or a solution method. Even if the material utilization efficiency by processing is the same, the effect on cost can be reduced. It is also highly effective in reducing fixed costs through capital investment and space saving in manufacturing areas. In addition, the activation treatment of highly doped impurities can be simultaneously performed at the time of sintering. Therefore, a cost reduction effect can be obtained by simplifying the process.

Further, suppose that a polycrystal body (silicon carbide sintered compact) forming the polycrystal silicon carbide substrate 310 according to the third embodiment is manufactured by means of SPS. In the above case, the occurrence of hole defects in crystal grains is suppressed, an appropriate crystallite size is obtained, and an unnecessary amorphous layer and hole defects existing in grain boundaries are also suppressed. Therefore, a surface state that is easily smoothed by means of polishing processing can be provided.

Polycrystal Silicon Carbide Substrate 310 Manufactured by Means of CVD

The polycrystal silicon carbide substrate 310 according to the third embodiment may be manufactured by means of CVD. For example, the substrate may be manufactured by means of planar batch type vacuum CVD.

As a raw material of the polycrystal silicon carbide substrate 310, which is manufactured by means of CVD, for example, $SiCl_4$ was supplied as a Si-based gas and $C_3F_8$ was supplied as a C-based gas. Further, N was used as a dopant, Ge was used as an additive element, $NH_3$ or $N_2$ was supplied as an N-based gas of a raw material, and $GeH_4$ was supplied as a Ge-based gas. Each gas was diluted with an $H_2$ gas and supplied into a reacting furnace. The growth rate of 500 μm or more per hour in the thickness direction is obtained with dense 3C type polycrystal SiC.

The growth temperature was in a range from 1300° C. or higher to 1600° C. or lower, and for example, a range from about 1400° C. or higher to 1500° C. or lower was appropriate.

The resulting polycrystal silicon carbide ingot 310A has a bulk crystal length of about 30 mm.

The process of cutting the polycrystal silicon carbide ingot 310A into the polycrystal silicon carbide substrate 310 or the like is the same as that of the SPS.

When the polycrystal silicon carbide substrate 310 is manufactured by means of CVD, a void is less likely to be formed in the substrate. This can easily increase the relative density of the substrate. The relative density of the polycrystal silicon carbide substrate 310 may be 99% or more.

SiC Semiconductor Element Using Polycrystal Silicon Carbide Substrate

The polycrystal silicon carbide substrate 310 according to the third embodiment described above can be used, for example, for manufacturing various SiC semiconductor elements. Examples of these include a SiC Schottky barrier diode (SBD), a SiC trench gate (T) type metal oxide semiconductor field effect transistor (MOSFET), and a SiC planar gate type MOSFET.

Figure 25A:
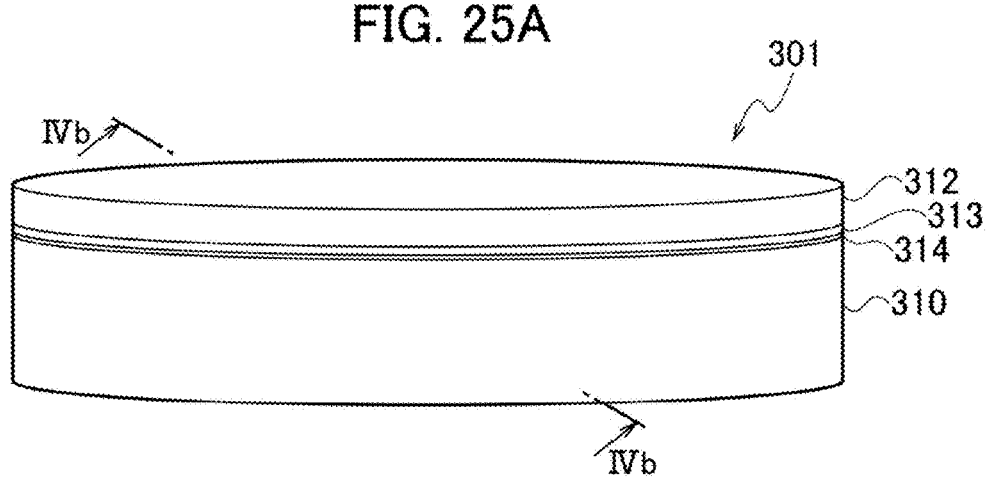
FIG. 25A is a schematic bird's-eye view showing a semiconductor substrate structure using a polycrystal silicon carbide substrate according to a third embodiment.
Figure 25B:
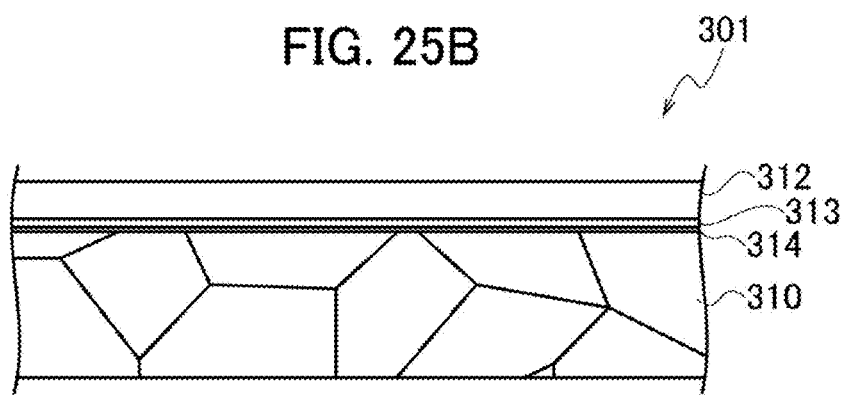
FIG. 25B is a schematic cross-sectional structural view of the semiconductor substrate structure shown in in FIG. 25A.

FIG. 25A is a schematic bird's-eye view of a semiconductor substrate structure 301 using the polycrystal silicon carbide substrate 310 according to the third embodiment. FIG. 25B is a schematic cross-sectional structural view of the semiconductor substrate structure 301 shown in FIG. 25A.

Suppose that the polycrystal silicon carbide substrate 310 according to the third embodiment is used for manufacturing various SiC semiconductor elements. For the above, first, the semiconductor substrate structure 301 shown in FIGS. 25A and 25B are created, and then the created semiconductor substrate structure 301 can be used for manufacturing various SiC semiconductor elements.

FIGS. 25A and 25B show schematic bird's-eye views structure of the semiconductor substrate structure (wafer) 301 using the polycrystal silicon carbide substrate 310 according to the third embodiment. The semiconductor substrate structure 301 includes the polycrystal silicon carbide substrate 310, a buffer layer 313 joined with the substrate 310, and an epitaxial growth layer 312 joined with the buffer layer 313 in this order. Both of the joining between the substrate 310 and the buffer layer 313 and the joining between the buffer layer 313 and the epitaxial growth layer 312 are performed by means of a room-temperature junction. The room-temperature junction includes at least one or more kinds selected from a surface activated bonding, a plasma activated bonding, and an atomic diffusion bonding.

The joining between the polycrystal silicon carbide substrate 310 and the buffer layer 313 and the joining between the buffer layer 313 and the epitaxial growth layer 312 may be performed by means of a diffused junction.

If the room-temperature junction is used, the surface roughness Ra of the substrate surface is set to about 1 nm or less. As a result, the thickness of a junction interface layer 314 with different compositions is about 1 nm to 10 nm.

If the diffused junction is used, the surface roughness of the substrate surface may be rough depending on the material and the junction temperature. The thickness of the junction interface layer 314 with different composition gradients in which atomic diffusion will be performed to use atomic diffusion is about 1 nm to 10 μm.

The epitaxial growth layer 312 may include at least one or more kinds selected from the group consisting of a group IV element semiconductor, a group III-V compound semiconductor, and a group II-VI compound semiconductor.

The epitaxial growth layer 312 may include at least one or more kinds selected from the group consisting of silicon carbide, gallium nitride, silicon, aluminum nitride, and gallium oxide.

If the epitaxial growth layer 312 includes silicon carbide, the layer may be made of a material of any one of 4H—SiC, 6H—SiC, 2H—SiC, or 3C—SiC as the silicon carbide.

The buffer layer 313 may include at least one or more kinds selected from the group which is the same as that of the epitaxial growth layer 312. However, as long as the conductivity type is the same as that of the epitaxial growth layer 312, the layer may include a dopant of the same kind or a dopant of a different kind.

The concentration of a first dopant of the epitaxial growth layer 312 may be $5\times10^{14}/cm^3$ or more and less than $2\times10^{17}/cm^3$. The concentration of a second dopant of the buffer layer 313 may be $2\times10^{17}/cm^3$ or more and $5\times10^{18}/cm^3$ or less.

The thickness of the polycrystal silicon carbide substrate 310 may be, for example, in a range from about 200 µm to about 500 µm. The thickness of the SiC epitaxial growth layer 312 may be, for example, in a range from about 4 µm to about 100 µm. The thickness of the SiC buffer layer 313 may be, for example, in a range from about 0.5 µm to about 1 µm.

SiC Epitaxial Wafer

Suppose that the epitaxial growth layer 312 and the buffer layer 313 are formed of silicon carbide. In the above case, the epitaxial growth layer (SiC epitaxial growth layer) 312 and the buffer layer (SiC buffer layer) 313 are made of, for example, 4H—SiC which is epitaxially grown by means of CVD and may have an off angle of less than 4 degrees. Specifically, the SiC epitaxial growth layer 312 and the SiC buffer layer 313 may be SiC single crystal epitaxial wafers which are manufactured by means of what is referred to as remote epitaxy. In the remote epitaxy, the material is epitaxially grown on a graphene layer formed on the SiC single crystal substrate and then the material is peeled off from the graphene layer.

SiC-SBD

Figure 26:
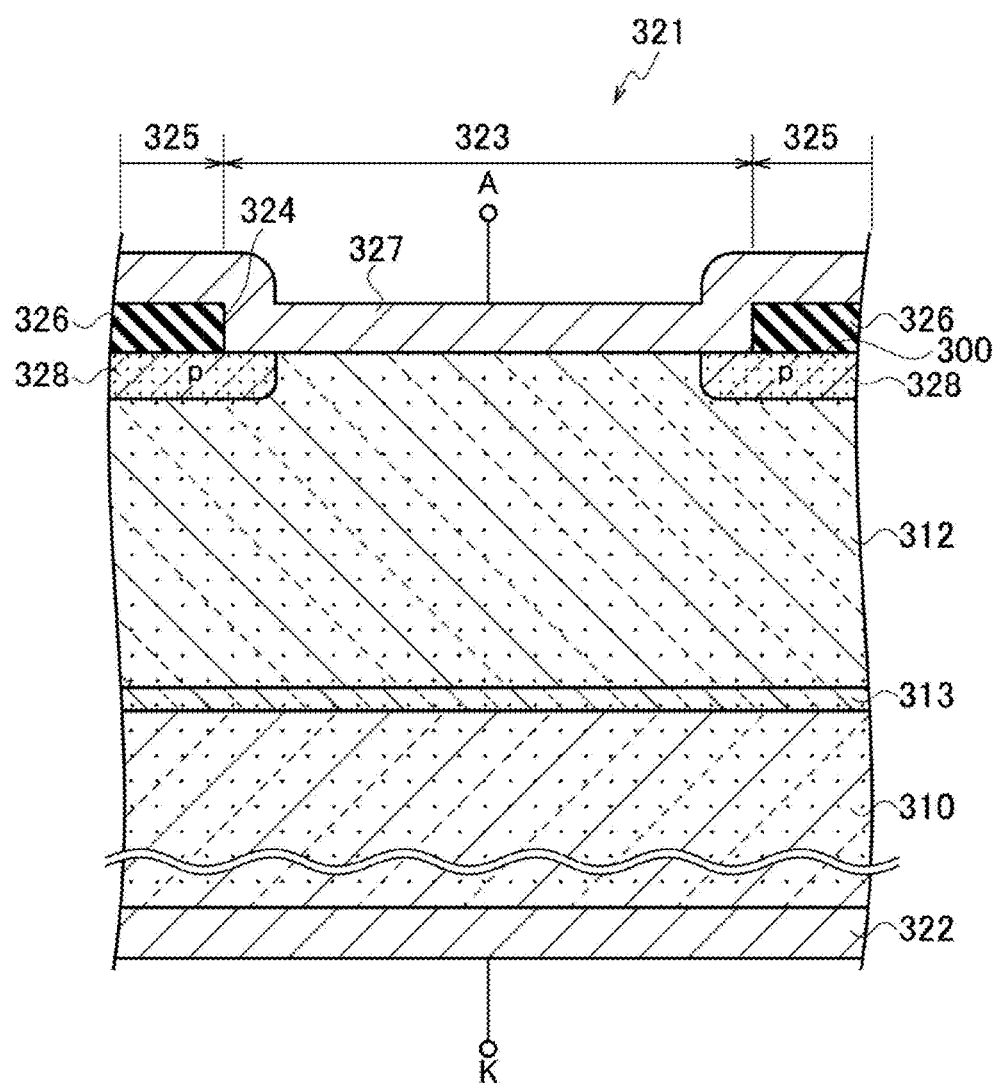
FIG. 26 is a schematic cross-sectional structural view of a Schottky barrier diode which is fabricated by using a semiconductor substrate structure including a polycrystal silicon carbide substrate according to a third embodiment.

FIG. 26 shows a SiC-SBD 321 fabricated of the semiconductor substrate structure 301, which has been manufactured by using the polycrystal silicon carbide substrate 310 according to the third embodiment. The SiC-SBD 321 includes the semiconductor substrate structure 301, which is formed of the polycrystal silicon carbide substrate 310, the SiC epitaxial growth layer 312, and the buffer layer 313. Both of the joining between the polycrystal silicon carbide substrate 310 and the buffer layer 313 and the joining between the buffer layer 313 and the SiC epitaxial growth layer 312 are performed by means of a room-temperature junction. The junction interface layer 314 may be interposed between the polycrystal silicon carbide substrate 310 and the buffer layer 313, or between the buffer layer 313 and the SiC epitaxial growth layer 312.

A large amount of n-type impurities corresponding to an (n+)-type semiconductor (for example, an impurity density of about $1\times10^{18}$ cm$^{-3}$ to about $1\times10^{21}$ cm$^{-3}$) are doped to the polycrystal silicon carbide substrate 310 and the buffer layer 313. A small amount of n-type impurities corresponding to an (n−)-type semiconductor (for example, an impurity density of about $5\times10^{14}$ cm$^{-3}$ to about $5\times10^{16}$ cm$^{-3}$) are doped to the SiC epitaxial growth layer 312.

The SiC epitaxial growth layer 312 may be made of a material of any one of 4H—SiC, 6H—SiC, 2H—SiC, or 3C—SiC.

As an n-type doping impurity, for example, N (nitrogen), P (phosphorus), or the like can be applied.

As a p-type doping impurity, for example, B (boron), Al (aluminum), or the like can be applied.

A cathode electrode 322 is formed on the back surface of the polycrystal silicon carbide substrate 310 so as to cover the entire area of the back surface. The cathode electrode 322 is connected to a cathode terminal K.

In the surface 300 (for example, a (0001) plane (Si plane)) of the SiC epitaxial growth layer 312, contact holes 324 are provided, which are for exposing a part of the SiC epitaxial growth layer 312 as an active region 323. Field insulating films 326 are formed in field regions 325 which surround the active region 323.

The field insulating films 326 are made of SiO$_2$ (silicon oxide), but alternatively may be made of other insulating materials such as silicon nitride (SiN). An anode electrode 327 is formed on the field insulating films 326, and the anode electrode 327 is connected to an anode terminal A.

P-type JTE (junction termination extension) structures 328 are formed in the vicinity of the surface 300 (surface layer portion) of the SiC epitaxial growth layer 312 so as to be in contact with the anode electrode 327. The JTE structures 328 are formed along the contours of the contact holes 324 so as to straddle the inside and outside of the contact holes 324 in the field insulating films 326.

SiC-TMOSFET

Figure 27:
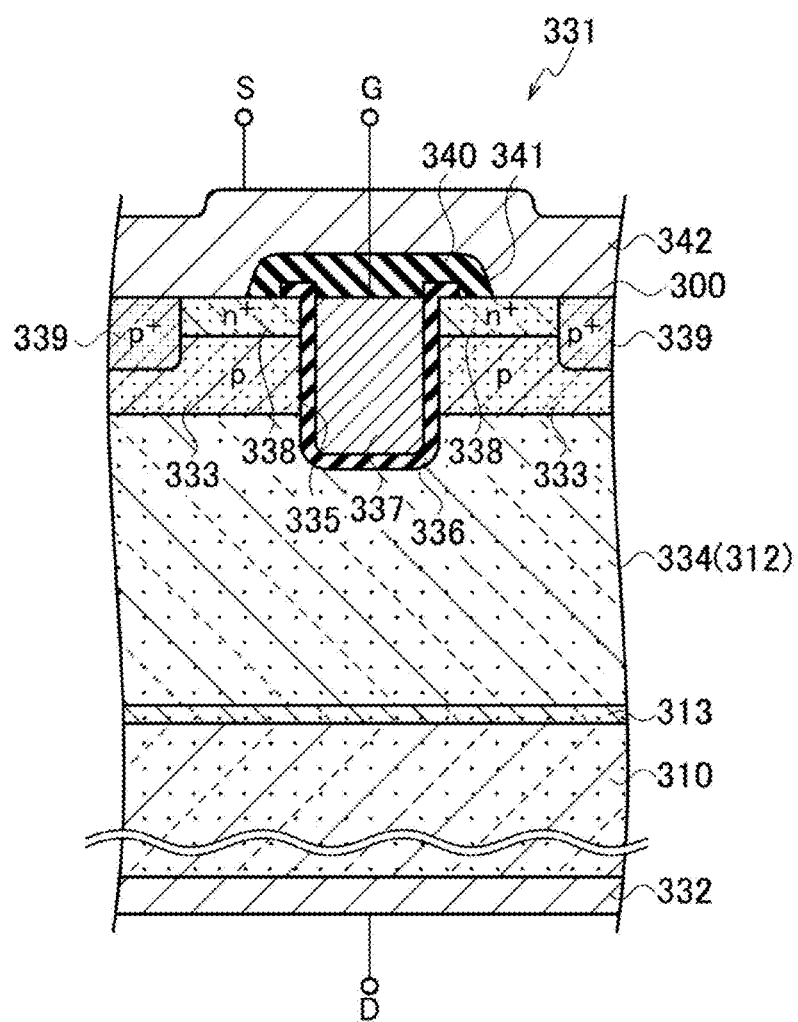
FIG. 27 is a schematic cross-sectional structural view showing a trench gate type MOSFET which is fabricated by using a semiconductor substrate structure including a polycrystal silicon carbide substrate according to a third embodiment.

FIG. 27 shows a trench gate type MOSFET 331 fabricated of the semiconductor substrate structure 301, which has been manufactured by using the polycrystal silicon carbide substrate 310 according to the third embodiment. The trench gate type MOSFET 331 includes a semiconductor substrate structure 301 that includes a polycrystal silicon carbide substrate 310, a SiC epitaxial growth layer 312, and a buffer layer 313. Both of the joining between the polycrystal silicon carbide substrate 310 and the buffer layer 313 and the joining between the buffer layer 313 and the SiC epitaxial growth layer 312 are performed by means of a room-temperature junction. A junction interface layer 314 may be interposed between the polycrystal silicon carbide substrate 310 and the buffer layer 313 or between the buffer layer 313 and the SiC epitaxial growth layer 312.

A large amount of n-type impurities corresponding to an (n+)-type semiconductor (for example, an impurity density of about $1\times10^{18}$ cm$^{-3}$ to about $1\times10^{21}$ cm$^{-3}$) are doped to the polycrystal silicon carbide substrate 310 and the buffer layer 313. A small amount of n-type impurities corresponding to an (n−)-type semiconductor (for example, an impurity density of about $5\times10^{14}$ cm$^{-3}$ to about $5\times10^{16}$ cm$^{-3}$) are doped to the SiC epitaxial growth layer 312.

Further, the SiC epitaxial growth layer 312 may be made of a material of any one of 4H—SiC, 6H—SiC, 2H—SiC, or 3C—SiC.

As an n-type doping impurity, for example, N (nitrogen), P (phosphorus), or the like can be applied.

As a p-type doping impurity, for example, B (boron), Al (aluminum), or the like can be applied.

A drain electrode 332 is provided on the back surface ((000−1) plane, C plane) of the polycrystal silicon carbide substrate 310 so as to cover the entire area of the back surface. The drain electrode 332 is connected to a drain terminal D.

There are p-type (for example, an impurity density of about $1\times10^{16}$ cm$^{-3}$ to about $1\times10^{19}$ cm$^{-3}$) body regions 333 formed in the vicinity of a surface 300 ((0001) plane, Si plane) of the SiC epitaxial growth layer 312 (surface layer portion). In the SiC epitaxial growth layer 312, a portion which is closer to the polycrystal silicon carbide substrate 310 than the body regions 333 is an n-type drain region 334 (312) in which the state of a SiC epitaxial growth layer is maintained.

A gate trench 335 is formed in the SiC epitaxial growth layer 312. The gate trench 335 extends from the surface 300 of the SiC epitaxial growth layer 312, penetrates the body regions 333, and has the deepest portion which reaches the drain region 334.

A gate insulating film 336 is formed at the surface 300 of the SiC epitaxial growth layer 312 and on the inner surface of the gate trench 335 so as to cover the entire inner surface of the gate trench 335. A gate electrode 337 is embedded in the gate trench 335 by filling the inside of the gate insulating film 336 with, for example, polysilicon. A gate terminal G is connected to the gate electrode 337.

There are (n+)-type source regions 338, which form a part of the side surfaces of the gate trench 335, formed at the surface layer portions of the body regions 333.

Further, in the SiC epitaxial growth layer 312, (p+)-type (for example, an impurity density of about $1\times10^{18}$ cm$^{-3}$ to about $1\times10^{21}$ cm$^{-3}$) body contact regions 339 are formed. The (p+)-type body contact regions 339 extend from the surface 300 of the SiC epitaxial growth layer 312, penetrate the source regions 338, and are connected to the body regions 333.

An interlayer insulating film 340 made of SiO$_2$ is formed on the SiC epitaxial growth layer 312. A source electrode 342 is connected to the source regions 338 and the body contact regions 339 through contact holes 341 formed in the interlayer insulating film 340. A source terminal S is connected to the source electrode 342.

A predetermined voltage (voltage equal to or higher than a gate threshold voltage) is applied to the gate electrode 337 while a predetermined potential difference is generated between the source electrode 342 and the drain electrode 332 (between source and drain). Accordingly, channels can be formed in the vicinity of interfaces between the gate insulating film 336 and the body regions 333 due to an electric field from the gate electrode 337. This can allow a current to flow between the source electrode 342 and the drain electrode 332, and turn on a SiC-TMOSFET 331.

SiC Planar Gate MOSFET

Figure 28:
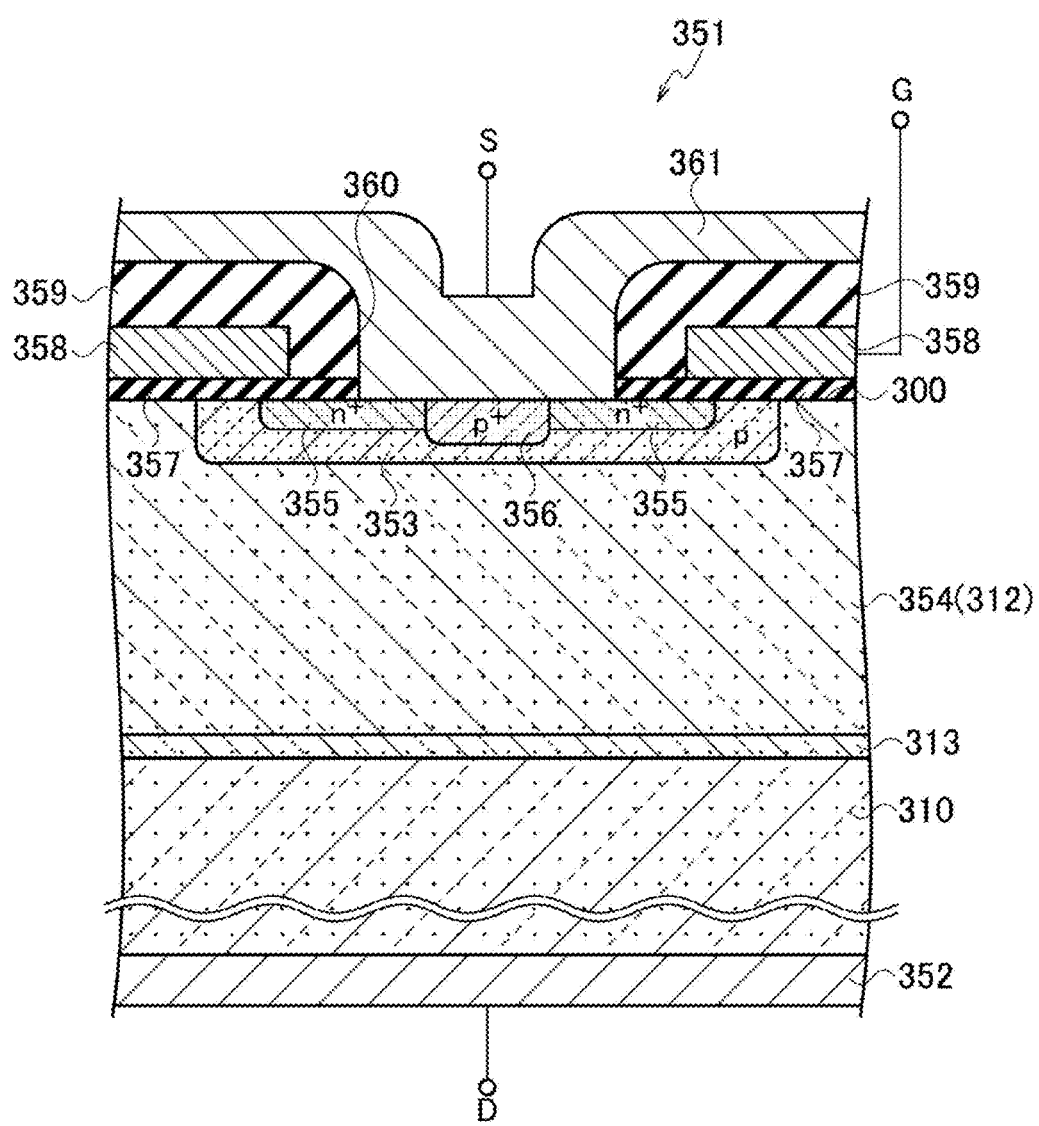
FIG. 28 is a schematic cross-sectional structural view showing a planar gate MOSFET which is fabricated by using a semiconductor substrate structure including a polycrystal silicon carbide substrate according to a third embodiment.

FIG. 28 shows a planar gate MOSFET 351 fabricated of the semiconductor substrate structure 301, which has been manufacture by using the polycrystal silicon carbide substrate 310 according to the third embodiment. The planar gate MOSFET 351 includes the semiconductor substrate structure 301, which has a polycrystal silicon carbide substrate 310, a SiC epitaxial growth layer 312, and a buffer layer 313. Both of the joining between the polycrystal silicon carbide substrate 310 and the buffer layer 313, and the joining between the buffer layer 313 and the SiC epitaxial growth layer 312 are performed by means of a room-temperature junction. A junction interface layer 314 may be interposed between the polycrystal silicon carbide substrate 310 and the buffer layer 313, or between the buffer layer 313 and the SiC epitaxial growth layer 312.

A large amount of n-type impurities corresponding to an (n+)-type semiconductor (for example, an impurity density of about $1\times10^{18}$ cm$^{-3}$ to about $1\times10^{21}$ cm$^{-3}$) are doped to the polycrystal silicon carbide substrate 310 and the buffer layer 313. A small amount of n-type impurities corresponding to an (n−)-type semiconductor (for example, an impurity density of about $5\times10^{14}$ cm$^{-3}$ to about $5\times10^{16}$ cm$^{-3}$) are doped to the SiC epitaxial growth layer 312.

Further, the SiC epitaxial growth layer 312 may be made of a material of any one of 4H—SiC, 6H—SiC, 2H—SiC, or 3C—SiC.

As an n-type doping impurity, for example, N (nitrogen), P (phosphorus), or the like can be applied.

As a p-type doping impurity, for example, B (boron) or the like can be applied.

A drain electrode 352 is formed on the back surface ((000−1) plane) of the polycrystal silicon carbide substrate 310 so as to cover the entire area of the back surface. A drain terminal D is connected to the drain electrode 352.

A p-type (for example, an impurity density of about $1\times10^{16}$ cm$^{-3}$ to about $1\times10^{19}$ cm$^{-3}$) body region 353 is formed in a well shape in the vicinity of a surface 300 ((0001) plane) of the SiC epitaxial growth layer 312 (surface layer portion). In the SiC epitaxial growth layer 312, a portion closer to the SiC substrate 310 than the body region 353 is an (n−)-type drain region 354 (312) in which the same state as after the epitaxial growth is maintained.

At a surface layer portion of the body region 353, (n+)-type source regions 355 are formed with there being intervals thereto from peripheral edges of the body region 353.

A (p+)-type (for example, an impurity density of about $1\times10^{18}$ cm$^{-3}$ to about $1\times10^{21}$ cm$^{-3}$) body contact region 356 is formed inside the source regions 355. The body contact region 356 penetrates the source regions 355 in the depth direction and is connected to the body region 353.

Gate insulating films 357 are formed on a surface 300 of the SiC epitaxial growth layer 312. The gate insulating films 357 cover portions of the body region 353 (peripheral edge portions of the body region 353) which surround the source regions 355. The gate insulating films 357 also cover outer peripheral edges of the source regions 355.

Gate electrodes 358 made of, for example, polysilicon are formed on the gate insulating films 357. The gate electrodes 358 face the peripheral edge portions of the body region 353 with the gate insulating films 357 being interposed therebetween. A gate terminal G is connected to the gate electrodes 358.

Interlayer insulating films 359 made of SiO$_2$ are formed on the SiC epitaxial growth layer 312. A source electrode 361 is connected to the source regions 355 and the body contact region 356 through contact holes 360 formed in the interlayer insulating films 359. A source terminal S is connected to the source electrode 361.

A predetermined voltage (voltage equal to or higher than a gate threshold voltage) is applied to the gate electrodes 358 while a predetermined potential difference is generated between the source electrode 361 and the drain electrode 352 (between source and drain). Accordingly, channels can be formed in the vicinity of interfaces between the gate insulating films 357 and the body region 353 due to an electric field from the gate electrode 358. This can allow a current to flow between the source electrode 361 and the drain electrode 352, and turn on the planar gate MOSFET 351.

Although the third embodiment has been described above, other embodiments are also possible.

For example, although not shown in the drawings, a power semiconductor device can be manufactured by using the semiconductor substrate structure 301 manufactured by using the polycrystal silicon carbide substrate 310 according to the third embodiment. Specifically, a vertical device structure using the semiconductor substrate structure 301 can be manufactured. That is, a vertical power semiconductor device may be formed which includes a polycrystal silicon carbide substrate 310, an epitaxial growth layer 312 which is integrated with the polycrystal silicon carbide substrate 310, and a buffer layer 313. The buffer layer 313 is disposed between the polycrystal silicon carbide substrate 310 and the epitaxial growth layer 312 and is joined with both of the polycrystal silicon carbide substrate 310 and the epitaxial growth layer 312. In the device, the epitaxial growth layer 312 includes a first dopant and the buffer layer 313 includes a second dopant having the same conductivity type as that of the first dopant. In the semiconductor substrate structure 301 in the device, the concentration of the second dopant contained in the buffer layer 313 is higher than the concentration of the dopant contained in the epitaxial growth layer 312. The device includes a first metal electrode which is disposed on the substrate surface which faces a junction surface between the polycrystal silicon carbide substrate 310 and the buffer layer 313.

A vertical power semiconductor device may be further formed, which includes a second metal electrode. The second metal electrode is disposed on the surface of the epitaxial growth layer 312 which faces a junction surface between the buffer layer 313 and the epitaxial growth layer 312.

A lateral device structure can be manufactured, for example, by using the semiconductor substrate structure 301 manufactured by using the polycrystal silicon carbide substrate 310 according to the third embodiment. That is, a lateral power semiconductor device may be formed, which includes a polycrystal silicon carbide substrate 310, an epitaxial growth layer 312 which is integrated with the polycrystal silicon carbide substrate 310, and a buffer layer 313. The buffer layer 313 is disposed between the polycrystal silicon carbide substrate 310 and the epitaxial growth layer 312 and joined with both of the polycrystal silicon carbide substrate 310 and the epitaxial growth layer 312. In the device, the epitaxial growth layer 312 includes a first dopant and the buffer layer 313 includes a second dopant having the same conductivity type as that of the first dopant. In the semiconductor substrate structure 301 of the device, the concentration of the second dopant contained in the buffer layer 313 is higher than the concentration of the dopant contained in the epitaxial growth layer 312. The device includes a second metal electrode. The second metal electrode is disposed on the surface of the epitaxial growth layer 312 which faces a junction surface between the buffer layer 313 and the epitaxial growth layer 312.

In the above described vertical or lateral power semiconductor device, an example where the epitaxial growth layer 312 and the buffer layer 313 are silicon carbide is shown. However, the epitaxial growth layer 312 and the buffer layer 313 are not limited to this. Each of the epitaxial growth layer 312 and the buffer layer 313 may include at least one or more kinds selected from the group consisting of a group IV element semiconductor, a group III-V compound semiconductor, and a group II-VI compound semiconductor, for example. Further, each of the epitaxial growth layer 312 and the buffer layer 313 may have at least one or more kinds selected from the group consisting of silicon carbide, gallium nitride, silicon, aluminum nitride, and gallium oxide.

Further, although not shown in the drawings, a MOS capacitor may be manufactured using the semiconductor substrate structure 301 manufactured by using the polycrystal silicon carbide substrate 310 according to the third embodiment, for example. The yield and reliability of the MOS capacitor can be enhanced.

Further, although not shown in the drawings, a bipolar transistor can also be manufactured by using the semiconductor substrate structure 301 manufactured by using the polycrystal silicon carbide substrate 310 according to the third embodiment. In addition, a semiconductor substrate structure 1 according to the third embodiment can be used for manufacturing a SiC-pn diode, a SiC insulated gate bipolar transistor (IGBT), a SiC complementary MOSFET, and the like.

A power semiconductor device includes the semiconductor substrate structure 301 manufactured by using the polycrystal silicon carbide substrate 310 according to the third embodiment. The power semiconductor device may include any one of SiC based, Si based, GaN based, AlN based, and gallium oxide based IGBTs, diodes, MOSFETs, thyristors, and LED devices.

The power semiconductor device includes the semiconductor substrate structure 301 manufactured by using the polycrystal silicon carbide substrate 310 according to the third embodiment. The power semiconductor device may include a configuration of any one of a 1-in-1 module, a 2-in-1 module, a 4-in-1 module, a 6-in-1 module, a 7-in-1 module, an 8-in-1 module, a 12-in-1 module, or a 14-in-1 module.

According to the third embodiment, it is possible to provide a semiconductor substrate structure having a stable interface structure even at a high temperature and a power semiconductor device having the semiconductor substrate structure.

According to the third embodiment, it is possible to provide a semiconductor substrate structure capable of eliminating material constraints, reducing costs, and obtaining desired physical properties. It is also possible to provide a power semiconductor device having the semiconductor substrate structure.

In accordance with the semiconductor substrate structure according to the third embodiment, a given substrate and a SiC epitaxial growth layer are bonded and joined together by means of a room-temperature junction technique instead of forming a SiC epitaxial growth layer on a SiC single crystal substrate. Therefore, the range of combinations of an epitaxial growth layer and a substrate can be expanded.

In accordance with the semiconductor substrate structure according to the third embodiment, as a substrate material, for example, a low-cost SiC polycrystal substrate or a carbon substrate can be used instead of using a high-cost SiC single crystal substrate.

In addition, in accordance with the semiconductor substrate structure according to the third embodiment, it is possible to combine a substrate and a SiC epitaxial growth layer which have desired characteristics. Therefore, the characteristics of a power semiconductor device can be enhanced. Specifically, the thermal expansion coefficient, thermal conductivity, electrical conductivity, and mechanical characteristics can be made into the desired combination. Therefore, the switching characteristics, heat resistance, and mechanical reliability of a power semiconductor device can be enhanced.

In addition, in accordance with the semiconductor substrate structure according to the third embodiment and a power semiconductor device having the semiconductor substrate structure, a given substrate and a completed SiC epitaxial growth layer are bonded and joined together by using a room-temperature junction technique or a diffused junction technique. Therefore, the period of the process can be shortened. Further, the manufacturing yield can be enhanced because any substrate can be combined with a completed SiC epitaxial growth layer.

Further, a power semiconductor device having the semiconductor substrate structure according to the third embodiment includes a SiC buffer layer having a higher dopant concentration than a SiC epitaxial growth layer. Therefore, the withstanding voltage of the semiconductor substrate structure can be enhanced. This can enhance the reliability of the device when the semiconductor substrate structure is applied to the device.

Other Embodiments

As noted above, some embodiments have been described, but the descriptions and drawings that form part of the disclosure are exemplary and should not be understood as limiting the invention. Various alternative embodiments, examples, and operational techniques will become apparent to those skilled in the art from this disclosure.

In this way, the third embodiment includes various embodiments or the like which are not described herein.

Fourth Embodiment

Next, a fourth embodiment will be described. In the drawings described below, the same or similar portions are denoted by the same or similar reference numerals. It should be noted, however, that the drawings are schematic and that the relationships between the thickness of each component and the plane dimensions are different from those in reality. Therefore, the specific thickness and dimensions should be determined in consideration of the following description. In addition, it is needless to say that the drawings include parts having different dimensional relationships and ratios.

Further, a fourth embodiment shown below exemplifies a device or method for embodying a technical concept, and does not specify the material, shape, structure, arrangement, and the like of each component. Various changes may be made to the fourth embodiment in the scope of claims.

Figure 29:
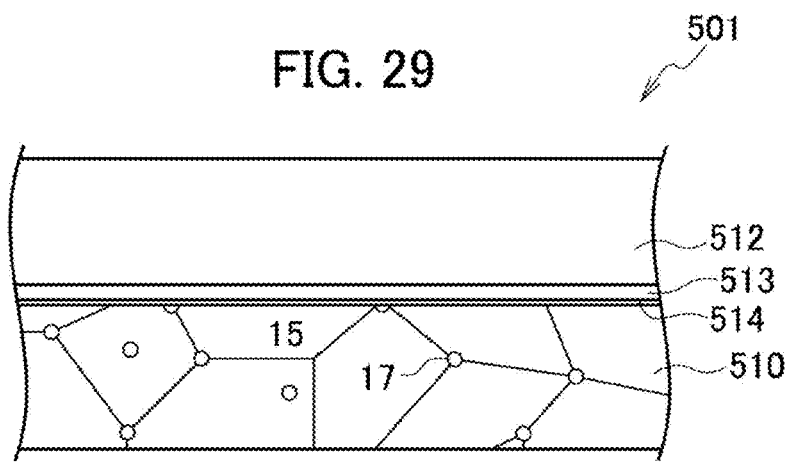
FIG. 29 is a schematic cross-sectional structural view showing a semiconductor substrate structure according to a fourth embodiment.

FIG. 29 shows a schematic cross-sectional structure of a semiconductor substrate structure according to a fourth embodiment.

A semiconductor substrate structure 501 according to the fourth embodiment includes, as shown in FIG. 29, a polycrystal substrate 510, an epitaxial growth layer 512 integrated with the polycrystal substrate 510, and a buffer layer 513. The buffer layer 513 is disposed between the polycrystal substrate 510 and the epitaxial growth layer 512 and joined with both of the polycrystal substrate 510 and the epitaxial growth layer 512. The epitaxial growth layer 512 includes a first dopant and the buffer layer 513 includes a second dopant having the same conductivity type as the first dopant. The concentration of the second dopant contained in the buffer layer 513 is higher than the concentration of the first dopant contained in the epitaxial growth layer 512. The first dopant and the second dopant may be the same kind of dopant or may be different kinds of dopants as long as the conductivity type is the same.

The polycrystal substrate 510 and the buffer layer 513 may be joined with each other by means of a room-temperature junction. The room-temperature junction includes at least one or more kinds selected from a surface activated bonding, a plasma activated bonding, and an atomic diffusion bonding.

The buffer layer 513 and the epitaxial growth layer 512 may be joined with each other by means of a room-temperature junction.

The concentration of the first dopant of the epitaxial growth layer 512 may be $5\times10^{14}/cm^3$ or more and less than $2\times10^{17}/cm^3$. The concentration of the second dopant of the buffer layer 513 may be $2\times10^{17}/cm^3$ or more and $5\times10^{18}/cm^3$ or less.

The thickness of the buffer layer 513 may be 0.1 μm or more and 10 μm or less.

Each of the epitaxial growth layer 512 and the buffer layer 513 may include at least one or more kinds selected from the group consisting of a group IV element semiconductor, a group III-V compound semiconductor, and a group II-VI compound semiconductor. Further, each layer may include at least one or more kinds selected from the group consisting of silicon carbide, gallium nitride, silicon, aluminum nitride, and gallium oxide.

The epitaxial growth layer 512 and the buffer layer 513 may contain the same or different kinds of inorganic materials.

Further, the polycrystal substrate 510 may include at least one or more kinds selected from the group consisting of a sintered compact, BN, AlN, $Al_2O_3$, $Ga_2O_3$, diamond, carbon, and graphite.

A sintered compact may include a sintered compact of at least one or more kinds selected from the group consisting of a group IV element semiconductor, a group III-V compound semiconductor, and a group II-VI compound semiconductor.

Further, a sintered compact may include a sintered compact of at least one or more kinds selected from the group consisting of silicon carbide, gallium nitride, silicon, aluminum nitride, and gallium oxide.

The polycrystal substrate 510 may contain a dopant at a concentration of $5\times10^{18}/cm^3$ or more and $2\times10^{22}/cm^3$ or less.

The thickness of the polycrystal substrate 510 may be 100 μm or more and 1000 μm or less. Further, the diameter of the polycrystal substrate 510 may be 100 mm or more.

The polycrystal substrate 510 and the buffer layer 513 may form an ohmic junction.

Each of the epitaxial growth layer 512 and the buffer layer 513 may include an epitaxial growth layer made of 4H—SiC. The epitaxial growth layer made of 4H—SiC may have a surface of a (000–1) plane (C plane) or a (0001) plane (Si plane).

In an example shown in FIG. 29, the epitaxial growth layer 512 is made of SiC. The buffer layer 513 is an epitaxial growth layer which is made of SiC and has a higher dopant concentration than the epitaxial growth layer 512. In the example, the polycrystal substrate 510 is a SiC sintered compact.

In the example shown in FIG. 29, the buffer layer 513 made of SiC and the polycrystal substrate 510 made of SiC are joined to each other by means of a room-temperature junction. The buffer layer 513 made of SiC and the epitaxial growth layer 512 made of SiC are also joined to each other by means of a room-temperature junction. That is, the buffer layer 513 made of SiC is joined with both of the polycrystal substrate 510 made of SiC and the epitaxial growth layer 512 made of SiC by means of a room-temperature junction.

In the example shown in FIG. 29, a junction interface layer 514 is formed at an interface between the buffer layer 513 made of SiC and the polycrystal substrate 510 made of SiC. The junction interface layer 514 has been formed during the room-temperature junction process. That is, the buffer layer 513 made of SiC and the polycrystal substrate 510 made of SiC are joined with each other with the junction interface layer 514 being interposed therebetween.

The surface roughness Ra (arithmetic average roughness) of the surface of the polycrystal substrate 510 is set to about 1 nm or less, the surface being joined with the buffer layer during the room-temperature junction process. As a result, the thickness of the junction interface layer 514 having a composition different from that of the polycrystal substrate 510 is about 1 nm to 10 nm. The junction interface layer 514 may be amorphous SiC.

Further, the polycrystal substrate 510, which is a SiC sintered compact has a structure including a plurality of crystal grains 515 and includes a plurality of voids (holes) 517.

In the example shown in FIG. 29, the polycrystal substrate 510 is a SiC sintered compact, but the polycrystal substrate 510 is not limited to a sintered compact. The polycrystal substrate 510 may be a SiC polycrystal body formed by means of chemical vapor deposition (CVD), for example.

As a dopant contained in the epitaxial growth layer 512 used in the fourth embodiment, N (nitrogen), P (phosphorus), As (arsenic), or the like can be applied as an n-type dopant, for example, and Al (aluminum), or the like can be applied as a p-type dopant, for example.

A dopant contained in the buffer layer 513 used in the fourth embodiment may include at least one or more kinds selected from the same group as the epitaxial growth layer 512. However, the layer may contain a dopant of the same kind or a dopant of a different kind as long as a conductivity type is the same as that of the epitaxial growth layer 512.

According to the fourth embodiment, it is possible to provide a semiconductor substrate structure and a power semiconductor device having the semiconductor substrate structure, by which cost can be reduced while obtaining desired physical properties by eliminating material constraints.

In accordance with the semiconductor substrate structure according to the fourth embodiment, a given polycrystal substrate, an epitaxial growth layer, and a buffer layer are bonded and joined together by using a room-temperature junction technique instead of forming a SiC epitaxial growth layer on a SiC single crystal substrate. Therefore, the range of combinations of a substrate, an epitaxial growth layer, and a buffer layer can be expanded.

In addition, in accordance with the semiconductor substrate structure according to the fourth embodiment, it is possible to combine a substrate and a SiC epitaxial growth layer which have desired characteristics. This can enhance the characteristics of a power semiconductor device. Specifically, the thermal expansion coefficient, thermal conductivity, electrical conductivity, and mechanical characteristics can be made into a desired combination. Therefore, the switching characteristics, heat resistance, and mechanical reliability of a power semiconductor device can be enhanced.

In addition, in accordance with the semiconductor substrate structure according to the fourth embodiment and a power semiconductor device having the semiconductor substrate structure, a given substrate, a completed SiC epitaxial growth layer, and a buffer layer are bonded and joined together by using a room-temperature junction technique. Therefore, the duration of the manufacturing process can be shortened. Further, the manufacturing yield can be enhanced because a given substrate, a completed SiC epitaxial growth layer, and a buffer layer are combined.

In addition, in accordance with the semiconductor substrate structure according to the fourth embodiment and a power semiconductor device having the semiconductor substrate structure, a given substrate, a completed SiC epitaxial growth layer, and a buffer layer are bonded and joined together by using a room-temperature junction technique. Therefore, suppose that a polycrystal substrate which is a sintered compact is used as the substrate, for example. In the above case, the sintered compact is manufactured through a high temperature process of 2000° C. or higher to reduce stress remaining in the substrate. Therefore, warping of the substrate is less likely to occur even in a state where the SiC epitaxial growth layer and the buffer layer are bonded.

In the semiconductor substrate structure according to the fourth embodiment and a power semiconductor device having the semiconductor substrate structure, suppose that a polycrystal substrate which is a sintered compact is used as a substrate. In the above case, the concentration of a dopant can be easily increased only by changing the blending of raw materials. Therefore, the resistance of the substrate can be easily reduced.

Manufacturing Method of Semiconductor Substrate Structure

Figure 30:
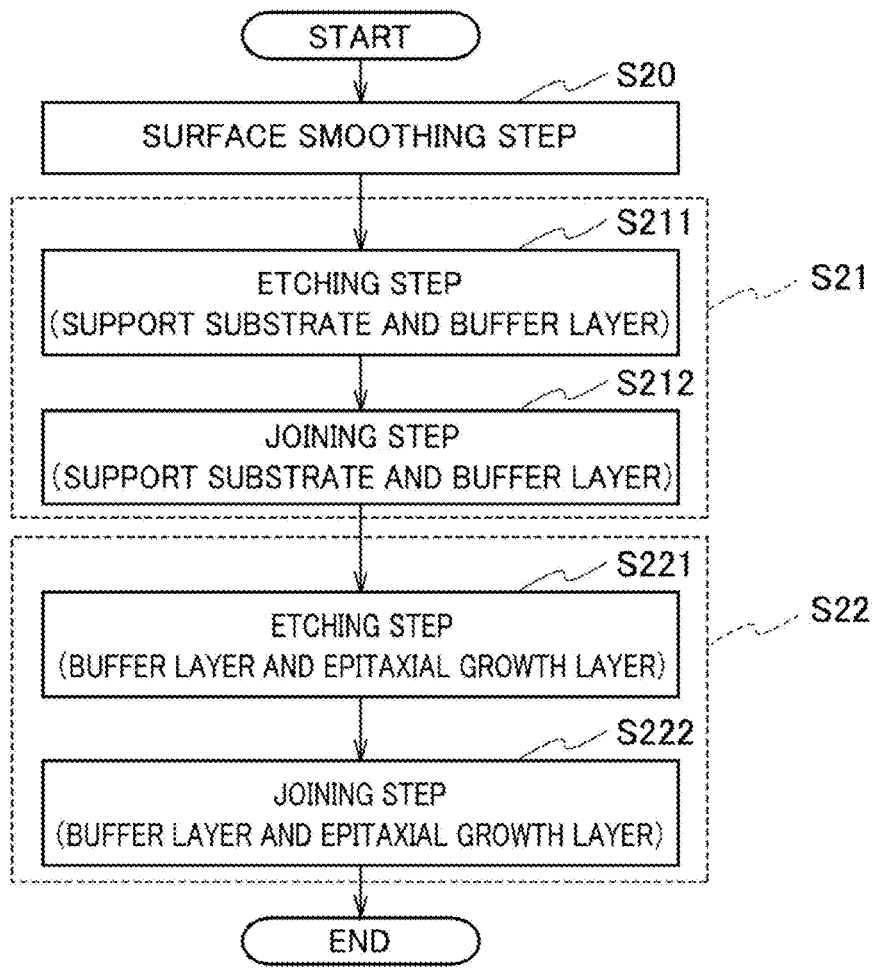
FIG. 30 is a flow diagram showing a manufacturing method of a semiconductor substrate structure according to a fourth embodiment.

FIG. 30 shows a manufacturing method of a semiconductor substrate structure 1 according to the fourth embodiment.

First, a polycrystal substrate 510, and an epitaxial growth layer 512 and a buffer layer 513 both of which are separated from the polycrystal substrate 510 are prepared. Then, the surface of the polycrystal substrate 510 to be joined with the buffer layer 513 is smoothed by applying a CMP or MP technique so that the surface roughness Ra of the surface is, for example, 1 nm or less (surface smoothing step S20). As the smoothing technique, a fast atom beam irradiation technique or the like using argon or neon or the like in which an ion beam is neutralized may be applied.

Next, the polycrystal substrate 510 and the buffer layer 513 are bonded and joined together by means of a room-temperature junction (joining step S21 of a polycrystal substrate and a buffer layer). The epitaxial growth layer 512 and the buffer layer 513 are bonded and joined together by means of a room-temperature junction (joining step S22 of an epitaxial growth layer and a buffer layer). Either the joining step S21 of the polycrystal substrate and the buffer layer or the joining step S22 of the epitaxial growth layer and the buffer layer may be performed first.

Room-Temperature Junction Technique

The room-temperature junction technique includes a surface activated bonding technique, a plasma activated bonding technique, an atomic diffusion bonding technique, and the like. In the room-temperature junction technique, oxides and adsorbed molecules on solid surfaces are removed in a vacuum by using a fast atom beam or the like due to a sputtering effect to activate the surfaces. Thereafter, in the room-temperature junction technique, active surfaces are brought into contact with each other to form interatomic bonds at room temperature. In the room-temperature junction technique, junction surfaces are surface-treated in a vacuum to make atoms on the surfaces active enough for chemical bonding. In the room-temperature junction technique, surface layers which interfere with the joining are removed. This directly bonds the bonds of the atoms on the surfaces to each other to form a strong join. Many materials can be joined at room temperature by using the room-temperature junction technique.

As a semiconductor material, for example, the technique can be applied to similar material joining of Si, SiC, GaAs, InP, GaP, InAs, and the like and dissimilar material joining of these materials. As a single crystal oxide, the technique can be applied to $Si/LiNbO_3$, $Si/LiTaO_3$, $Si/Gd_3GasO_{12}$, $Si/Al_2O_3$ (sapphire), and the like. As metal, the technique can be applied to Au, Pt, Ag, Cu, Al, Sn, Pb, Zn, a solder bulk material, a foil, a bump, and the like. In addition, the technique can be applied to a film material or the like which is obtained by forming Au, Pt, Cu, and Al on a substrate. Further, as a metal/ceramic structure, the technique can be applied to dissimilar material joining of Al such as $Al/Al_2O_3$, Al/silicon nitride, Al/SiC, Al/AlN, and the like.

In the room-temperature junction technique, it is necessary that a surface to be joined is clean and smooth at an atomic level. Therefore, in the smoothing step S20, the surface roughness Ra of the surface to be joined is preferably smoothed to 1 nm or less, for example.

For the removal of a surface layer, for example, sputter etching by using an ion beam, plasma, or the like can be applied. The surface after the sputter etching is in a state where the surface easily reacts with surrounding gas molecules. An inert gas such as argon is used for the ion beam. Further, the process is performed in a vacuum chamber evacuated to a high vacuum. The surface after the sputter etching on which atoms having unbonding hands are exposed is in an active state having a large bonding force with other atoms. Strong joining can be obtained at room temperature by joining them.

In a room-temperature junction applicable to the manufacturing method of the semiconductor substrate structure according to the fourth embodiment, in the joining step S21 of the polycrystal substrate and the buffer layer, contaminant layers are removed by means of etching in a vacuum chamber evacuated to a high vacuum. The contaminant layers cover the surfaces to be joined of both of the polycrystal substrate 510 and the buffer layer 513. Accordingly, the surfaces to be joined are cleaned (etching step S211). The etching step S211 is performed by irradiating an object with a fast atom beam emitted from an argon fast ion beam generator.

The cleaned polycrystal substrate 510 and the buffer layer 513 both of which have been subjected to the etching step S211 are in an active state in which bonds are exposed. The polycrystal substrate 510 and the buffer layer 513 in the active state are brought into contact with each other in a vacuum chamber. Accordingly, bonds existing on the surface in an active state are connected to each other, and the polycrystal substrate 510 and the buffer layer 513 can be joined (joining step S212).

In the joining step S22 of the epitaxial growth layer and the buffer layer also, similar to the joining step S21 of the polycrystal substrate and the buffer layer, an etching step S221 is performed. In the etching step S221, the surfaces of the buffer layer 513 and the epitaxial growth layer 512 are cleaned to make them active. Accordingly, a joining step S222 for joining the buffer layer 513 and the epitaxial growth layer 512 is performed.

In accordance with the manufacturing method of the semiconductor substrate structure according to the fourth embodiment, since the damage to a junction interface is small, productivity with a high yield can be obtained.

Withstanding Voltage Simulation of Device

Figure 31:
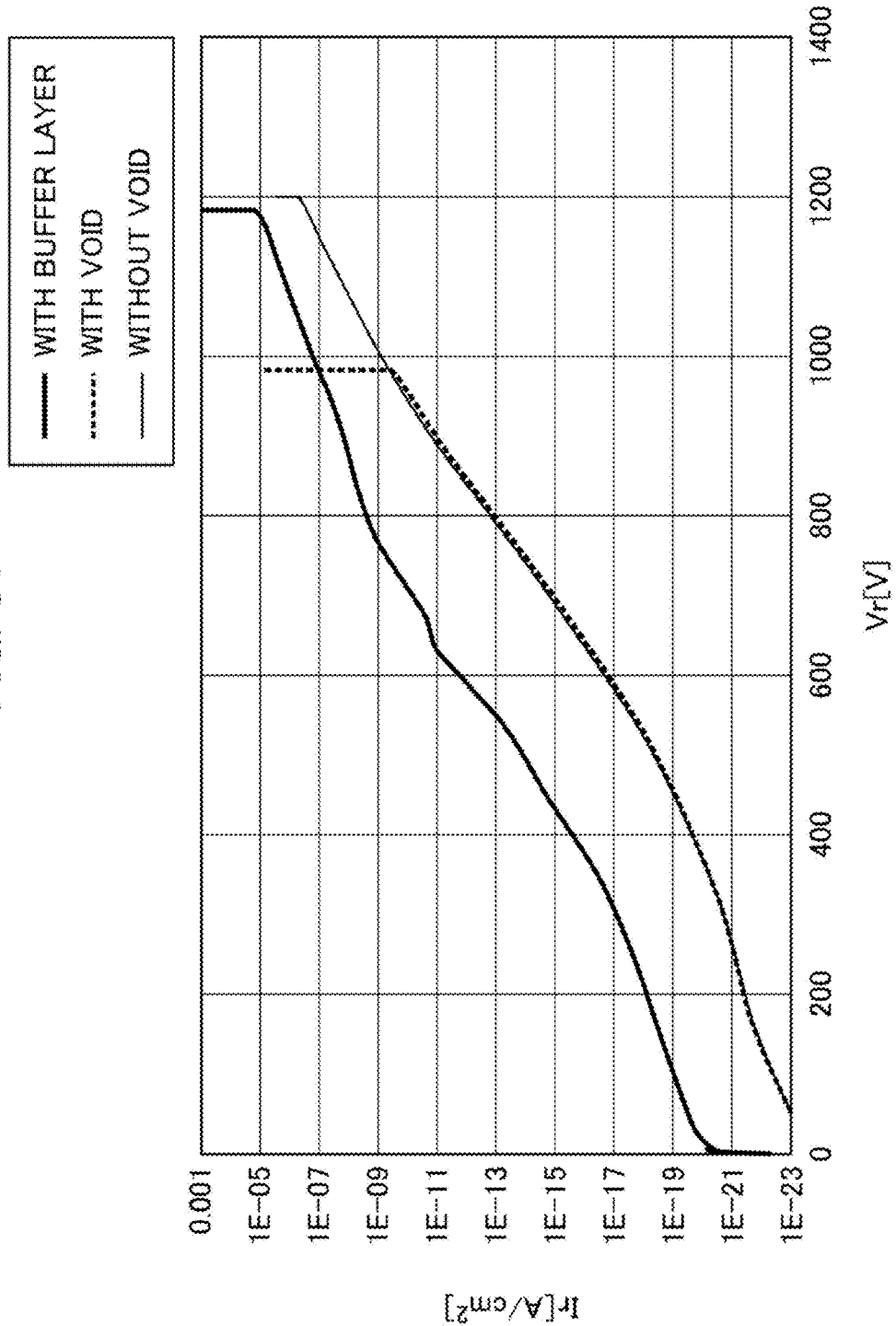
FIG. 31 is a graph showing simulation results of voltage-current density characteristics of a simulation model of a Schottky barrier diode using a semiconductor substrate structure according to a fourth embodiment, a simulation model of a Schottky barrier diode which has no defect at an interface between a substrate and an epitaxial growth layer and does not include a buffer layer, and a simulation model of a Schottky barrier diode which has a defect at an interface between a substrate and an epitaxial growth layer and does not include a buffer layer.

FIG. 31 is a graph showing the simulation results of the voltage-current density characteristics when a reverse bias is applied to the device. FIG. 31 shows a simulation model of a Schottky barrier diode using the semiconductor substrate structure according to the fourth embodiment ("with buffer layer"). FIG. 31 shows a simulation model of a Schottky barrier diode which has no defect at the interface between a substrate and an epitaxial growth layer and does not include a buffer layer ("without void"). FIG. 31 also shows a simulation model of a Schottky barrier diode which has a defect at the interface between a substrate and an epitaxial growth layer and does not include a buffer layer ("with void").

Figure 32A:
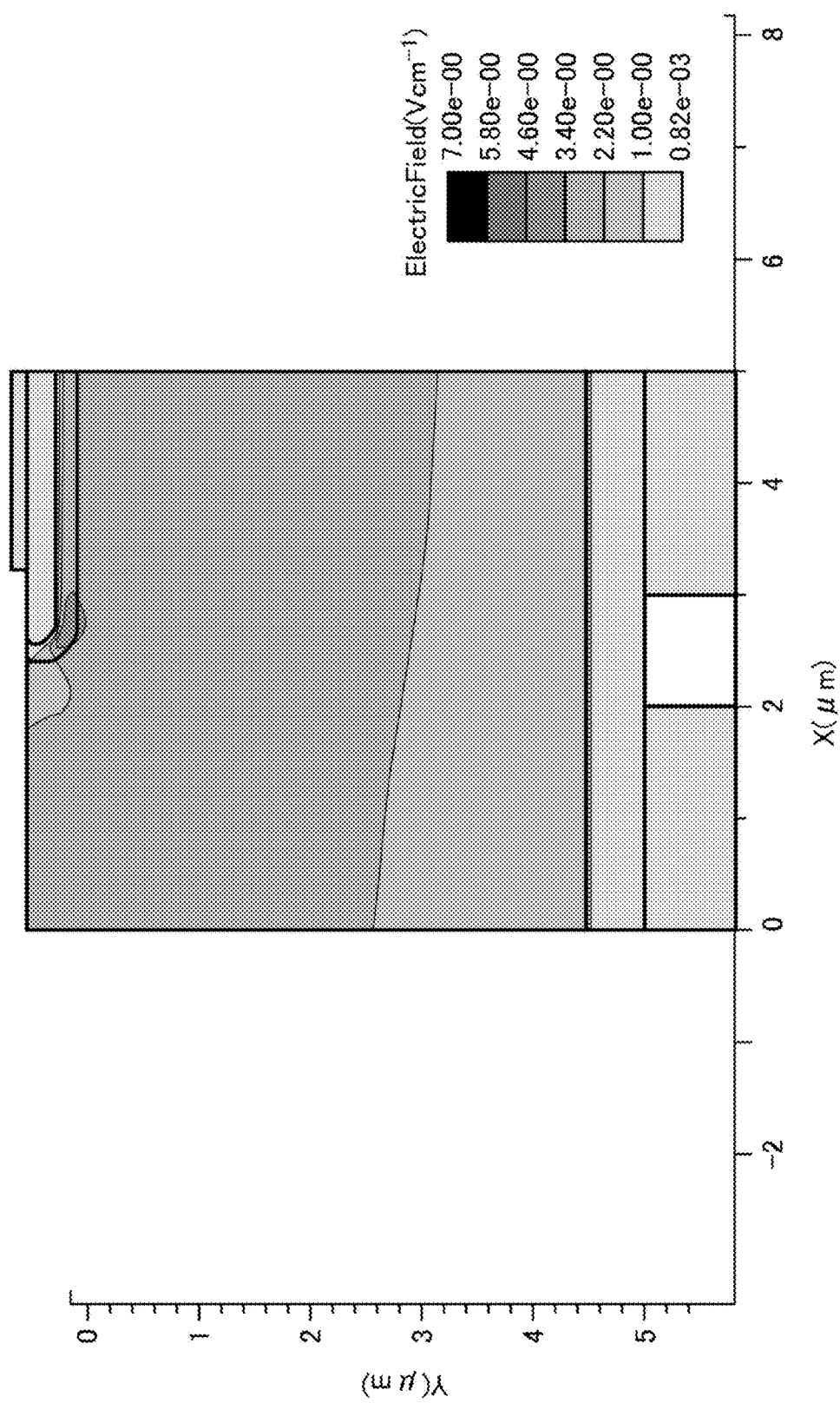
FIG. 32A is a simulation result of an electric field distribution in a state where a breakdown voltage is applied to each simulation model used in FIG. 31 and is a simulation result of each model of each Schottky barrier diode using a semiconductor substrate structure according to a fourth embodiment.
Figure 32B:
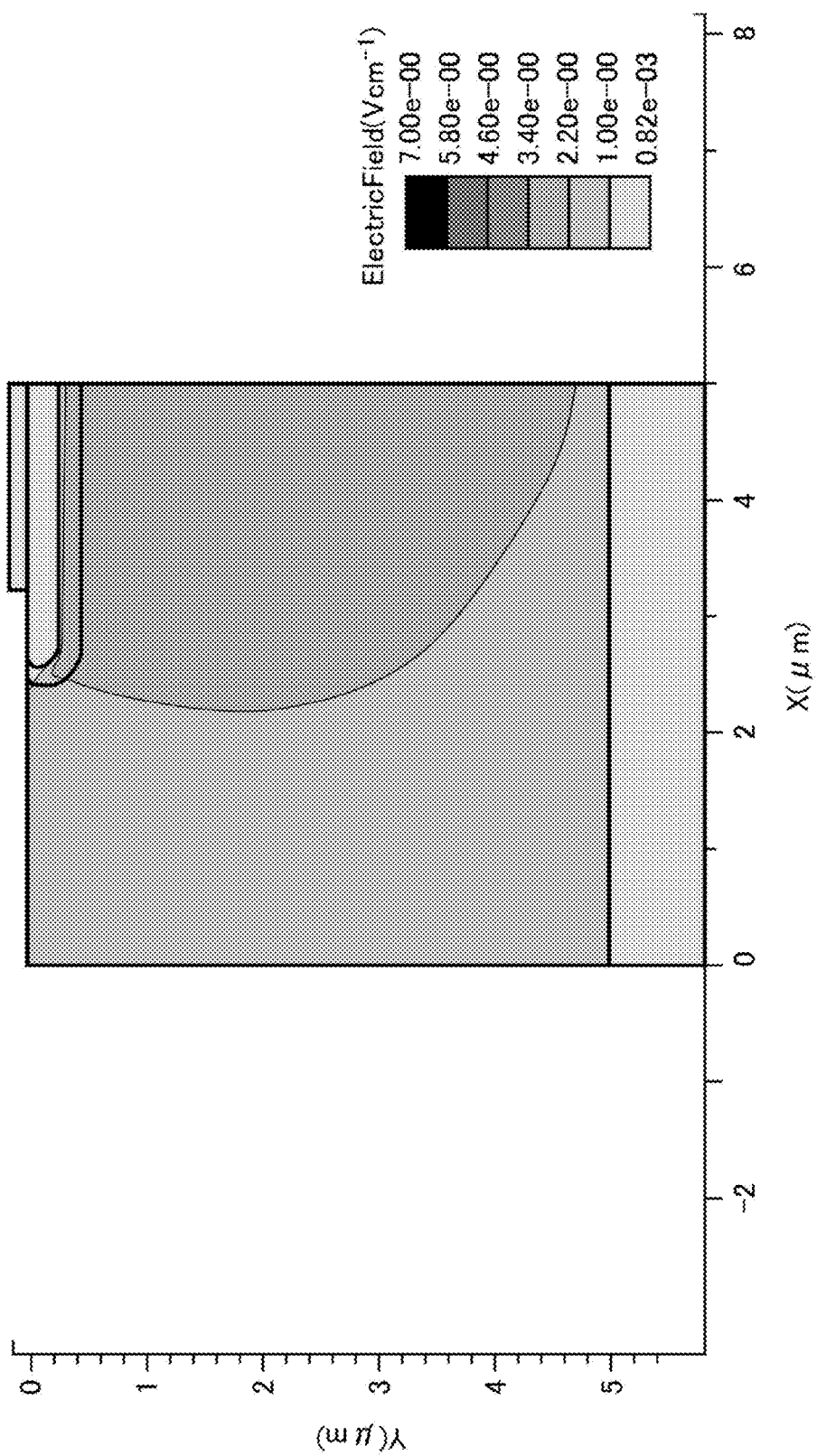
FIG. 32B is a simulation result of an electric field distribution in a state where a breakdown voltage is applied to each simulation model used in FIG. 31 and is a simulation result of a model of a Schottky barrier diode which has no defect at an interface between a substrate and an epitaxial growth layer and does not include a buffer layer.
Figure 32D:
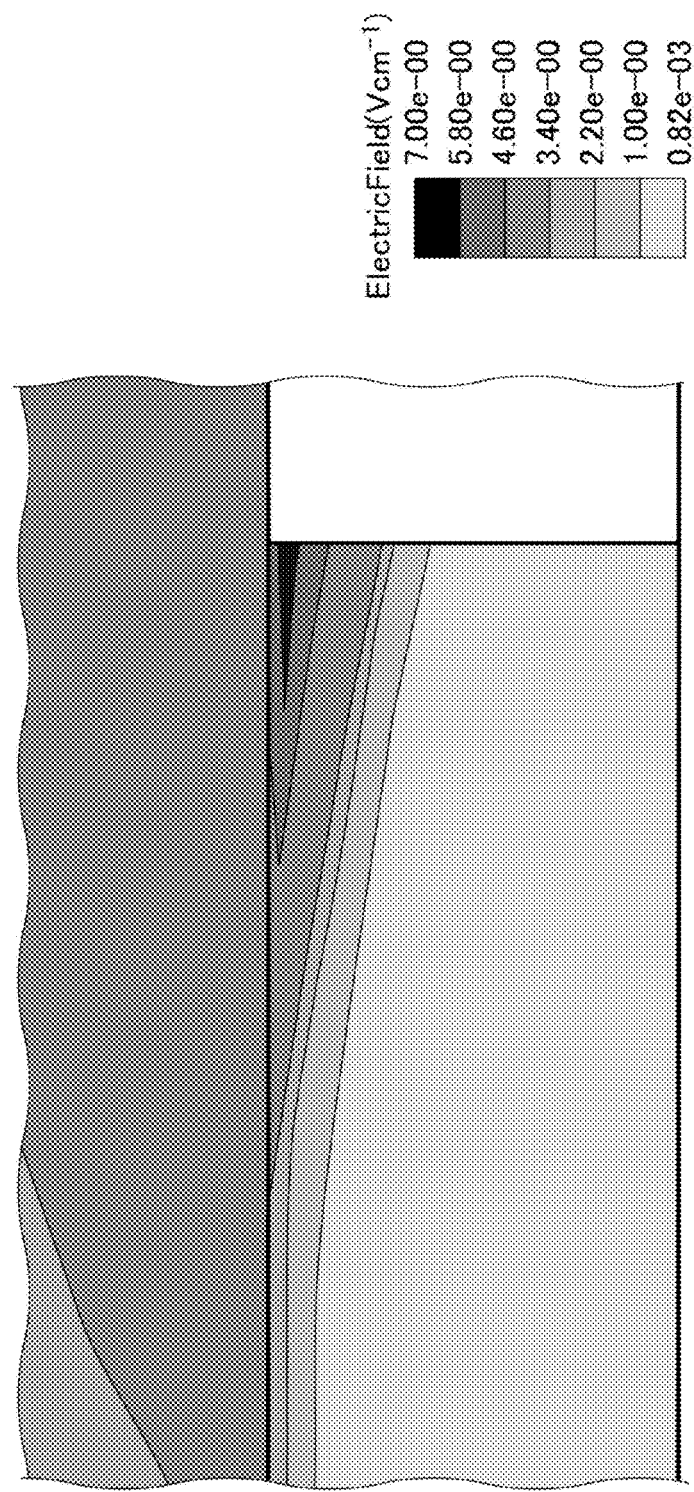
FIG. 32D is an enlarged view of a portion in the vicinity of a defect in a simulation result of FIG. 32C.

FIGS. 32A to 32D show simulation results of an electric field distribution in a state where a breakdown voltage is applied to each simulation model used in FIG. 31. FIG. 32A is a simulation result of a model of a Schottky barrier diode using the semiconductor substrate structure according to the fourth embodiment. FIG. 32B is a simulation result of a model of a Schottky barrier diode which has no defect at an interface between a substrate and an epitaxial growth layer and does not include a buffer layer. FIG. 32C is a simulation result of a model of a Schottky barrier diode which has a defect at an interface between a substrate and an epitaxial growth layer and does not include a buffer layer. FIG. 32D is an enlarged view of a portion in the vicinity of a defect in the simulation result of FIG. 32C. FIGS. 32A to 32C show enlarged views obtained by enlarging the range from a portion in the vicinity of the surface of the substrate where the electric field distribution greatly varies to an electrode arranged on the upper surface of the epitaxial growth layer.

By modeling a Schottky barrier diode using the semiconductor substrate structure according to the fourth embodiment, the withstanding voltage performance was investigated by device simulation. A specific simulation model will be described below.

The simulation models of all of the Schottky barrier diodes have the common configuration in which an upper layer is formed of a SiC layer and an electrode is formed on the upper surface of the upper layer. The SiC layer has a thickness of 5 µm, a width of 5 µm, and a dopant concentration of $1 \times 10^{15}/cm^3$ and does not include a defect.

The simulation model of "with buffer layer" of FIG. 31 and a simulation model of which simulation result is shown in FIG. 32A have a lower layer that is a SiC layer. The SiC layer has a width of 5 µm and a dopant concentration of $1 \times 10^{19}/cm^3$. A hole of 1 µm square is formed in the surface of the lower layer which is closer to the upper layer. The simulation model includes a buffer layer which is interposed between the upper layer and the lower layer. The buffer layer is formed of a SiC layer which has a thickness of 0.5 µm, a width of 5 µm, and a dopant concentration of $1 \times 10^{18}/cm^3$ and does not have a defect.

The simulation model of "with void" shown in FIG. 31 and simulation models of which simulation results are shown in FIG. 32C and FIG. 32D do not have a buffer layer. The above described simulation model differs from the simulation model of "with buffer layer" of FIG. 31 and the simulation model of which simulation result is shown in FIG. 32A only in the non-inclusion of a buffer layer.

The simulation model of "without void" shown in FIG. 31 and a simulation model of which simulation result is shown in FIG. 32B differ from the simulation model of "with buffer layer" in FIG. 31 and the simulation model of which simulation result is shown in FIG. 32A in not having a buffer layer and in not having a hole which is formed in the surface of the lower layer.

Simulation Result

With respect to the simulation results of the simulation model of "without void" in which a void is not formed in the surface of the substrate of FIG. 31 and a simulation model of which simulation result is shown in FIG. 32B, FIG. 31 shows the inherent withstanding voltage performance of the device. With respect to the simulation result of the simulation model of "with void" in which a void is formed in the surface of the substrate of FIG. 31 and a simulation model of which simulation result is shown in FIG. 32C, the withstanding voltage performance is lower than that in the case of "without void".

Meanwhile, the simulation result shown in FIG. 32A of the simulation model of "with buffer layer" in which the semiconductor substrate structure 501 according to the fourth embodiment is modeled shown in FIG. 31 shows that the withstanding voltage performance is significantly improved.

With respect to the simulation model of "without void", as shown in FIGS. 32C and 32D, electric field concentration occurs around the position at which a void contacts with an interface between a layer having a low dopant concentration on which an upper electrode is formed and the substrate having a high dopant concentration. Meanwhile, with respect to the simulation model of "with buffer layer", a buffer layer having a high dopant concentration and in which no void is formed is joined with the substrate surface. Therefore, electric field concentration around the position in contact with a void is prevented even if a void exists in the substrate surface, and the withstanding voltage performance is greatly improved.

As described above, the simulation result of the simulation model of "with buffer layer" in which the semiconductor substrate structure according to the fourth embodiment is modeled shows that the withstanding voltage performance of the device using the semiconductor substrate structure according to the fourth embodiment is significantly improved, and the reliability of the device is improved.

Therefore, in accordance with the semiconductor substrate structure 1 according to the fourth embodiment, as a substrate, a low-cost polycrystal substrate 510 can be used, for example, instead of using a high-cost single crystal substrate.

In the example of FIG. 29, an example of a SiC sintered compact is cited as the polycrystal substrate 510. However, the polycrystal substrate 510 is not limited to a sintered compact, and may be a SiC polycrystal body formed by means of CVD.

In this case, the voids 517 formed inside the polycrystal substrate 510 are greatly reduced. However, if the substrate is a polycrystal body, a concave portion may be formed on the surface due to degranulation or the like during the surface smoothing step S20. Therefore, the state of the surface may be the same as the state of "with void" in this simulation. Accordingly, even in the case of a device using a SiC polycrystal body created by means of CVD as the polycrystal substrate 510, the device can have enhanced withstanding voltage performance by adopting the configuration of the semiconductor substrate structure 501 according to the fourth embodiment.

SiC Sintered Compact Manufacturing Device

Figure 33:
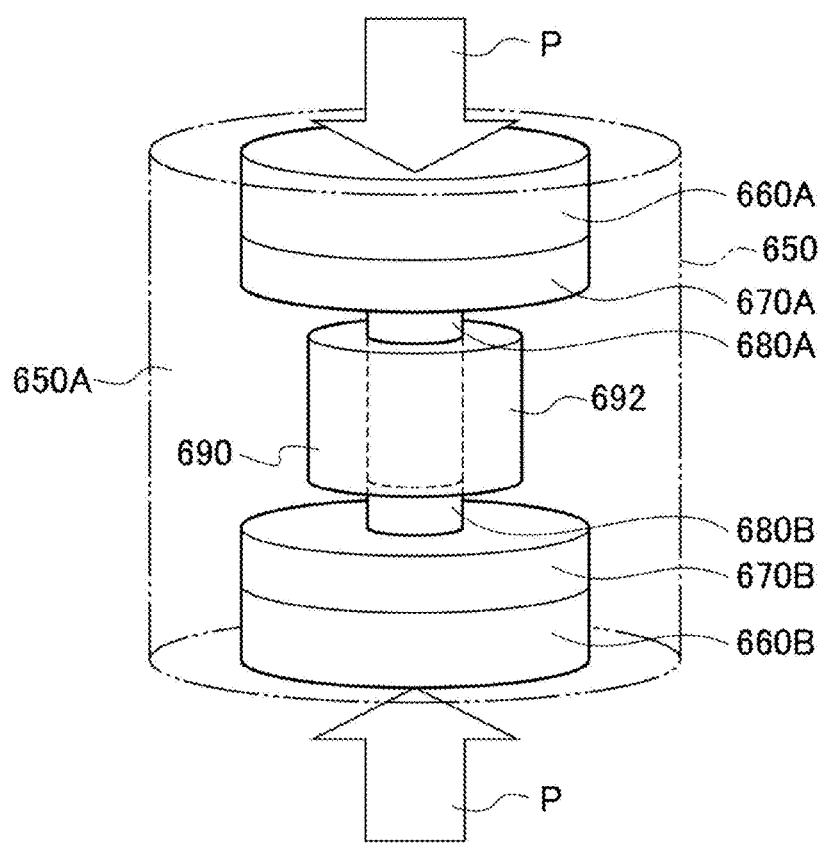
FIG. 33 is a schematic view showing a manufacturing device of a polycrystal body (SiC sintered compact) used in a semiconductor substrate structure according to a fourth embodiment.

FIG. 33 schematically shows a polycrystal body (SiC sintered compact) manufacturing device 650 used for the semiconductor substrate structure according to the fourth embodiment. The inside 650A of the polycrystal body (SiC sintered compact) manufacturing device 650 is a vacuum atmosphere of approximately several Pa or is replaced by Ar/N$_2$ gas.

The polycrystal body (SiC sintered compact) manufacturing device 650 employs a solid compression sintering method by means of hot press sintering (HP). A graphite sintering die (graphite die) 690 into which a powdery or solid SiC polycrystalline material 694 is filled is heated while being pressurized. A thermocouple or a radiation thermometer 692 is housed in the graphite die 690.

The graphite die 690 is connected to a pressure shaft 660A with a graphite bunch 680A and a graphite spacer 670A therebetween and is connected to a pressure shafts 660B with a graphite bunch 680B and a graphite spacer 670B therebetween. The SiC polycrystalline material 694 is pressurized and heated by pressurizing between the pressure shafts 660A and 660B. The heating temperature is, for example, about 200° C. to 350° C., and the pressure P is, for example, about 50 MPa at maximum. In addition to hot press sintering (HP), for example, spark plasma sintering (SPS) may be applied.

In accordance with the polycrystal body (SiC sintered compact) manufacturing device 650 of the semiconductor substrate structure according to the fourth embodiment, since the heating range is limited, the temperature rise and cooling can be performed more rapidly than the atmospheric heating of an electric furnace, or the like (several minutes to several hours). It is possible to fabricate a dense SiC sintered compact with suppressed grain growth due to the pressurization and rapid temperature rise. The device is applicable not only to sintering but also to sintering joining, porous material sintering, and the like.

The semiconductor substrate structure 1 according to the fourth embodiment described above can be used, for example, for manufacturing various SiC semiconductor elements. Examples of these include a SiC Schottky barrier diode (SBD), a SiC trench gate (T) type metal oxide semiconductor field effect transistor (MOSFET), and a SiC planar gate type MOSFET.

SiC-SBD

Figure 34:
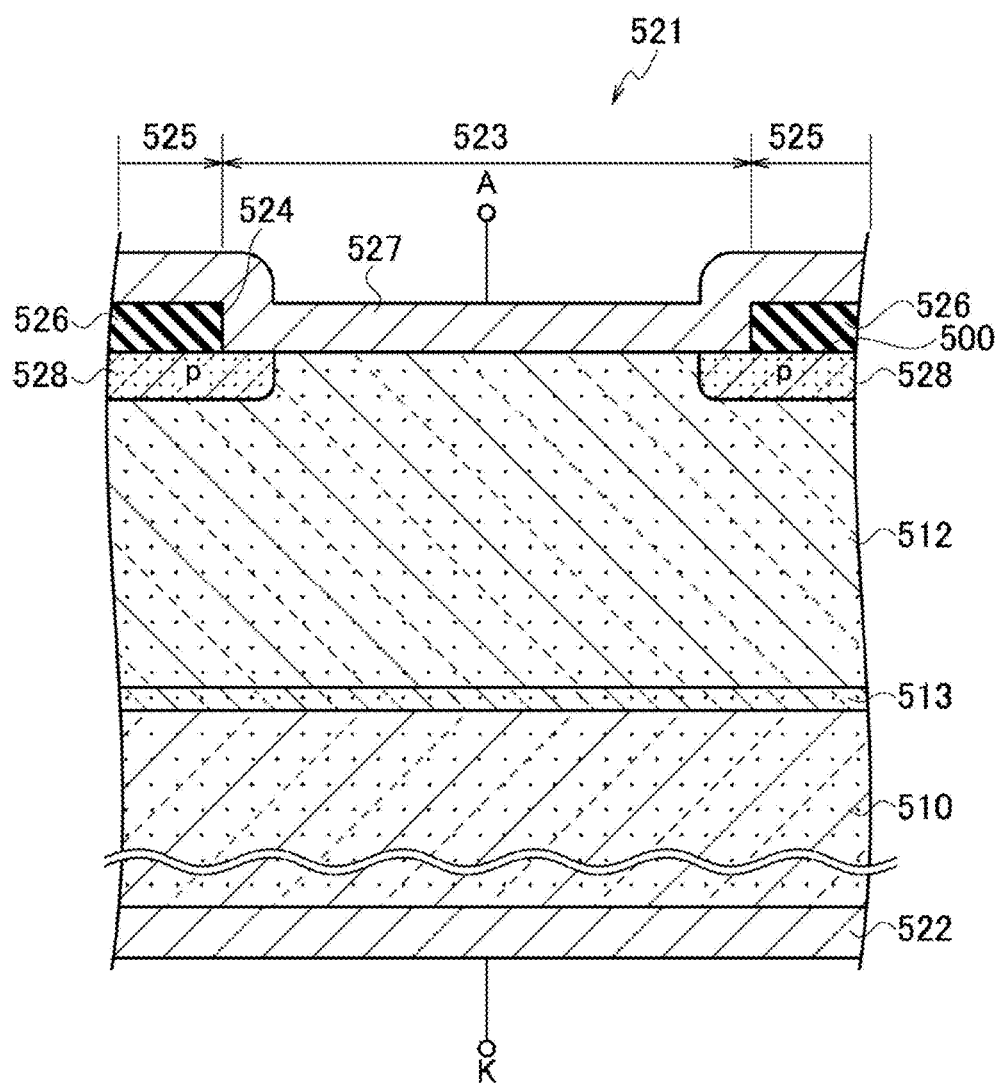
FIG. 34 is a schematic cross-sectional structural view showing a Schottky barrier diode which is fabricated by using a semiconductor substrate structure according to a fourth embodiment.

A SiC-SBD 521 is fabricated by using the semiconductor substrate structure according to the fourth embodiment. As shown in FIG. 34, the SiC-SBD 521 includes a semiconductor substrate structure 501 which has a SiC sintered compact 510, a SiC epitaxial growth layer 512, and a buffer layer 513. Both of the joining between the SiC sintered compact 510 and the buffer layer 513 and the joining between the buffer layer 513 and the SiC epitaxial growth layer 512 are performed by means of a room-temperature junction. A junction interface layer 514 may be interposed between the SiC sintered compact 510 and the buffer layer 513 or between the buffer layer 513 and the SiC epitaxial growth layer 512.

A large amount of n-type impurities corresponding to an (n+)-type semiconductor (for example, an impurity density of about $1 \times 10^{18}$ cm$^{-3}$ to about $1 \times 10^{21}$ cm$^{-3}$) are doped to the SiC sintered compact 510 and the buffer layer 513. A small amount of n-type impurities corresponding to an (n−)-type semiconductor (for example, an impurity density of about $5 \times 10^{14}$ cm$^{-3}$ to about $5 \times 10^{16}$ cm$^{-3}$) are doped to the SiC epitaxial growth layer 512.

Further, the SiC epitaxial growth layer 512 may be made of a material of any one of 4H—SiC, 6H—SiC, 2H—SiC, or 3C—SiC. Alternatively, instead of the SiC sintered compact 510, the SiC-SBD may have any one of BN, AlN, Al$_2$O$_3$, Ga$_2$O$_3$, diamond, carbon, or graphite.

As an n-type doping impurity, N (nitrogen), P (phosphorus), As (arsenic), or the like can be applied, for example.

As a p-type doping impurity, for example, Al (aluminum), or the like can be applied.

A cathode electrode 522 is formed on the back surface of the SiC sintered compact 510 so as to cover the entire area of the back surface. The cathode electrode 522 is connected to a cathode terminal K.

Contact holes 524 are formed in the surface 500 (for example, a (0001) plane (Si plane)) of the SiC epitaxial growth layer 512, the contact holes 524 being for exposing a part of the SiC epitaxial growth layer 512 as an active region 523. Field insulating films 526 are formed in field regions 525 which surround the active region 523.

The field insulating films 526 are made of SiO$_2$ (silicon oxide), but may be made of other insulating materials such as silicon nitride (SiN). An anode electrode 527 is formed on the field insulating films 526. The anode electrode 527 is connected to an anode terminal A.

P-type JTE (junction termination extension) structures 528 are formed at a portion in the vicinity of the surface 500 (surface layer portion) of the SiC epitaxial growth layer 512 so as to be in contact with the anode electrode 527. The JTE structures 528 are formed along the contours of the contact holes 524 so as to straddle the inside and outside of the contact holes 524 in the field insulating films 526.

SiC-TMOSFET

Figure 35:
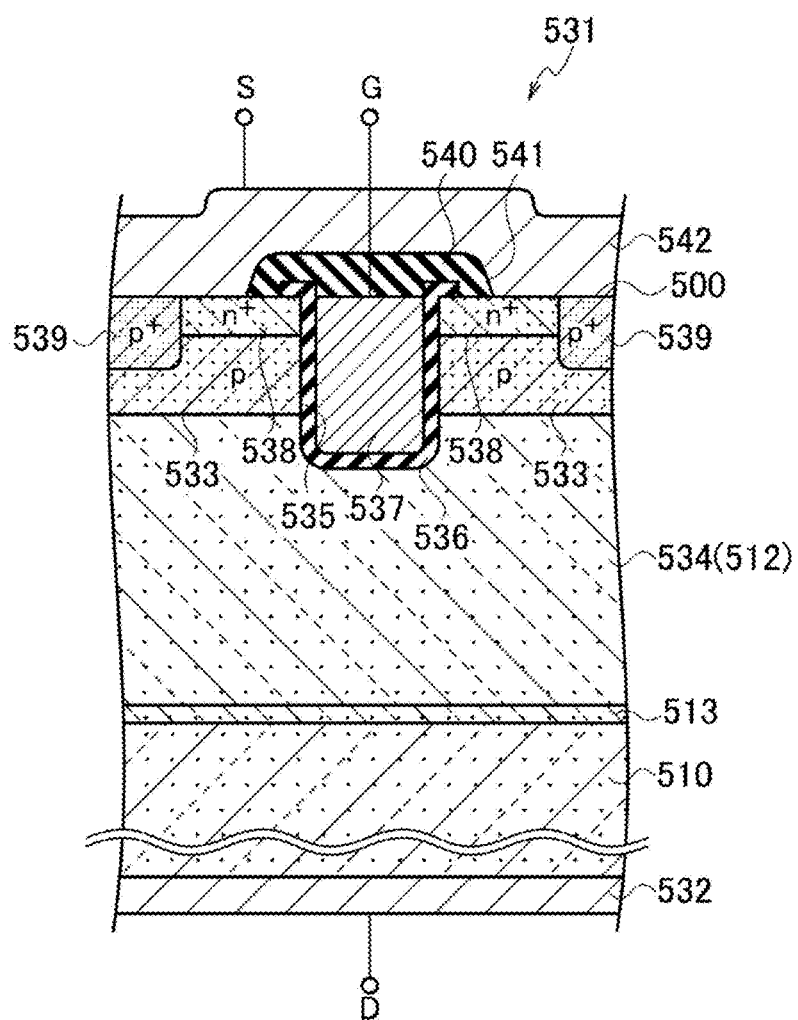
FIG. 35 is a schematic cross-sectional structural view showing a trench gate type MOSFET which is fabricated by using a semiconductor substrate structure according to a fourth embodiment.

A trench gate type MOSFET 531 is fabricated by using the semiconductor substrate structure according to the fourth embodiment. As shown in FIG. 35, the trench gate type MOSFET 531 includes a semiconductor substrate structure 501 which has a SiC sintered compact 510, a SiC epitaxial growth layer 512, and a buffer layer 513. Both of the joining between the SiC sintered compact 510 and the buffer layer 513 and the joining between the buffer layer 513 and the SiC epitaxial growth layer 512 are performed by means of a room-temperature junction. A junction interface layer 514 may be interposed between the SiC sintered compact 510 and the buffer layer 513 or between the buffer layer 513 and the SiC epitaxial growth layer 512.

A large amount of n-type impurities corresponding to an (n+)-type semiconductor (for example, an impurity density of about $1\times10^{18}$ cm$^{-3}$ to about $1\times10^{21}$ cm$^{-3}$) are doped to the SiC sintered compact 510 and the buffer layer 513. A small amount of n-type impurities corresponding to an (n−)-type semiconductor (for example, an impurity density of about $5\times10^{14}$ cm$^{-3}$ to about $5\times10^{16}$ cm$^{-3}$) are doped to the SiC epitaxial growth layer 512.

Further, the SiC epitaxial growth layer 512 may be made of a material of any one of 4H—SiC, 6H—SiC, 2H—SiC, or 3C—SiC.

Further, the MOSFET may contain any one of BN, AlN, $Al_2O_3$, $Ga_2O_3$, diamond, carbon, or graphite instead of the SiC sintered compact 510.

As an n-type doping impurity, for example, N (nitrogen), P (phosphorus), As (arsenic), or the like can be applied.

As a p-type doping impurity, for example, Al (aluminum), or the like can be applied.

A drain electrode 532 is formed on the back surface ((000−1) plane, C plane) of the SiC sintered compact 510 so as to cover the entire area of the back surface. The drain electrode 532 is connected to a drain terminal D.

P-type (for example, an impurity density of about $1\times10^{16}$ cm$^{-3}$ to about $1\times10^{19}$ cm$^{-3}$) body regions 533 are formed at a portion in the vicinity of the surface 500 ((0001) plane, Si plane) of the SiC epitaxial growth layer 512. A portion of the SiC epitaxial growth layer 512 which is closer to the SiC sintered compact 510 than the body regions 533 is an (n−)-type drain region 534 (512) in which the state of the SiC epitaxial growth layer is maintained.

A gate trench 535 is formed in the SiC epitaxial growth layer 512. The gate trench 535 extends from the surface 500 of the SiC epitaxial growth layer 512, penetrates the body regions 533, and has the deepest portion which reaches the drain region 534.

A gate insulating film 536 is formed on the inner surface of the gate trench 535 and the surface 500 of the SiC epitaxial growth layer 512 so as to cover the entire inner surface of the gate trench 535. A gate electrode 537 is embedded in the gate trench 535 by filling the inside of the gate insulating film 536 with, for example, polysilicon. A gate terminal G is connected to the gate electrode 537.

There are (n+)-type source regions 538 forming a part of the side surfaces of the gate trench 535 formed at the surface layer portions of the body regions 533.

In the SiC epitaxial growth layer 512, (p+)-type (for example, an impurity density of about $1\times10^{18}$ cm$^{-3}$ to about $1\times10^{21}$ cm$^{-3}$) body contact regions 539 are formed. The body contact regions 539 extend from the surface 500, penetrate the source regions 538, and are connected to the body regions 533.

An interlayer insulating film 540 made of $SiO_2$ is formed on the SiC epitaxial growth layer 512. A source electrode 542 is connected to the source regions 538 and the body contact regions 539 through contact holes 541 formed in the interlayer insulating film 540. A source terminal S is connected to the source electrode 542.

A predetermined voltage (voltage equal to or higher than a gate threshold voltage) is applied to the gate electrode 537 while a predetermined potential difference is generated between the source electrode 542 and the drain electrode 532 (between source and drain). This can form channels at portions in the vicinity of interfaces between the gate insulating film 536 and the body regions 533 due to an electric field from the gate electrode 537. Accordingly, a current can flow between the source electrode 542 and the drain electrode 532, and the SiC-TMOSFET 531 can be turned on.

SiC Planar Gate MOSFET

Figure 36:
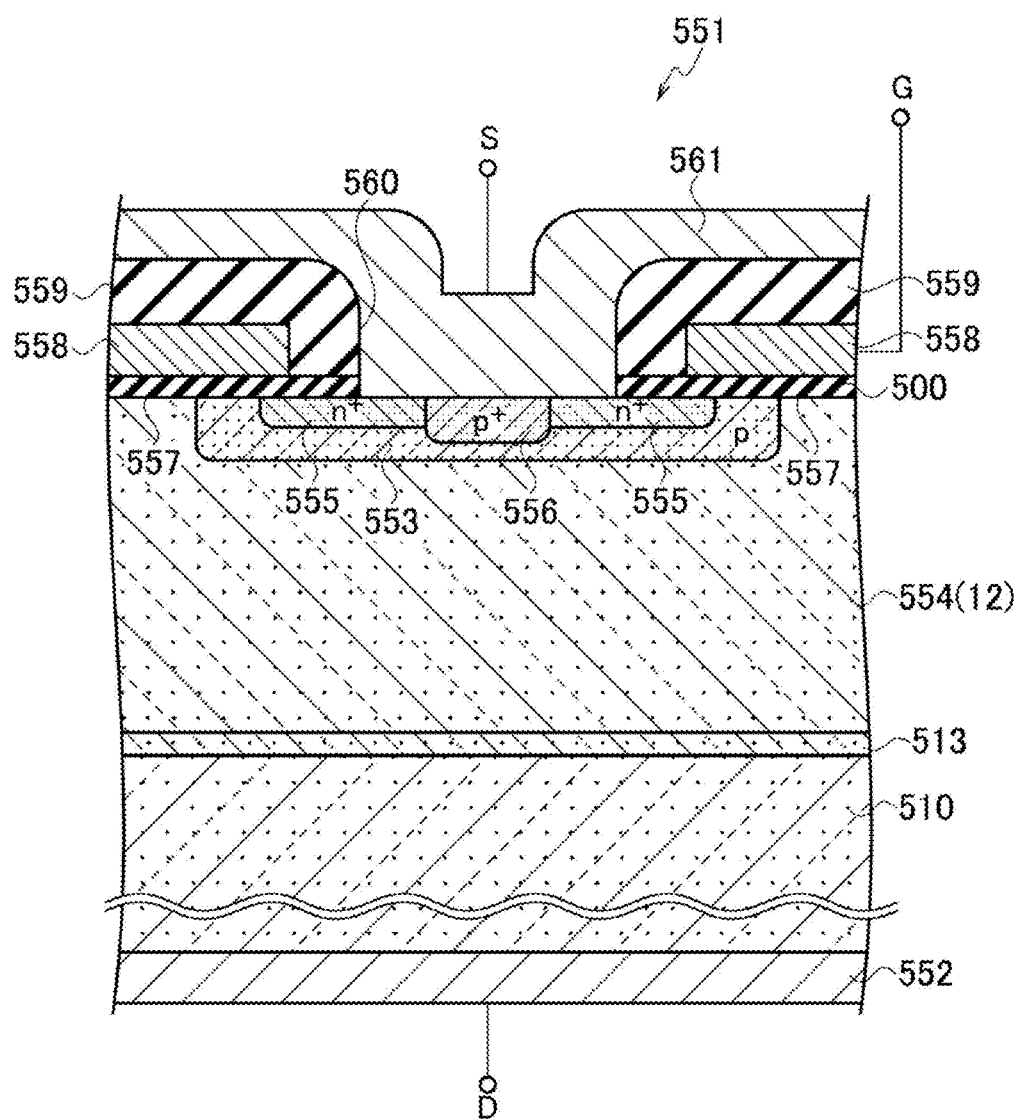
FIG. 36 is a schematic cross-sectional structural view showing a planar gate MOSFET which is fabricated by using a semiconductor substrate structure according to a fourth embodiment.

A planar gate MOSFET 551 is fabricated by using the semiconductor substrate structure 1 according to the fourth embodiment. As shown in FIG. 36, the planar gate MOSFET 551 includes a semiconductor substrate structure 501 that has a SiC sintered compact 510, a SiC epitaxial growth layer 512, and a buffer layer 513. Both of the joining between the SiC sintered compact 510 and the buffer layer 513 and the joining between the buffer layer 513 and the SiC epitaxial growth layer 512 are performed by means of a room-temperature junction. A junction interface layer 514 may be interposed between the SiC sintered compact 510 and the buffer layer 513 or between the buffer layer 513 and the SiC epitaxial growth layer 512.

A large amount of n-type impurities corresponding to an (n+)-type semiconductor (for example, an impurity density of about $1\times10^{18}$ cm$^{-3}$ to about $1\times10^{21}$ cm$^{-3}$) are doped to the SiC sintered compact 510 and the buffer layer 513. A small amount of impurities corresponding to an (n−)-type semiconductor (for example, an impurity density of about $5\times10^{14}$ cm$^{-3}$ to about $5\times10^{16}$ cm$^{-3}$) are doped to the SiC epitaxial growth layer 512.

Further, the SiC epitaxial growth layer 512 may be made of a material of any one of 4H—SiC, 6H—SiC, 2H—SiC, or 3C—SiC. The structure may contain any one of BN, AlN, $Al_2O_3$, $Ga_2O_3$, diamond, carbon, or graphite instead of the SiC sintered compact 510.

As an n-type doping impurity, for example, N (nitrogen), P (phosphorus), As (arsenic), or the like can be applied.

As a p-type doping impurity, for example, Al (aluminum), or the like can be applied.

A drain electrode 552 is formed on the back surface ((000−1) plane) of the SiC sintered compact 510 so as to cover the entire area of the back surface. A drain terminal D is connected to the drain electrode 552.

A p-type (for example, an impurity density of about $1\times10^{16}$ cm$^{-3}$ to about $1\times10^{19}$ cm$^{-3}$) body region 553 is formed in a well shape at a portion in the vicinity of the surface 500 ((0001) plane) (surface layer portion) of the SiC epitaxial growth layer 512. A portion of the SiC epitaxial growth layer 512 which is closer to a SiC substrate 510 than the body region 553 is an (n−)-type drain region 554 (512) in which the same state as after the epitaxial growth is maintained.

At a surface layer portion of the body region 553, (n+)-type source regions 555 are formed. The source regions 555 have intervals thereto from peripheral edges of the body region 553.

A (p+)-type (for example, an impurity density of about $1\times10^{18}$ cm$^{-3}$ to about $1\times10^{21}$ cm$^{-3}$) body contact region 556 is formed inside the source regions 555. The body contact region 556 penetrates the source regions 555 in the depth direction and is connected to the body region 553.

Gate insulating films 557 are formed on the surface 500 of the SiC epitaxial growth layer 512. The gate insulating films 557 cover portions (peripheral edge portions of the body region 553) surrounding the source regions 555 in the body region 553 and outer peripheral edges of the source regions 555.

Gate electrodes 558 made of, for example, polysilicon are formed on the gate insulating films 557. The gate electrodes 558 face peripheral edges of the body region 553 with the gate insulating films 557 being interposed therebetween. A gate terminal G is connected to each of the gate electrodes 558.

Interlayer insulating films 559 made of $SiO_2$ are formed on the SiC epitaxial growth layer 512. A source electrode 561 is connected to the source regions 555 and the body contact region 556 through contact holes 560 formed in the interlayer insulating films 559. A source terminal S is connected to the source electrode 561.

A predetermined voltage (voltage equal to or higher than a gate threshold voltage) is applied to the gate electrodes 558 while a predetermined potential difference is generated between the source electrode 561 and the drain electrode 552 (between source and drain). This can form channels at portions in the vicinity of interfaces between the gate insulating films 557 and the body region 553 due to an electric field from the gate electrode 558. Accordingly, a current can flow between the source electrode 561 and the drain electrode 552, and the planar gate MOSFET 551 can be turned on.

Although the fourth embodiment has been described above, other embodiments are also possible.

Although not shown in the drawings, a power semiconductor device can be manufactured by using the semiconductor substrate structure 501 according to the fourth embodiment, for example. Specifically, a vertical device structure can be manufactured by using the semiconductor substrate structure 501. That is, a vertical power semiconductor device may be formed. The vertical power semiconductor device includes a polycrystal substrate 510, an epitaxial growth layer 512 integrated with the polycrystal substrate 510, and a buffer layer 513. The buffer layer 513 is interposed between the polycrystal substrate 510 and the epitaxial growth layer 512 and joined with both of the polycrystal substrate 510 and the epitaxial growth layer 512. In the vertical power semiconductor device, the epitaxial growth layer 512 includes a first dopant and the buffer layer 513 includes a second dopant having the same conductivity type as the first dopant. In a semiconductor substrate structure 501 of the vertical power semiconductor device, the concentration of the second dopant contained in the buffer layer 513 is higher than the concentration of the dopant contained in the epitaxial growth layer 512. The vertical power semiconductor device includes a first metal electrode which is disposed on the surface of the substrate which faces a junction surface between the polycrystal substrate 510 and the buffer layer 513.

A vertical power semiconductor device further having a second metal electrode may be formed. The second metal electrode is disposed on the surface of the epitaxial growth layer 512 which faces a junction surface between the buffer layer 513 and the epitaxial growth layer 512.

Further, a lateral device structure can be manufactured by using the semiconductor substrate structure 501 according to the fourth embodiment, for example. That is, a lateral power semiconductor device may be formed. The lateral power semiconductor device includes a polycrystal substrate 510, an epitaxial growth layer 512 integrated with the polycrystal substrate 510, and a buffer layer 513. The buffer layer 513 is interposed between the polycrystal substrate 510 and the epitaxial growth layer 512 and joined with both of the polycrystal substrate 510 and the epitaxial growth layer 512. In the lateral power semiconductor device, the epitaxial growth layer 512 includes a first dopant and the buffer layer 513 includes a second dopant having the same conductivity type as the first dopant. In the semiconductor substrate structure 501 of the lateral power semiconductor device, the concentration of the second dopant contained in the buffer layer 513 is higher than the concentration of the dopant contained in the epitaxial growth layer 512. The lateral power semiconductor device includes a second metal electrode which is disposed on the surface of the epitaxial growth layer 512 which faces a junction surface between the buffer layer 513 and the epitaxial growth layer 512.

In the above described vertical or lateral power semiconductor device also, each of the epitaxial growth layer 512 and the buffer layer 513 may include at least one or more kinds selected from the group consisting of a group IV element semiconductor, a group III-V compound semiconductor, and a group II-VI compound semiconductor. Further, each of the epitaxial growth layer 512 and the buffer layer 513 may have at least one or more kinds selected from the group consisting of silicon carbide, gallium nitride, silicon, aluminum nitride, and gallium oxide.

In the above described vertical or lateral power semiconductor device also, the polycrystal substrate may include at least one or more kinds selected from the group consisting of a sintered compact, BN, AlN, $Al_2O_3$, $Ga_2O_3$, diamond, carbon, and graphite. Further, the sintered compact may include a sintered compact of at least one or more kinds selected from the group consisting of a group IV element semiconductor, a group III-V compound semiconductor, and a group II-VI compound semiconductor. The sintered compact may include a sintered compact of at least one or more kinds selected from the group consisting of silicon carbide, gallium nitride, silicon, aluminum nitride, and gallium oxide.

Further, although not shown in the drawings, a MOS capacitor can be manufactured by using the semiconductor substrate structure 1 according to the fourth embodiment, for example. The yield and reliability of a MOS capacitor can be enhanced.

Further, although not shown in the drawings, a bipolar transistor can be manufactured by using the semiconductor substrate structure 501 according to the fourth embodiment. In addition, the semiconductor substrate structure 501 according to the fourth embodiment can be used for manufacturing a SiC-pn diode, a SiC insulated gate bipolar transistor (IGBT), a SiC complementary MOSFET, and the like.

Figure 37:
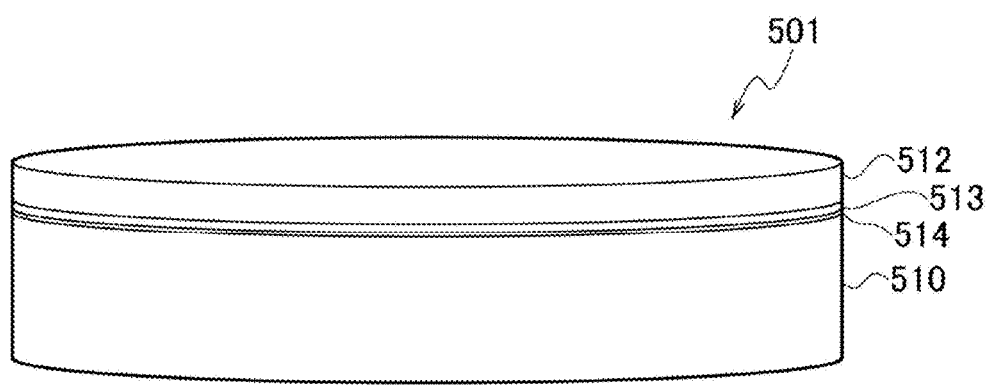
FIG. 37 is a schematic bird's-eye view showing a semiconductor substrate structure (wafer) according to a fourth embodiment.

FIG. 37 shows a schematic bird's-eye view structure of a semiconductor substrate structure (wafer) 501 according to the fourth embodiment. The semiconductor substrate structure 501 includes a polycrystal substrate 510, a buffer layer 513 joined with the polycrystal substrate 510, and an epitaxial growth layer 512 joined with the buffer layer 513. Both of the joining between the polycrystal substrate 510 and the buffer layer 513 and the joining between the buffer layer 513 and the epitaxial growth layer 512 are performed by means of a room-temperature junction. The room-temperature junction includes at least one or more kinds selected from a surface activated bonding, a plasma activated bonding, and an atomic diffusion bonding.

The joining between the polycrystal substrate 510 and the buffer layer 513 and the joining between the buffer layer 513 and the epitaxial growth layer 512 may be performed by means of a diffused junction.

If the room-temperature junction is used, the surface roughness Ra of the substrate surface is set to about 1 nm or less. As a result, the thickness of a junction interface layer 514 with different compositions is about 1 nm to 10 nm.

If the diffused junction is used, the surface roughness of the substrate surface may be rough depending on the material and the junction temperature. The thickness of the junction interface layer 514 with different composition gradients in which the atomic diffusion will be performed to use atomic diffusion is about 1 nm to 10 μm.

The epitaxial growth layer 512 may include at least one or more kinds selected from the group consisting of a group IV element semiconductor, a group III-V compound semiconductor, and a group II-VI compound semiconductor.

The epitaxial growth layer 512 may include at least one or more kinds selected from the group consisting of silicon carbide, gallium nitride, silicon, aluminum nitride, and gallium oxide.

Further, the SiC epitaxial growth layer may be made of a material of any one of 4H—SiC, 6H—SiC, 2H—SiC, or 3C—SiC.

The buffer layer 513 may include at least one or more kinds selected from the same group as the epitaxial growth layer 512. However, as long as the conductivity type is the same as that of the epitaxial growth layer 512, the layer may contain a dopant of the same kind or a dopant of a different kind.

The polycrystal substrate 510 may include at least one or more kinds selected from the group consisting of a sintered compact, BN, AlN, $Al_2O_3$, $Ga_2O_3$, diamond, carbon, and graphite.

The sintered compact may include a sintered compact of at least one or more kinds selected from the group consisting of a group IV element semiconductor, a group III-V compound semiconductor, and a group II-VI compound semiconductor. Further, the sintered compact may include a sintered compact of at least one or more kinds selected from the group consisting of silicon carbide, gallium nitride, silicon, aluminum nitride, and gallium oxide.

The thickness of the polycrystal substrate (SiC sintered compact) 510 may be, for example, about 200 μm to about 500 μm. The thickness of the SiC epitaxial growth layer 512 may be, for example, about 4 μm to about 100 μm. The thickness of the SiC buffer layer 513 may be, for example, about 0.5 μm to about 1 μm.

SiC Epitaxial Wafer

The SiC epitaxial growth layer 512 and the SiC buffer layer 513 are made of, for example, 4H—SiC epitaxially grown by means of CVD, and may have an off angle of less than 4 degrees. Specifically, the SiC epitaxial growth layer 512 and the SiC buffer layer 513 may be SiC single crystal epitaxial wafers which are manufactured by means of what is referred to as remote epitaxy. In the remote epitaxy, the material is epitaxially grown on a graphene layer formed on a SiC single crystal substrate and then the material is peeled off from the graphene layer.

Example of Crystal Structure

Figure 38A:
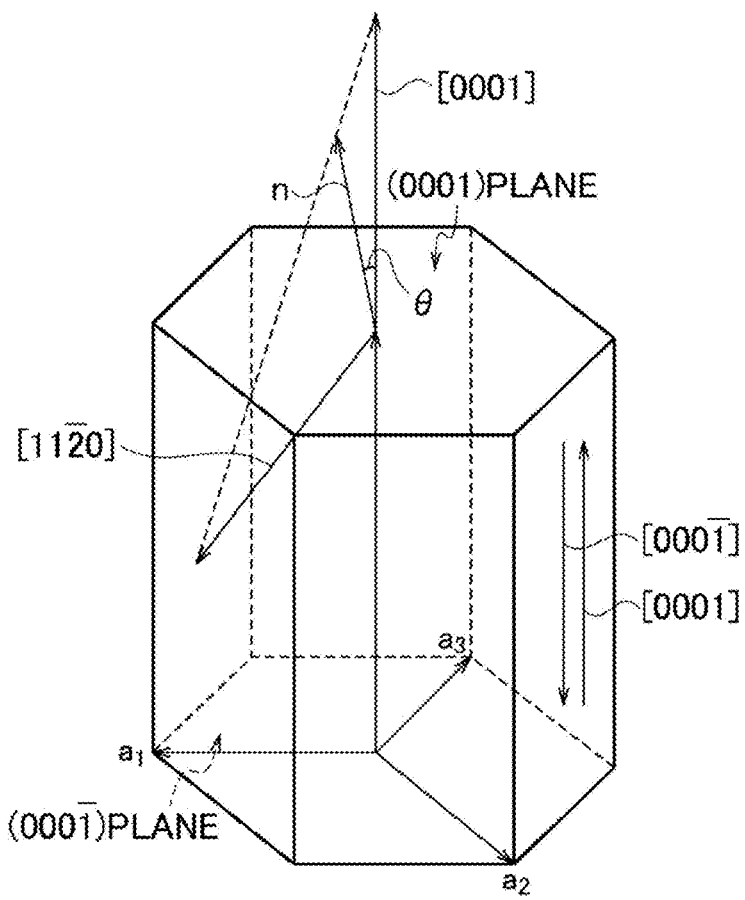
FIG. 38A is a schematic bird's-eye view of a unit cell of a 4H—SiC crystal applicable to a SiC epitaxial substrate of a semiconductor substrate structure according to a fourth embodiment.
Figure 38B:
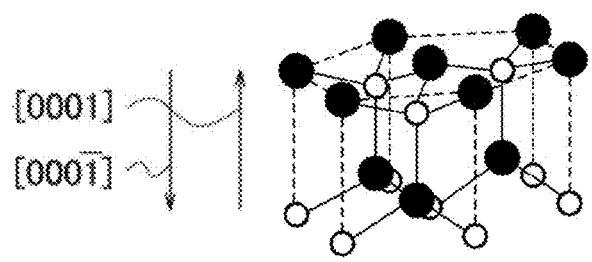
FIG. 38B is a diagram showing a schematic configuration of a two-layer portion of a 4H—SiC crystal.
Figure 38C:
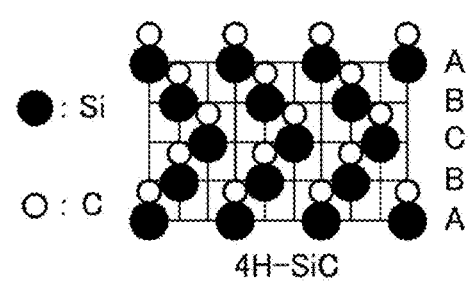
FIG. 38C is a diagram showing a schematic configuration of a four-layer portion of a 4H—SiC crystal.

FIG. 38A shows a schematic bird's-eye view structure of a unit cell of a 4H—SiC crystal applicable to the SiC epitaxial growth layer 512 and the SiC buffer layer 513. FIG. 38B shows a schematic configuration of a two-layer portion of a 4H—SiC crystal. FIG. 38C shows a schematic configuration of a four-layer portion of a 4H—SiC crystal.

Figure 39:
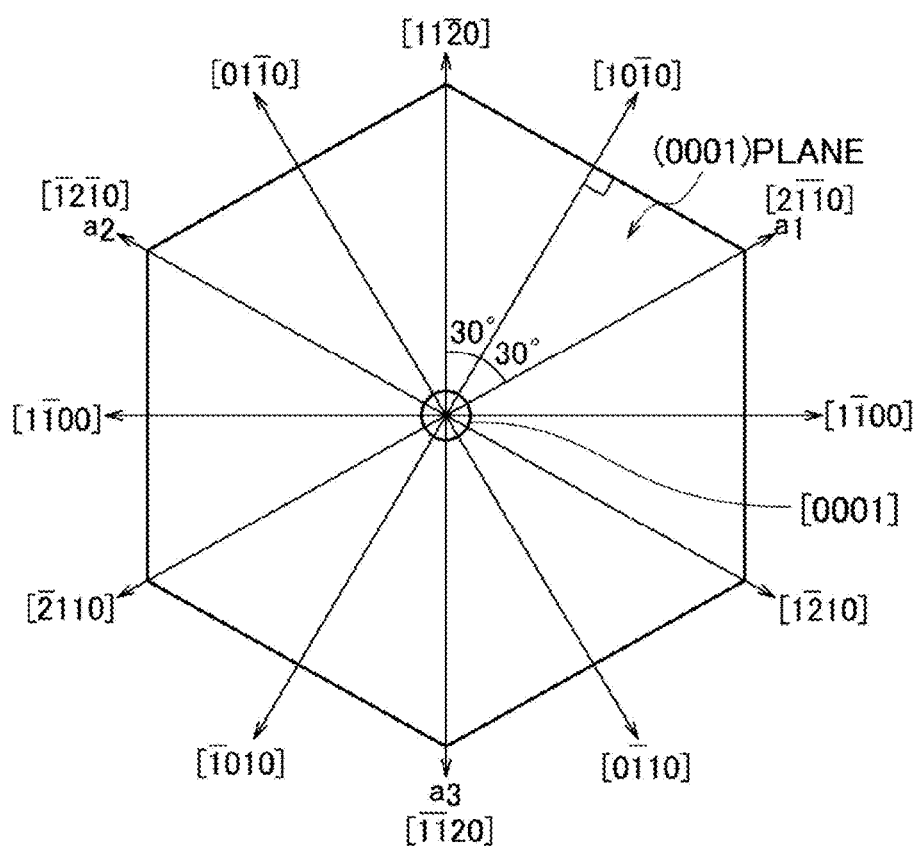
FIG. 39 is a diagram showing a schematic configuration in which a unit cell of a 4H—SiC crystal shown in FIG. 38A is viewed from directly above a (0001) plane.

FIG. 39 shows a schematic configuration in which the unit cell of the crystal structure of 4H—SiC shown in FIG. 38A is viewed from directly above a (0001) plane.

As shown in FIGS. 38A to 38C, the crystal structure of 4H—SiC can be approximated by a hexagonal system. Four C atoms are bonded to one Si atom. The four C atoms are located at four vertices of the tetrahedron with the Si atom being arranged in the center thereof. Among these four C atoms, one C atom is located in the direction of a axis relative to the Si atom. The remaining other three C atoms are located on the side of a [000−1] axis relative to the Si atom. In FIG. 38A, an off angle θ is, for example, about 4 degrees or less.

The axis and the [000−1] axis extend along the axial direction of a hexagonal cylinder. The face (top face of the hexagonal cylinder) having the axis as a normal is the (0001) plane (Si plane). Meanwhile, the face (lower face of the hexagonal cylinder) having the [000−1] axis as a normal is the (000−1) plane (C plane).

In addition, directions that are perpendicular to the axis and pass non-adjacent vertices of the hexagonal cylinder when viewed from directly above the (0001) plane are an a1 axis [2−1−10], an a2 axis [−12−10], and an a3 axis [−1−120].

As shown in FIG. 39, the direction passing a vertex between the a1 axis and the a2 axis is a [11−20] axis. The direction passing a vertex between the a2 axis and the a3 axis is a [−2110] axis. The direction passing a vertex between the a3 axis and the a1 axis is a [1−210] axis.

There are six axes, each of which is present between any two axes among the six axes passing the individual axes of the hexagonal cylinder and forms an angle of 30 degrees with the two axes on both sides thereof. The six axes are normals to the individual side faces of the hexagonal cylinder. Starting from an axis present between the a1 axis and the [11−20] axis, the six axes are, in clockwise order, a [10−10] axis, a [1−100] axis, a [0−110] axis, a [−1010] axis, a [−1100] axis, and a [01−10] axis. The faces (side faces of the hexagonal cylinder) having the six axes as normals are crystal planes perpendicular to the (0001) plane and the (000−1) plane.

A power semiconductor device having the semiconductor substrate structure according to the fourth embodiment may include any one of SiC based, Si based, GaN based, AlN based, and gallium oxide based IGBTs, diodes, MOSFETs, thyristors, and LED devices.

A power semiconductor device having the semiconductor substrate structure according to the fourth embodiment may include a configuration of any one of a 1-in-1 module, a 2-in-1 module, a 4-in-1 module, a 6-in-1 module, a 7-in-1 module, an 8-in-1 module, a 12-in-1 module, or a 14-in-1 module.

According to the fourth embodiment, it is possible to provide a semiconductor substrate structure having a stable interface structure even at a high temperature, and a power semiconductor device having the semiconductor substrate structure.

According to the fourth embodiment, it is possible to provide a semiconductor substrate structure capable of eliminating material constraints, reducing costs, and obtaining desired physical properties, and a power semiconductor device having the semiconductor substrate structure.

In accordance with the semiconductor substrate structure according to the fourth embodiment, a given substrate and a SiC epitaxial growth layer are bonded and joined together using a room-temperature junction technique instead of forming a SiC epitaxial growth layer on a SiC single crystal substrate. Therefore, the range of combinations of an epitaxial growth layer and a substrate can be expanded.

In accordance with the semiconductor substrate structure according to the fourth embodiment, as a substrate material, for example, a low-cost SiC polycrystal substrate or carbon substrate can be used instead of using a high-cost SiC single crystal substrate.

In accordance with the semiconductor substrate structure according to the fourth embodiment, as a substrate material, for example, a low-cost SiC polycrystal substrate or carbon substrate can be used instead of using a high-cost SiC single crystal substrate.

In addition, in accordance with the semiconductor substrate structure according to the fourth embodiment, it is possible to combine a substrate and a SiC epitaxial growth layer which have desired characteristics. This can enhance the characteristics of a power semiconductor device. Specifically, the thermal expansion coefficient, thermal conductivity, electrical conductivity, and mechanical characteristics can be made into the desired combination. Therefore, the switching characteristics, heat resistance, and mechanical reliability of a power semiconductor device can be enhanced.

In addition, in accordance with the semiconductor substrate structure according to the fourth embodiment and a power semiconductor device having the semiconductor substrate structure, a given substrate and a completed SiC epitaxial growth layer are bonded and joined together by using a room-temperature junction technique or a diffused junction technique. Therefore, the period of the process can be shortened. Further, the manufacturing yield can be enhanced because a given substrate can be combined with a completed SiC epitaxial growth layer.

Further, the semiconductor substrate structure according to the fourth embodiment and a power semiconductor device having the semiconductor substrate structure includes a SiC buffer layer having a higher dopant concentration than a SiC epitaxial growth layer. This can enhance the withstanding voltage of the semiconductor substrate structure. Accordingly, if the semiconductor substrate structure is applied to the device, the reliability of the device can be enhanced.

OTHER EMBODIMENTS

As noted above, some embodiments have been described, but the descriptions and drawings that form part of the disclosure are exemplary and should not be understood as limiting. Various alternative embodiments, examples, and operational techniques will become apparent to those skilled in the art from this disclosure.

In this way, the fourth embodiment includes various embodiments, and the like which are not described herein.

INDUSTRIAL APPLICABILITY

The present disclosure can be used for a Schottky barrier diode, a MOSFET, or the like made of SiC. Further, the present invention may be used for an n-channel IGBT made of SiC.

A semiconductor substrate structure and a power semiconductor device having the semiconductor substrate structure may be used for various semiconductor module techniques such as IGBT modules, diode modules, MOS modules (Si, SiC, GaN, AlN, and gallium oxide), and may be applicable to wide range of applications. The wide range of applications includes power modules for inverter circuits that drive electric motors used as power sources of electric vehicles (including hybrid vehicles), electric trains, industrial robots, and the like. The wide range of applications also include power modules for inverter circuits that convert electric power generated by solar cells, wind power generators, and other power generators (especially private power generators) into electric power for commercial power sources.

A semiconductor substrate structure and a power semiconductor device having the semiconductor substrate structure may be used for various semiconductor module techniques such as IGBT modules, diode modules, MOS modules (Si, SiC, GaN, AlN, and gallium oxide), and the like and may be applicable to wide range of applications. The wide range of applications include power modules for inverter circuits that drive electric motors used as power sources of electric vehicles (including hybrid vehicles), electric trains, industrial robots, and the like. The wide range of applications also include power modules for inverter circuits that convert electric power generated by solar cells, wind power generators, and other power generators (especially, private power generators) into electric power for commercial power sources.

The second embodiment may include the following configuration.

1.1 A semiconductor substrate comprising:
  a first substrate that is formed of a p-type SiC semiconductor and includes one surface as a junction surface; and
  a second substrate that is formed of an n-type SiC semiconductor and includes one surface as a junction surface, the junction surface being covered with a thin film of a p-type SiC semiconductor, wherein
  the junction surface of the first substrate and the junction surface of the second substrate are joined to each other with the thin film covering the junction surface of the second substrate therebetween.

1.2 The semiconductor substrate according to item 1.1, wherein the thin film has a thickness of 1 nm or more.

1.3 The semiconductor substrate according to item 1.1 or 1.2, wherein the first substrate is a single crystal substrate or a polycrystal substrate.

1.4 The semiconductor substrate according to any one of items 1.1 to 1.3, wherein the second substrate is a single crystal substrate.

1.5 A semiconductor device using the semiconductor substrate according to any one of items 1.1 to 1.4.

1.6 The semiconductor device according to item 1.5, comprising an n-channel IGBT that includes the first substrate as a p-type substrate layer and the second substrate as an n-type drift layer.

1.7 The semiconductor device according to item 1.6, further comprising a buffer layer that is a portion from the junction surface of the second substrate to a predetermined depth and includes an n-type impurity concentration of an n-type SiC semiconductor which is higher than a n-type impurity concentration of an n-type SiC semiconductor of other portions of the second substrate.

1.8 The semiconductor device according to item 1.6 or 1.7, wherein the n-channel IGBT includes a trench type gate.

1.9 A manufacturing method of the semiconductor substrate comprising the steps of:
  providing a first substrate that is formed of a p-type SiC semiconductor and includes one surface as a junction surface;

providing a second substrate that is formed of an n-type SiC semiconductor and includes one surface as a junction surface, the junction surface being covered with a thin film of a p-type SiC semiconductor; and joining the junction surface of the first substrate and the junction surface of the second substrate to each other with the thin film covering the junction surface of the second substrate therebetween.

1.10 The manufacturing method of the semiconductor substrate according to item 1.9, wherein
the thin film has a thickness of 1 nm or more.

1.11 The manufacturing method of the semiconductor substrate according to item 1.9 or 1.10, wherein
the first substrate is a single crystal substrate.

1.12 The manufacturing method of the semiconductor substrate according to item 1.11, wherein the step of providing the first substrate further includes a step of fabricating a single crystal p-type SiC semiconductor substrate by means of an epitaxy method.

1.13 The manufacturing method of the semiconductor substrate according to item 1.12, wherein the epitaxy method is a remote epitaxy method.

1.14 The manufacturing method of the semiconductor substrate according to item 1.11, wherein the step of providing the first substrate further includes a step of cutting a single crystal ingot to fabricate a single crystal p-type SiC semiconductor substrate.

1.15 The manufacturing method of the semiconductor substrate according to any one of items 1.9 to 1.13, wherein the first substrate is a polycrystal substrate.

1.16 The manufacturing method of the semiconductor substrate according to item 1.15, wherein the step of providing the first substrate further includes a step of fabricating a polycrystal p-type SiC semiconductor substrate by means of CVD growth.

1.17 The manufacturing method of the semiconductor substrate according to item 1.15, wherein the step of providing the first substrate further includes a step of sintering a powder material to fabricate a polycrystal p-type SiC semiconductor substrate.

1.18 The manufacturing method of the semiconductor substrate according to any one of items 1.9 to 1.17, wherein the second substrate is a single crystal substrate.

1.19 The manufacturing method of the semiconductor substrate according to item 1.18, wherein the step of providing the second substrate further includes a step of fabricating a single crystal n-type SiC semiconductor substrate by means of an epitaxy method.

1.20 The manufacturing method of the semiconductor substrate according to item 1.19, wherein the step of fabricating the single crystal n-type SiC semiconductor substrate further includes a step of forming a buffer layer that is a portion from the junction surface of the second substrate to a predetermined depth and includes an n-type impurity concentration which is higher than an n-type impurity concentration of other portions of a main part of the second substrate.

1.21 The manufacturing method of the semiconductor substrate according to item 1.19 or 1.20, wherein the epitaxy method is a remote epitaxy method.

1.22 The manufacturing method of the semiconductor substrate according to item 1.18, wherein the step of providing the second substrate further includes a step of cutting a single crystal ingot to fabricate a single crystal n-type SiC semiconductor substrate.

1.23 The manufacturing method of the semiconductor substrate according to any one of items 1.18 to 1.22, wherein the step of providing the second substrate further includes a step of forming a thin film of a single crystal n-type SiC semiconductor by means of an epitaxy method so as to cover the junction surface of the second substrate.

1.24 The manufacturing method of the semiconductor substrate according to any one of items 1.9 to 1.23 wherein the step of joining between the junction surface of the first substrate and the junction surface of the second substrate is joining between the first substrate and the second substrate by means of a room-temperature junction.

1.25 The manufacturing method of the semiconductor substrate according to any one of items 1.9 to 1.23, wherein the step of joining between the junction surface of the first substrate and the junction surface of the second substrate is joining between the first substrate and the second substrate by means of a diffused junction.

1.26 A manufacturing method of a semiconductor device comprising the steps of:

providing a semiconductor substrate by using the manufacturing method of the semiconductor substrate according to any one of items 1.19 to 1.25; and fabricating an n-channel IGBT that includes the first substrate of the semiconductor substrate as a p-type substrate layer and the main part of the second substrate as an n-type drift layer.

The third embodiment may include the following configuration.

2.1 A polycrystal silicon carbide substrate, comprising:
at least one of germanium and tin, and further a dopant of at least one selected from nitrogen, phosphorus, and boron.

2.2 The polycrystal silicon carbide substrate according to item 2.1, wherein a size of a crystallite contained in a polycrystal silicon carbide crystal particle is 100 nm or less.

2.3 The polycrystal silicon carbide substrate according to item 2.1 or 2.2, wherein a relative density is 99% or more.

2.4 A power semiconductor device, wherein the polycrystal silicon carbide substrate according to any one of items 2.1 to 2.3 is used for a support substrate.

2.5 The power semiconductor device according to item 2.4, wherein the power semiconductor device includes at least one or more kinds selected from the group consisting of a SiC Schottky barrier diode, a SiC-MOSFET, a SiC bipolar transistor, a SiC diode, a SiC thyristor, or a SiC insulated gate bipolar transistor.

2.6 A polycrystal silicon carbide ingot comprising:
at least one of germanium and tin, and further a dopant of at least one selected from nitrogen, phosphorus, and boron.

2.7 The polycrystal silicon carbide ingot according to item 2.6, wherein a size of a crystallite contained in a polycrystal silicon carbide crystal particle is 100 nm or less.

2.8 The polycrystal silicon carbide ingot according to item 2.6 or 2.7, wherein a relative density is 99% or more.

2.9 A manufacturing method of a polycrystal silicon carbide substrate comprising the steps of:

blending at least two kinds of either one or both of a compound of group IV-V elements and a compound of group III-IV elements into a powder of a silicon carbide that is a main material and preparing a mixed powder including an average particle diameter of 100 nm or less;

obtaining a polycrystal silicon carbide ingot by spark plasma sintering the mixed powder; and creating a polycrystal silicon carbide substrate by cutting the polycrystal silicon carbide ingot.

2.10 The manufacturing method of the polycrystal silicon carbide substrate according to item 2.9, wherein the compound of the group IV-V elements is a material of at least one or more kinds selected from the group consisting of $Si_3N_4$, $Ge_3N_4$, and $Sn_3N_4$.

2.11 The manufacturing method of the polycrystal silicon carbide substrate according to item 2.10, wherein the compound of the group III-IV elements is a material of at least one or more kinds selected from the group consisting of $B_4C$ and $SiB_4$.

The fourth embodiment may include the following configuration.

3.1 A semiconductor substrate structure comprising:
a polycrystal substrate;
a first epitaxial growth layer that is integrated with the polycrystal substrate; and
a second epitaxial growth layer that is interposed between the polycrystal substrate and the first epitaxial growth layer and is joined with both of the polycrystal substrate and the first epitaxial growth layer, wherein
the first epitaxial growth layer includes a first dopant and the second epitaxial growth layer includes a second dopant of the same conductivity type as the first dopant; and
a concentration of the second dopant is higher than a concentration of the first dopant.

3.2 The semiconductor substrate structure according to item 3.1, wherein the second epitaxial growth layer and the polycrystal substrate are joined to each other by means of a room-temperature junction.

3.3 The semiconductor substrate structure according to item 3.1 or 3.2, wherein the second epitaxial growth layer and the first epitaxial growth layer are joined to each other by means of a room-temperature junction.

4 The semiconductor substrate structure according to any one of items 3.1 to 3.3, wherein the concentration of the first dopant in the first epitaxial growth layer is $5\times10^{14}/cm^3$ or more and less than $2\times10^{17}/cm^3$, and the concentration of the second dopant in the second epitaxial growth layer is $2\times10^{17}/cm^3$ or more and $5\times10^{18}/cm^3$ or less.

3.5 The semiconductor substrate structure according to any one of items 3.1 to 3.4, wherein a thickness of the second epitaxial growth layer is 0.1 μm or more and 10 μm or less.

3.6 The semiconductor substrate structure according to any one of items 3.1 to 3.5, wherein each of the first epitaxial growth layer and the second epitaxial growth layer includes at least one or more kinds selected from the group consisting of a group IV element semiconductor, a group III-V compound semiconductor, and a group II-VI compound semiconductor.

3.7 The semiconductor substrate structure according to any one of items 3.1 to 3.5, wherein each of the first epitaxial growth layer and the second epitaxial growth layer includes at least one or more kinds selected from the group consisting of silicon carbide, gallium nitride, silicon, aluminum nitride, and gallium oxide.

3.8 The semiconductor substrate structure according to any one of items 3.1 to 3.7, wherein the polycrystal substrate includes at least one or more kinds selected from the group consisting of a sintered compact, BN, AlN, $Al_2O_3$, $Ga_2O_3$, diamond, carbon, and graphite.

3.9 The semiconductor substrate structure according to item 3.8, wherein the sintered compact includes a sintered compact of at least one or more kinds selected from the group consisting of a group IV element semiconductor, a group III-V compound semiconductor, and a group II-VI compound semiconductor.

3.10 The semiconductor substrate structure according to item 3.8, wherein the sintered compact includes a sintered compact of at least one or more kinds selected from the group consisting of silicon carbide, gallium nitride, silicon, aluminum nitride, and gallium oxide.

3.11 The semiconductor substrate structure according to any one of items 3.8 to 3.10, wherein the polycrystal substrate includes a dopant at a concentration of $5\times10^{18}/cm^3$ or more and $2\times10^{22}/cm^3$ or less.

3.12 The semiconductor substrate structure according to any one of items 3.8 to 3.11, wherein the polycrystal substrate has a thickness of 100 μm or more and 1000 μm or less.

3.13 The semiconductor substrate structure according to any one of items 3.8 to 3.12 wherein the polycrystal substrate and the second epitaxial growth layer form an ohmic junction.

3.14 The semiconductor substrate structure according to item 3.13, wherein each of the first epitaxial growth layer and the second epitaxial growth layer includes an epitaxial growth layer made of 4H—SiC and the epitaxial growth layer made of 4H—SiC includes a surface of a (000−1) plane or a (0001) plane.

3.15 The semiconductor substrate structure according to any one of items 3.1 to 3.14, wherein the polycrystal substrate includes a diameter of 100 mm or more.

3.16 A power semiconductor device comprising the semiconductor substrate structure according to any one of items 3.1 to 3.15.

3.17 The power semiconductor device according to item 3.16, wherein the power semiconductor device includes at least one or more kinds selected from the group consisting of a SiC Schottky barrier diode, a SiC-MOSFET, a SiC bipolar transistor, a SiC diode, a SiC thyristor, a SiC insulated gate bipolar transistor, and an LED device.

3.18 The power semiconductor device according to item 3.16, further comprising a first metal electrode that is disposed on a surface of the polycrystal substrate which faces a junction surface between the polycrystal substrate and the second epitaxial growth layer.

3.19 The power semiconductor device according to item 3.18, further comprising a second metal electrode that is disposed on a surface of the first epitaxial growth layer which faces a junction surface between the second epitaxial growth layer and the first epitaxial growth layer.

3.20 The power semiconductor device according to item 3.16, further comprising a second metal electrode that is disposed on a surface of the first epitaxial growth layer which faces a junction surface between the second epitaxial growth layer and the first epitaxial growth layer.

What is claimed is:

1. A semiconductor substrate comprising:
a first layer that is formed of a single crystal SiC semiconductor; and a second layer that is formed on a surface of the first layer and is formed of a SiC semiconductor which includes a polycrystalline structure, wherein the second layer also includes a single crystal SiC semiconductor, a portion of the second layer that is formed from the first layer to a predetermined height is formed of a single crystal SiC semiconductor, and a remainder of the second layer that is a portion formed beyond the predetermined height from the first layer is formed of a polycrystal SiC semiconductor, and an interface is not observed on the junction surface between the first layer and the second layer by TEM observation.

2. The semiconductor substrate according to claim 1, wherein the first layer is formed by means of epitaxial growth.

3. The semiconductor substrate according to claim 1, wherein the surface of the first layer is a [000-1]-oriented C plane or a [0001]-oriented Si plane of 4H—SiC.

4. The semiconductor substrate according to claim 1, wherein the second layer is formed of a polycrystal SiC semiconductor.

5. The semiconductor substrate according to claim 1, wherein the first layer has a thickness of 1 μm or more, the portion of the second layer which is formed from the first layer to the predetermined height has a thickness of 0.1 μm or more, and the remainder of the second layer which is the portion formed beyond the predetermined height from the first layer has a thickness of 10 μm or more.

6. A manufacturing method of a semiconductor substrate according to claim 1, comprising the steps of:

epitaxially growing a first layer formed of a single crystal SiC semiconductor on a surface of a base single crystal substrate;

growing a second layer formed of a SiC semiconductor which includes a polycrystalline structure on the first layer by means of CVD; and peeling off the first layer together with the second layer from above the base single crystal substrate.

7. The manufacturing method of the semiconductor substrate according to claim 6, wherein the step of epitaxially growing the first layer includes growing the first layer on the base single crystal substrate by means of remote epitaxy.

8. The manufacturing method of the semiconductor substrate according to claim 6, wherein a surface of the first layer is a [000-1]-oriented C plane or a [1000]-oriented Si plane of 4H—SiC.

9. The manufacturing method of the semiconductor substrate according to claim 6, wherein the step of growing the second layer by means of CVD includes forming a second layer that is formed of a polycrystal SiC semiconductor.

10. The manufacturing method of the semiconductor substrate according to claim 9, wherein the step of forming the second layer by means of CVD includes forming the second layer of a polycrystal SiC semiconductor by means of high-speed CVD.

11. The manufacturing method of the semiconductor substrate according to claim 6, wherein the step of growing the second layer by means of CVD includes forming a portion of the second layer which is formed from the first layer to a predetermined height, with a single crystal SiC semiconductor, and forming a remainder of the second layer which is a portion formed beyond the predetermined height from the first layer, with a polycrystal SiC semiconductor.

12. The manufacturing method of the semiconductor substrate according to claim 11, wherein the step of growing the second layer by means of CVD includes forming the remainder of the second layer which is the portion formed beyond the predetermined height from the first layer, with a polycrystal SiC semiconductor by means of high-speed CVD.

13. The manufacturing method of the semiconductor substrate according to claim 11, wherein the step of epitaxially growing the first layer includes growing the first layer to have a thickness of 1 μm or more, and the step of growing the second layer by means of CVD includes growing the portion of the second layer which is formed from the first layer to the predetermined height, to have a thickness of 0.1 μm or more and growing the remainder of the second layer which is the portion formed beyond the predetermined height from the first layer, to have a thickness of 10 μm or more.

14. The manufacturing method of the semiconductor substrate according to claim 6, wherein the first layer and the second layer are connected to each other without including an interface on a junction surface.

15. A semiconductor device comprising:

a semiconductor substrate, the semiconductor substrate including a first layer that is formed of a single crystal SiC semiconductor and a second layer that is formed on the first layer and is formed of a SiC semiconductor which includes a polycrystalline structure, wherein the first layer is formed as a drift layer, a portion of the second layer which is formed from the first layer to a predetermined height is formed as a buffer layer, and a remainder of the second layer which is a portion formed beyond the predetermined height from the first layer is formed as a substrate layer, and an interface is not observed on the junction surface between the first layer and the second layer by TEM observation.

16. The semiconductor device according to claim 15, wherein the first layer of the semiconductor substrate is formed by means of epitaxial growth.

17. The semiconductor device according to claim 15, wherein the drift layer has a thickness of 1 μm or more, the buffer layer has a thickness of 0.1 μm or more, and the substrate layer has a thickness of 10 μm or more.

18. The semiconductor device according to claim 15, wherein the second layer of the semiconductor substrate is formed of a polycrystal SiC semiconductor.

19. The semiconductor device according to claim 15, wherein the second layer of the semiconductor substrate also includes a single crystal SiC semiconductor, the buffer layer of the second layer is a single crystal layer, and the substrate layer of the second layer is a polycrystal layer.

20. The semiconductor device according to claim 15, wherein the semiconductor device includes at least one of a Schottky barrier diode, a MOSFET, an IGBT, and an LED.

21. A manufacturing method of a semiconductor device according to claim 15, comprising the steps of:
providing a semiconductor substrate, the semiconductor substrate including a first layer that is formed of a single crystal SiC semiconductor and a second layer that is formed on the first layer and is formed of a SiC semiconductor which includes a polycrystalline structure, the second layer being formed on a surface of the first layer by means of CVD growth; and
forming a semiconductor device by forming the first layer as a drift layer, forming a portion of the second layer which is formed from the first layer to a predetermined height, as a buffer layer, and forming a remainder of the second layer which is a portion formed beyond the predetermined height from the first layer, as a substrate layer.

22. The manufacturing method of the semiconductor device according to claim 21, wherein
the first layer of the semiconductor substrate is formed by means of epitaxial growth.

23. The manufacturing method of the semiconductor device according to claim 21, wherein
the drift layer has a thickness of 1 µm or more, the buffer layer has a thickness of 0.1 µm or more, and the substrate layer has a thickness of 10 µm or more.

24. The manufacturing method of the semiconductor device according to claim 21, wherein
the second layer of the semiconductor substrate is formed of a polycrystal SiC semiconductor.

25. The manufacturing method of the semiconductor device according to claim 21, wherein
the second layer of the semiconductor substrate also includes a single crystal SiC semiconductor, the buffer layer of the second layer is a single crystal layer, and the substrate layer of the second layer is a polycrystal layer.

26. The manufacturing method of the semiconductor device according to claim 21, wherein
the semiconductor device includes least one of a Schottky barrier diode, a MOSFET, an IGBT, and an LED.

* * * * *